(12) United States Patent
Kano et al.

(10) Patent No.: US 6,199,430 B1
(45) Date of Patent: Mar. 13, 2001

(54) ACCELERATION SENSOR WITH RING-SHAPED MOVABLE ELECTRODE

(75) Inventors: Kazuhiko Kano, Toyoake; Koji Hattori, Nagoya; Yoshinori Ohtsuka, Okazaki; Makiko Sugiura, Nisshin; Minekazu Sakai, Kariya; Inao Toyoda; Yasutoshi Suzuki, both of Okazaki; Seiichiro Ishio, Handa; Minoru Murata, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/241,137

(22) Filed: Feb. 2, 1999

Related U.S. Application Data

(63) Continuation-in-part of application No. 09/097,385, filed on Jun. 16, 1998, now abandoned.

(30) Foreign Application Priority Data

| Jun. 17, 1997 | (JP) | 9-160292 |
| Jul. 2, 1997 | (JP) | 9-177404 |
| Dec. 18, 1997 | (JP) | 9-349439 |
| Feb. 2, 1998 | (JP) | 10-021345 |
| Mar. 3, 1998 | (JP) | 10-051028 |

(51) Int. Cl.⁷ ............................................. G01P 15/125
(52) U.S. Cl. ............................ 73/514.32; 73/514.36
(58) Field of Search .................... 73/514.01, 514.16, 73/514.32, 514.36, 514.38; 361/280

(56) References Cited

U.S. PATENT DOCUMENTS

| 5,241,864 | 9/1993 | Addie et al. ............... 73/718 |
| 5,335,550 | 8/1994 | Satou ......................... 73/727 |
| 5,396,223 | 3/1995 | Iwabuchi et al. ........... 340/690 |
| 5,487,305 | 1/1996 | Ristic et al. ............. 73/514.32 |
| 5,528,937 | 6/1996 | Dufour ...................... 73/514.32 |
| 5,569,852 | 10/1996 | Marek et al. ............... 73/514.32 |
| 5,616,523 | 4/1997 | Benz et al. ................. 438/50 |
| 5,682,053 | * 10/1997 | Wiszniewski ............... 73/514.21 |
| 5,798,460 | 8/1998 | Nakagawa et al. .......... 73/514.32 |
| 5,801,313 | 9/1998 | Horibata et al. ............. 73/514.32 |
| 5,824,901 | 10/1998 | van Seeters ................ 73/514.32 |
| 5,864,064 | 1/1999 | Kano et al. ................. 73/514.36 |
| 5,952,572 | * 9/1999 | Yamashita et al. .......... 73/514.29 |
| 5,987,989 | * 11/1999 | Yamamoto .................. 73/514.24 |

FOREIGN PATENT DOCUMENTS

| 50-19154 | 6/1975 | (JP) . |
| 55-68679 | 5/1980 | (JP) . |
| 58-62425 | 4/1983 | (JP) . |
| 62-174978 | 7/1987 | (JP) . |
| 2-260333 | 10/1990 | (JP) . |
| 5-167083 | 7/1993 | (JP) . |
| 5-226674 | 9/1993 | (JP) . |
| 5-281251 | 10/1993 | (JP) . |
| 6-123631 | 5/1994 | (JP) . |
| 6-123632 | 5/1994 | (JP) . |
| 6-163938 | 6/1994 | (JP) . |

(List continued on next page.)

*Primary Examiner*—Helen C. Kwok
(74) *Attorney, Agent, or Firm*—Pillsbury Winthrop LLP

(57) ABSTRACT

An acceleration sensor has a ring-shaped movable electrode connected to an anchor part via beams and a fixed electrode facing the ring-shaped movable electrode defining a specific interval, which are disposed on a substrate. The movable electrode is displaced by acceleration approximately in parallel to the substrate and contacts the fixed electrode, so that the acceleration is detected. The fixed electrode is divided into a detecting fixed electrode for contacting the movable electrode and a sensitivity controlling fixed electrode insulated from the detecting fixed electrode. Accordingly, potential differences between the movable electrode and the detecting fixed electrode and between the movable electrode and the sensitivity controlling fixed electrode are independently controlled to control sensitivity of acceleration.

48 Claims, 41 Drawing Sheets

FOREIGN PATENT DOCUMENTS

| | | |
|---|---|---|
| 6-347474 | 12/1994 | (JP) . |
| 6-347475 | 12/1994 | (JP) . |
| 7-140167 | 6/1995 | (JP) . |
| 7-306221 | 11/1995 | (JP) . |
| 8-21722 | 3/1996 | (JP) . |
| 8-236788 | 9/1996 | (JP) . |
| 9-211022 | 8/1997 | (JP) . |
| 9-232594 | 9/1997 | (JP) . |

* cited by examiner

ACCELERATION SENSOR WITH RING-SHAPED MOVABLE ELECTRODE

CROSS REFERENCE TO RELATED APPLICATIONS

This application is a continuation-in-part of U.S. patent application Ser. No. 09/097,385 filed on Jun. 16, 1998 now ABN, and is based upon and claims the benefit of priority of Japanese Patent Applications No. 9-160292 filed on Jun. 17, 1997, No. 9-17404 filed on Jul. 2, 1997, No. 9-349439 filed on Dec. 18, 1997, No. 10-21345 filed on Feb. 2, 1998, and No. 10-51028 filed on Mar. 3, 1998, the contents of which are incorporated herein by reference.

BACKGROUND OF THE INVENTION

1. Field of the Invention

The present invention relates to an acceleration sensor, for example, which is built in a gas or other flow meter so as to shut off a valve of a gas pipe or in a stove so as to extinguish flame when detecting earthquake vibrations and the like, or which detects accelerations in many directions on a two-dimensional plane at approximately the same sensitivity.

2. Related Arts

JP-A-6-123631 and JP-A-6-123632 disclose a semiconductor acceleration sensor capable of being used for the above field. The semiconductor acceleration sensor has an anchor part supported by four beams such that it can move in X, Y directions and a movable electrode which moves together with the anchor part. This sensor detects accelerations in the X, Y directions based on a change in capacity between the movable electrode and a fixed electrode provided on a substrate side, so that it detects acceleration in every direction on an X-Y plane.

However, to obtain the magnitude of acceleration in a diagonal direction on the X-Y plane based on the detected accelerations in the X, Y directions, it is necessary that the acceleration sensor has an arithmetic circuit for synthesizing the detected accelerations in the X, Y directions to process as a signal.

SUMMARY OF THE INVENTION

The present invention has been made in view of the above-mentioned problem. An object of the present invention is to provide an acceleration sensor capable of directly detecting acceleration in every direction approximately parallel to a surface of a substrate with high detecting accuracy.

According to the present invention, an acceleration sensor has an anchor part disposed on a substrate, a movable electrode having a cylindrical movable electrode side face, a beam connecting the anchor part and the movable electrode, and a fixed electrode having a cylindrical fixed electrode side face that makes a specific interval with the movable electrode side face when no acceleration is applied to the movable electrode. The beam is elastically deformed to displace the movable electrode in a direction approximately parallel to the surface of the substrate by acceleration. The acceleration is detected based on a change in interval between the movable electrode side face and the fixed electrode side face.

Accordingly, because the movable electrode and the fixed electrode have the cylindrical movable electrode and fixed electrode side faces, the acceleration sensor can detect acceleration applied to the movable electrode in every direction approximately parallel to the surface of the substrate.

Preferably, the fixed electrode includes a detecting fixed electrode for detecting the acceleration and a sensitivity controlling fixed electrode for controlling sensitivity of the acceleration, which are electrically insulated from one another, and first and second potential differences between the movable electrode and the detecting fixed electrode and between the movable electrode and the sensitivity controlling fixed electrode are independently controlled. As a result, the sensitivity of the acceleration can be readily controlled, resulting in high detecting accuracy.

The fixed electrode electrode may include a plurality of detecting fixed electrodes and a plurality of sensitivity controlling fixed electrodes surrounding the movable electrode. In this case, when the second potential difference is applied between the movable electrode and all of the plurality of sensitivity controlling fixed electrodes, a detecting operation of the acceleration sensor can be checked by applying a third potential difference, which is different from the second potential difference, between at least one of the plurality of sensitivity controlling fixed electrodes and the movable electrode. Accordingly, the operation check including sensitivity adjustment of the acceleration sensor can be easily performed even after the manufacturer of the sensor is finished.

The acceleration sensor may have a lower electrode disposed on the substrate to face the movable electrode with an interval and having an electrical potential the same as that of the movable electrode. In this case, no electrostatic attracting force is produced between the movable electrode and the substrate, so that the movable electrode can move in parallel to the surface of the substrate, resulting in high detecting accuracy of the acceleration.

The acceleration sensor may have a current preventing member between the substrate and a movable part composed of the movable electrode and the beam, for preventing a current from flowing between the substrate and the movable part. Accordingly, erroneous detection can be prevented. The current preventing member may be composed of an insulation film disposed on at least one of surfaces of the substrate and the movable part facing one another.

The acceleration sensor may have contacting state keeping means for keeping the movable electrode in contact with the fixed electrode after the acceleration, which causes the contact, disappears. Accordingly, the acceleration sensor can memorize the state where the acceleration is applied thereto.

The sensitivity controlling fixed electrode can serve as the contacting state keeping means by producing an electrostatic attracting force with the movable electrode therebetween to keep the contacting state.

The detecting fixed electrode can have a protrusion for contacting the movable electrode and for preventing the movable electrode from attaching the sensitivity controlling fixed electrode. Further, by controlling the size of the protrusions, the interval between the detecting fixed electrode and the movable electrode is changed to control the detecting state of the acceleration sensor.

Preferably, the acceleration sensor has a deformation preventing film disposed on the beam on an opposite side of the substrate to apply a force to the beam in a direction opposite to a gravitational direction. As a result, the beam is prevented from deforming in the gravitational direction, so that the beam can keep the movable electrode parallel to the substrate. The movable electrode is prevented from hanging down toward the substrate by its self-weight, resulting in high detecting accuracy.

Preferably, a thickness of the movable electrode is thinner than that of the anchor part, and surfaces of the anchor part, the movable electrode, and the beam on an opposite side of the substrate are on a plane in a state where no gravitational force is applied to the movable electrode and the beam. In this case, even if the movable electrode hangs down by its self-weight, the movable electrode contacts the fixed electrode to detect acceleration with high accuracy.

BRIEF DESCRIPTION OF THE DRAWINGS

These and other objects and features of the present invention will become more readily apparent from a better understanding of preferred embodiments described below with reference to the following drawings.

DETAILED DESCRIPTION OF THE PREFERRED EMBODIMENTS

First, basic structure and features of an acceleration sensor 100 according to the present invention will be explained.

Figure 1:
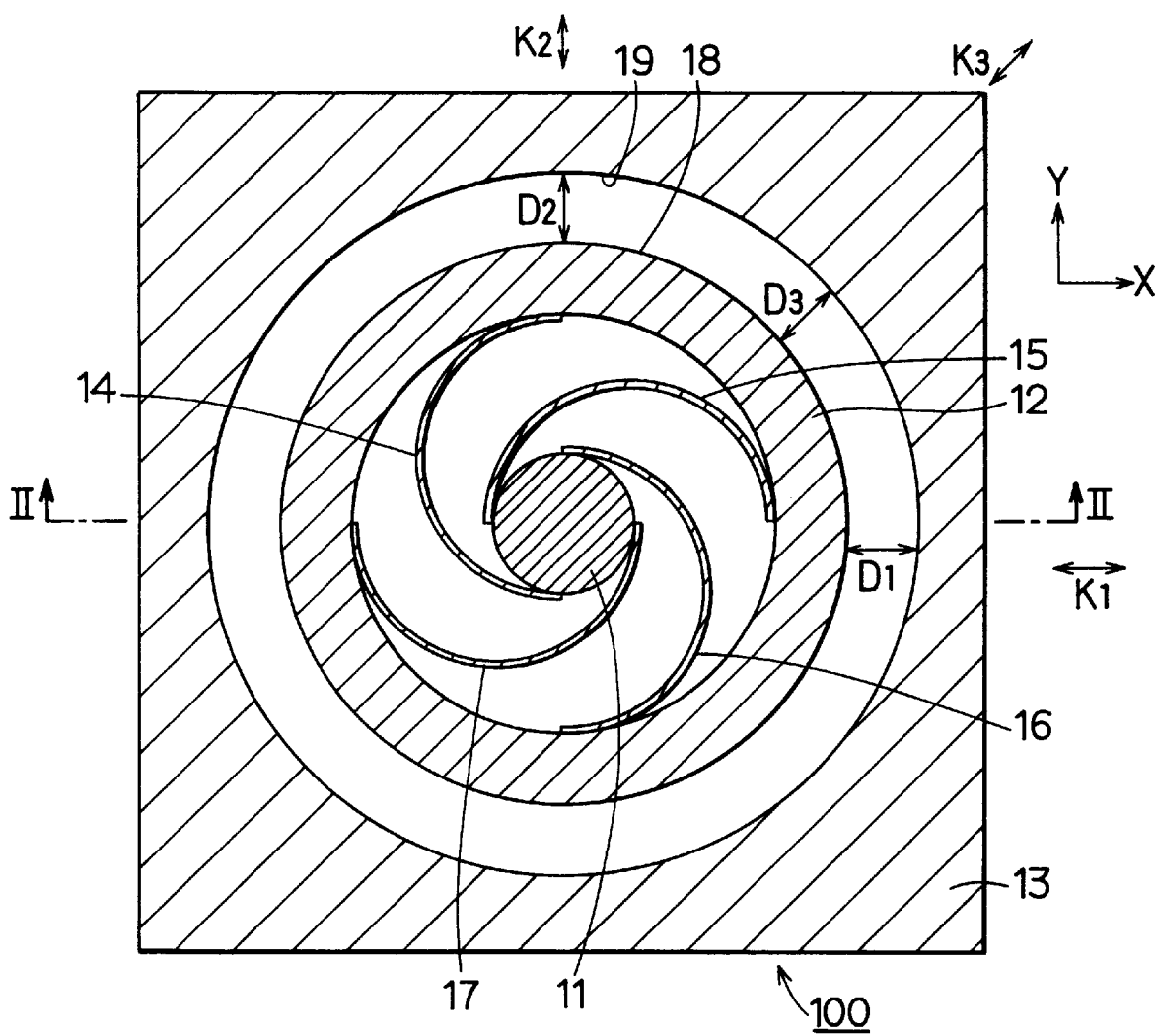
FIG. 1 is a plan view showing a basic structure of an acceleration sensor of the present invention.
Figure 2:
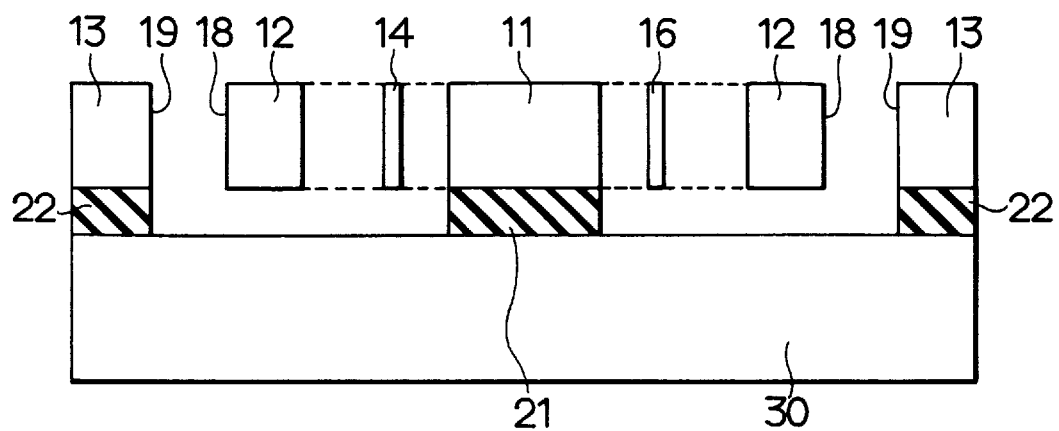
FIG. 2 is a cross-sectional view taken along II—Ii line of FIG. 1, showing the acceleration sensor.

Referring to FIG. 1, the acceleration sensor 100 is a switch type acceleration sensor constructed of a substrate 30, an anchor part ill a weighting movable electrode 12, four beams 14–17, and a fixed electrode 13. The substrate 30 is made of P-type silicon. The anchor part 11 has a cylindrical shape and formed approximately in the center on the substrate 30. The anchor part 11 supports the weighting movable electrode 12 with the four beams 14–17. The weighting movable electrode 12 is provided in parallel with the substrate 30 to define a predetermined interval with the substrate 30 as shown in FIG. 2 and is moved upon detecting acceleration. The weighting movable electrode 12 has a ring-like shape with a cylindrical side face approximately perpendicular to the substrate 30, and the cylindrical side face serves as a conductive detecting face 18. The four beams 14–17, which are spring members, are shaped and arranged so that it can be elastically deformed in approximately parallel to the surface of the substrate 30. Specifically, each shape of the four beams 14–17 taken from the top side is a part of an arc as shown in FIG. 1, and each cross-sectional shape of the four beams 14–17 is a rectangle having a large ratio of a long side with respect to a short side as shown in FIG. 2. Here, the long side is approximately perpendicular to the surface of the substrate 30.

The fixed electrode 13 has a hollowed inner cylindrical portion in which the weighting movable electrode 12 is disposed so that the detecting face 18 of the weighting movable electrode 12 defines a specific intervals with the cylindrical inner side face of the fixed electrode 13. The cylindrical inner side face of the fixed electrode 13 is conductive and serves as a detected face 19. Referring to FIG. 2 again, the anchor part 11 and the fixed electrode 13 are respectively disposed on the substrate 30 with oxide layers 21, 22 interposed therebetween.

The detecting face 18 of the weighting movable electrode 12 is displaced by acceleration and is brought into contact with the detected face 19 of the fixed electrode 13. Then, a detecting circuit (not shown), which is electrically connected to the detecting face 18 and the detected face 19 via wires and the like, detects the contact of the detecting face 18 with the detected face 19. The detecting circuit may be electrically connected to the anchor part 11 instead of to the detecting face 18, because the weighting movable electrode 12, the beams 14–17, and the anchor part 11 electrically communicate with one another.

The predetermined interval between the weighting movable electrode 12 and the fixed electrode 13 in a radial direction of the movable electrode 12 is set so that a relationship between a total elastic modulus ki in each direction (i=1 to n) of the beams and the interval Di between the weighting movable electrode 12 and the fixed electrode 13 in the each direction satisfies the following formula (1);

$$D1 \times k1 = D2 \times k2 = \ldots = Di \times ki = \ldots = Dn \times kn \qquad (1).$$

When the weighting movable electrode 12 and the fixed electrode 13 are arranged to satisfy the formula (1), even if acceleration is generated in any direction (i=1 to n), the acceleration is isotropically detected provided that the direction is parallel to the surface of the substrate 30. For example, referring to FIG. 1, it is assumed that predetermined intervals in X, Y directions and a diagonal 45° direction are D1, D2, D3, and the total elastic moduli of the beams 14–17 in the respective directions are k1, k2, k3. In this case, to isotropically detect acceleration F on the plane parallel to the substrate 30, the respective intervals D1, D2, D3 are F/k1, F/k2, F/k3. When intervals D1, D2, D3 satisfy formula (1), total elastic moduli k1, k2, k3 are all equal. Accordingly, in the present invention, the weighting movable electrode 12 with a ring-like shape is disposed in the hollowed inner cylindrical portion of the fixed electrode 13. The acceleration sensor 100 is formed to be symmetrical both vertically and horizontally.

Here, the surface portions of the anchor part 11, the four beams 14–17, the weighting movable electrode 12 and the fixed electrode 13 are conductive. To provide the conductivity, impurities such as phosphorus is doped into the surface portions by a method such as ion implantation. Otherwise, conductive layers may be formed on the surfaces of the anchor part 11, the four beams 14–17, the weighting movable electrode 12 and the fixed electrode 13 by depositing or plating conductive material so as to reduce the resistivity of the surface portions.

Figure 3:
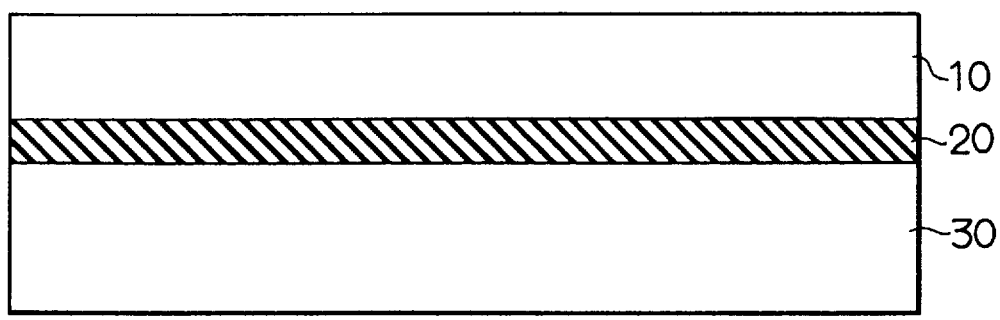
FIGS. 3, 4 are cross-sectional views for explaining processes for manufacturing the acceleration sensor of FIG. 1.
Figure 4:
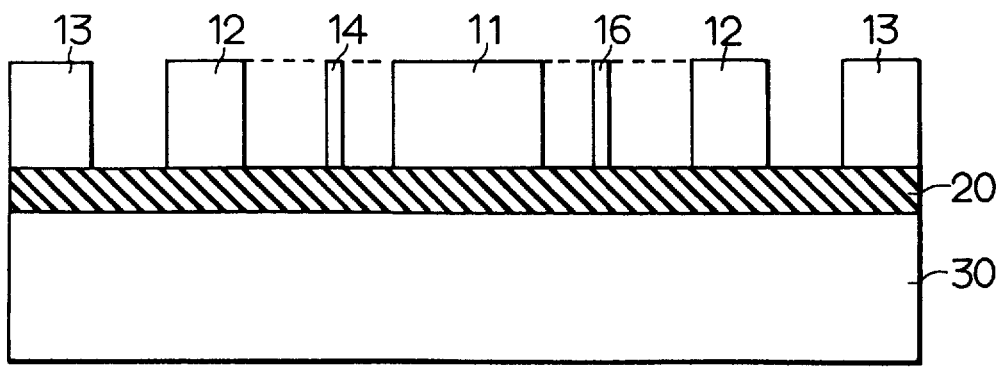

Next, manufacturing processes of the acceleration sensor 100 will be described with reference to FIGS. 3, 4. First, as shown in FIG. 3, an oxide layer 20 is formed on the substrate 30 and a silicon layer 10 is formed on the oxide layer 20. A silicon-on-insulator (SOI) substrate may be used for the acceleration sensor 100. Next, as shown in FIG. 4, the silicon layer 10 is etched so that the anchor part 11, the beams 14–17, the weighting movable electrode 12, and the fixed electrode 13 are formed in predetermined shapes. Then, the oxide layer 20 exposed through the etched portions and underlying the weighting movable electrode 12 and the beams 14–17 is removed by an etching process using an etching solution containing hydrogen fluoride (HF). Thus, the acceleration sensor 100 shown in FIG. 2 is manufactured.

Figure 5A:
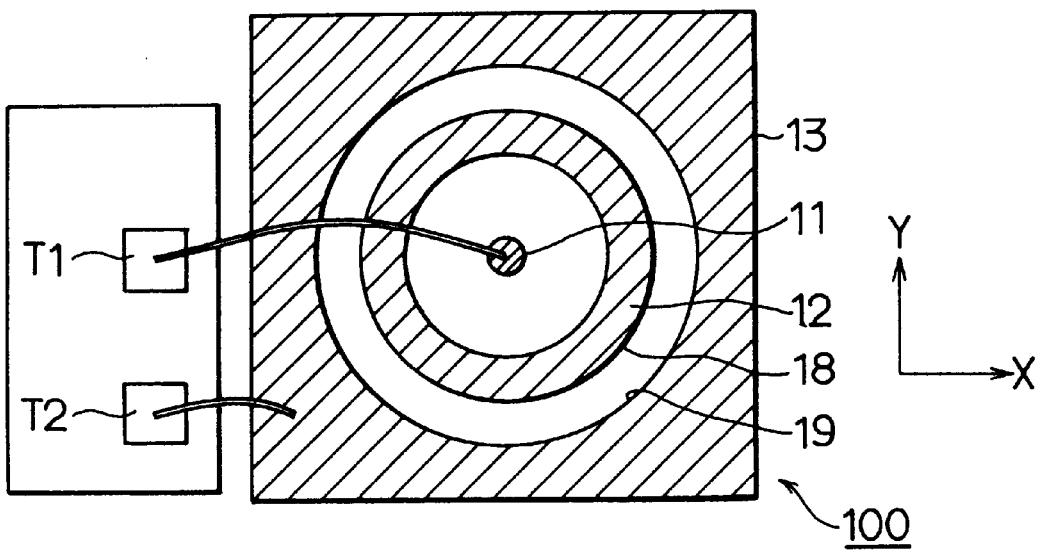
FIGS. 5A–5C are schematic views for explaining operation of the acceleration sensor.
Figure 5B:
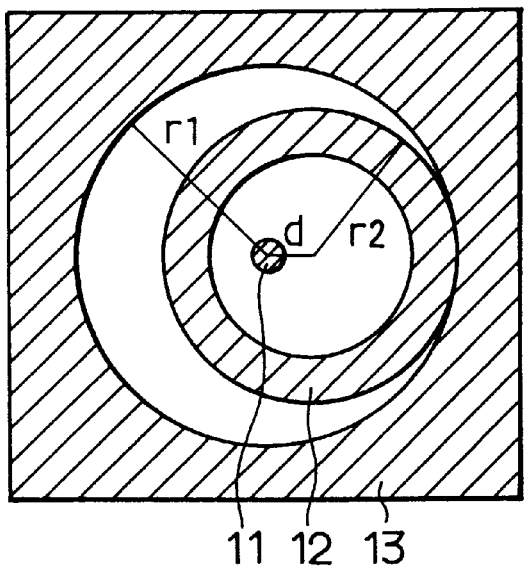
Figure 5C:
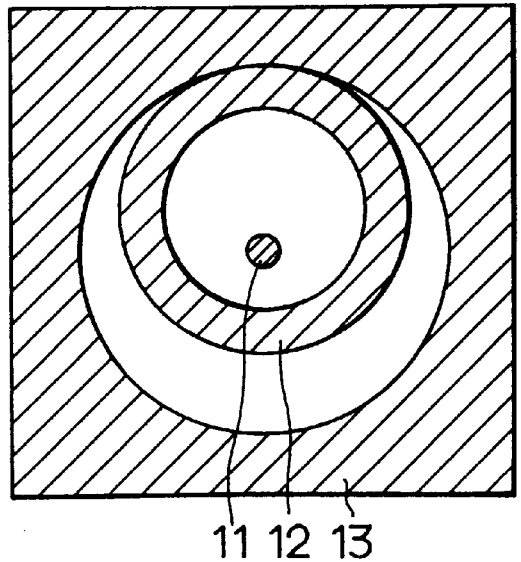
Figure 6:
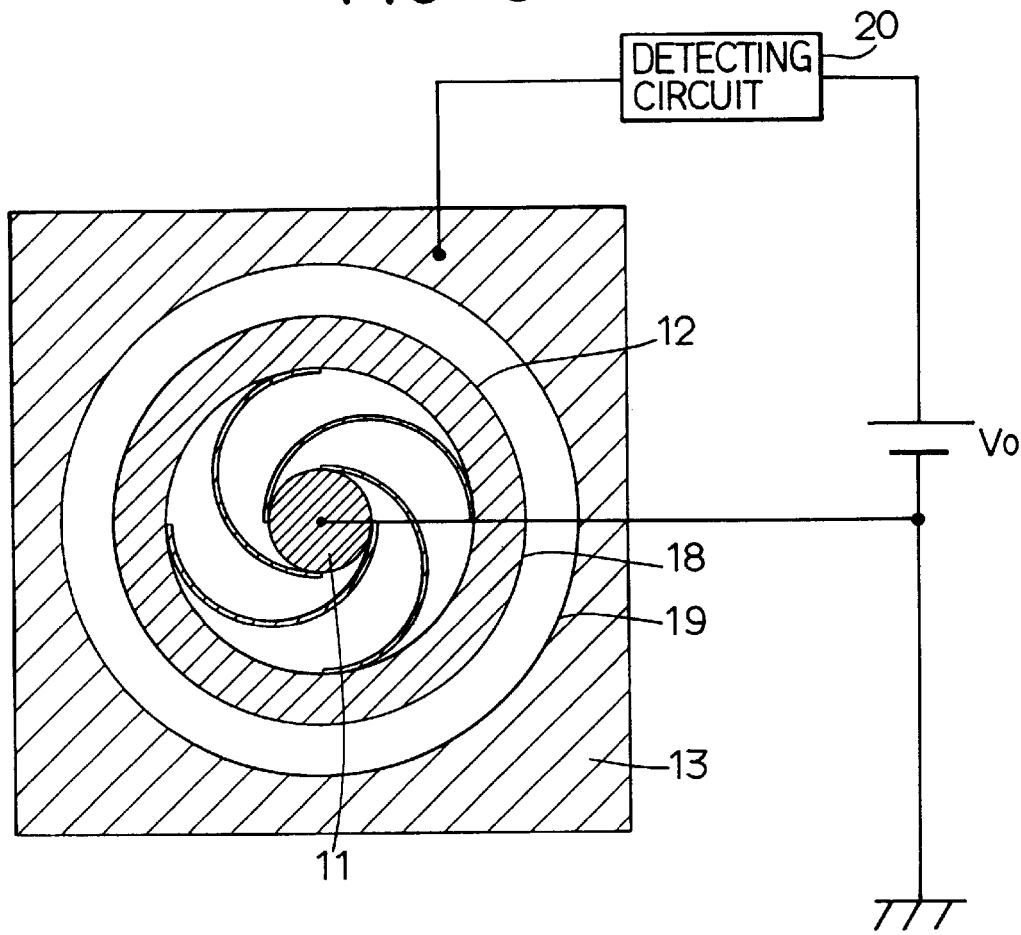
FIG. 6 is a schematic view showing an electrical constitution of the acceleration sensor for detecting acceleration.

Next, the operation of the acceleration sensor 100 will be explained with reference to FIGS. 5A–5C, 6. The beams 14–17 connecting the anchor part 11 and the weighting movable electrode 12 are omitted in FIGS. 5A–5C, 6. Referring to FIG. 5A, terminals T1, T2 of the detecting circuit (indicated by reference numeral 20 in FIG. 6) are respectively connected to the anchor part 11 and the fixed electrode 13 via wires. As shown in FIG. 6, potential difference $V_0$ is provided between the terminals T1, T2 of the detecting circuit 20.

In case where acceleration is not applied to the sensor 100, the weighting movable electrode 12 is stationary apart from the fixed electrode 13 by the predetermined interval. when acceleration is applied to the sensor 100 to displace the weighting movable electrode 12 in the X direction, the interval in the X direction between the weighting movable electrode 12 and the fixed electrode 13 is decreased. When the acceleration applied to the sensor 100 has a magnitude larger than a predetermined value, the detecting face 18 of the weighting movable electrode 12 and the detected face 19 of the fixed electrode 13 are brought in contact on the X axis as shown in FIG. 5B. At that time, as potential difference $V_0$ is set between the weighting movable electrode 12 and the fixed electrode 13, current flows and thereby the detecting circuit 20 detects the contact between the electrodes 12, 13.

As described above, only when the acceleration applied to the sensor 100 has the magnitude larger than the predetermined value, the weighting movable electrode 12 and the fixed electrode 13 are electrified to work as the acceleration sensor. That is, the interval between the weighting movable electrode 12 and the fixed electrode 13 in a direction parallel to the substrate 30 is set so that the electrodes 12, 13 are brought in contact one another when acceleration having the magnitude larger than the predetermined value is applied to the sensor 100 in the direction. In the acceleration sensor 100, because both of the detecting face 18 and the detected face 19 are cylindrical and springs formed by the beams 14–17 have an isotropic spring constant on the plane parallel to the substrate 30, acceleration applied to the sensor 100 in every direction parallel to the substrate 30 can be evenly detected. Only circuit that the acceleration sensor 100 necessitates to detect acceleration is the detecting circuit 20 for detecting the contact between the detecting face 18 of the weighting movable electrode 12 and the detected face 19 of the fixed electrode 13.

In the acceleration sensor 100, because the weighting movable electrode 12 has a ring-like shape, the inner diameter side and the outer diameter side of the movable electrode 12 can be effectively utilized. Specifically, as the anchor part 11 is disposed in the inner diameter side of the weighting movable electrode 12, it is not necessary to provide a special area for arranging the anchor part 11, resulting in size reduction of the acceleration sensor 100. Further, because the anchor part 11, the beams 14–17, the weighting movable electrode 12, and the fixed electrode 13 are formed from the same semiconductor material, they can be produced by the same semiconductor processes and need not be assembled, resulting in low manufacturing cost.

Because the interval between the detecting face 18 and the detected face 19 is kept approximately even when no acceleration is applied, even if acceleration is applied in any direction approximately parallel to the surface of the substrate 30, the quantity of the interval decreased by the displacement of the movable electrode 12 approximately corresponds to the magnitude of acceleration. Accordingly, acceleration can be isotropically detected.

Figure 7:
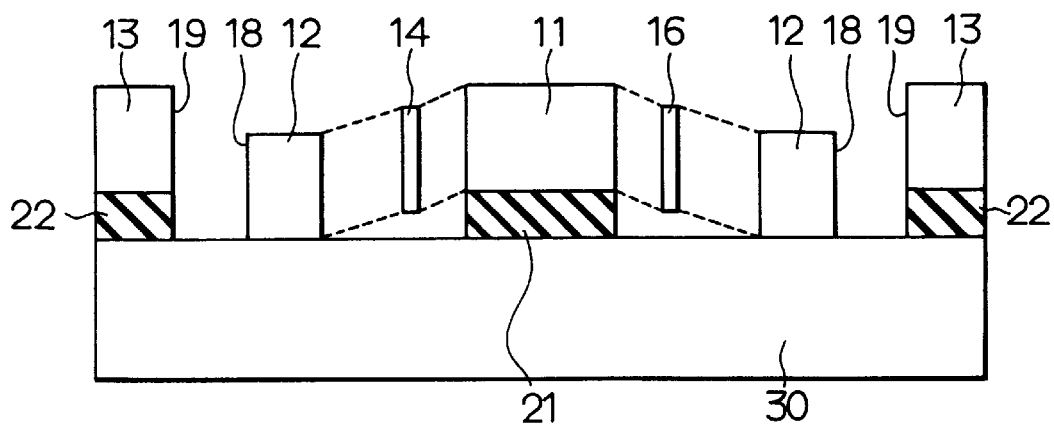
FIG. 7 is a cross-sectional view for explaining a problem that a movable electrode of the acceleration sensor hangs down.

Further, the acceleration sensor 100 of the present invention has the following another feature. When the acceleration sensor 100 detects earthquake vibrations, the magnitude of the earthquake vibrations that is to be detected is approximately 0.2 G in magnitude when it is converted to acceleration. In this case, it is required for the acceleration sensor 100 to have a significantly small spring constant of the beams 14–17 with respect to the mass part (weighting movable electrode 12). In this kind of acceleration sensor 100, as shown in FIG. 7 the weighting movable electrode 12 readily hangs down by its self-weight so that an area of the detecting face 18 facing the detected face 19 is reduced, resulting in low sensitivity of the sensor 100 and large variations in the sensitivity. When the detecting face 18 does not face the detected face 19, the sensor does not work.

To solve the above problem, in the acceleration sensor 100, potential difference $V_0$ is set between the weighting movable electrode 12 and the fixed electrode 13 to produce electrostatic attracting force therebetween. Accordingly, the weighting movable electrode 12 is prevented from hanging down by its self-weight. This point will be explained in more detail.

Electrostatic capacity C between the weighting movable electrode 12 and the fixed electrode 13 is represented by the following formula (2):

$$C = 2\pi\epsilon_0 h / \cosh^{-1}((r_1^2 + r_2^2 - d^2)/2r_1 r_2) \quad (2)$$

wherein $r_1$, $r_2$ are the radiuses of the weighting movable electrode 12 and the fixed electrode 13, d is a displacement amount of the central point of the weighting movable electrode 12, and h is the thickness of the weighting movable electrode 12. In FIG. 5B, $r_1$, $r_2$, d are indicated.

Figure 8:
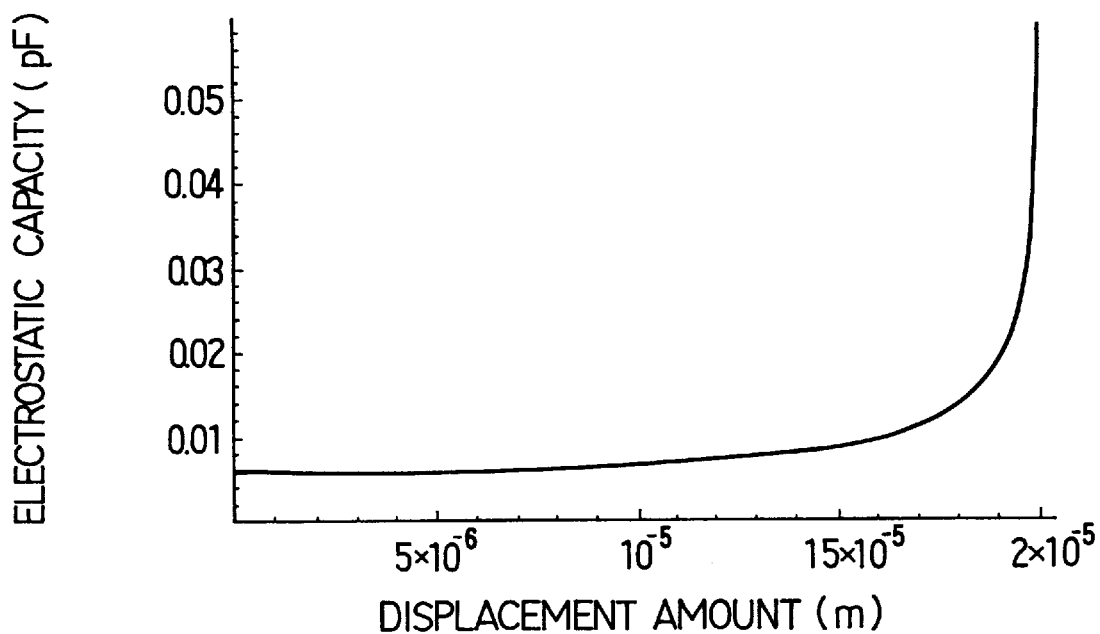
FIG. 8 is a graph showing characteristics of an electrostatic capacity between the movable electrode and a fixed electrode with respect to a displacement amount of the movable electrode.

For example when $r_1$ is 200 $\mu$m, $r_2$ is 220 $\mu$m, and h is 10 $\mu$m, as shown in FIG. 8 electrostatic capacity C increases as displacement amount d of the weighting movable electrode 12 increases. That is, as the interval between the weighting movable electrode 12 and the fixed electrode 13 decreases, the electrostatic capacity increases. When displacement amount d is zero, electrostatic capacity C is 0.006 pF.

Here, as mentioned above, because potential difference $V_0$ is applied across the weighting movable electrode 12 and the fixed electrode 13, electrostatic attracting force $F_e$ is produced between the weighting movable electrode 12 and the fixed electrode 13. Electrostatic attracting force $F_e$ is represented by the following formula (3);

$$F_e = \delta/\delta\gamma \; d(\tfrac{1}{2}CV_0^2) \quad (3)$$

Figure 9:
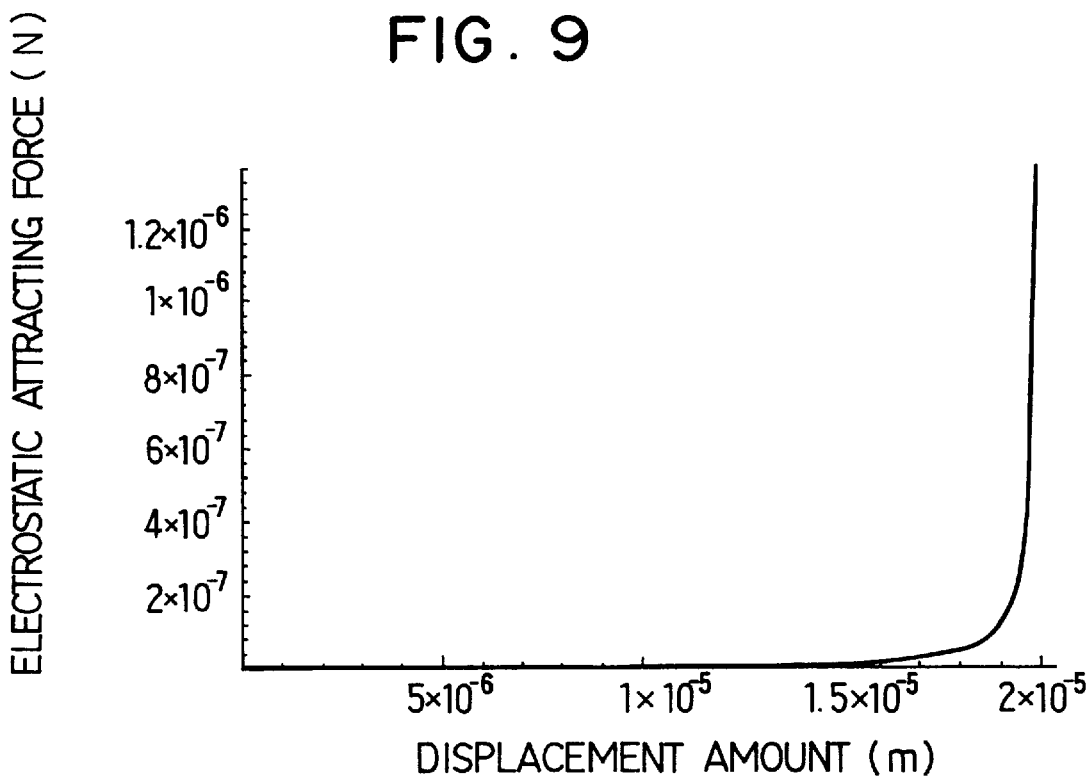
FIG. 9 is a graph showing characteristics of an electrostatic attracting force between the movable electrode and the fixed electrode with respect to the displacement amount of the movable electrode when 5 V is applied across the movable electrode and the fixed electrode in the acceleration sensor of FIG. 1.
Figure 10:
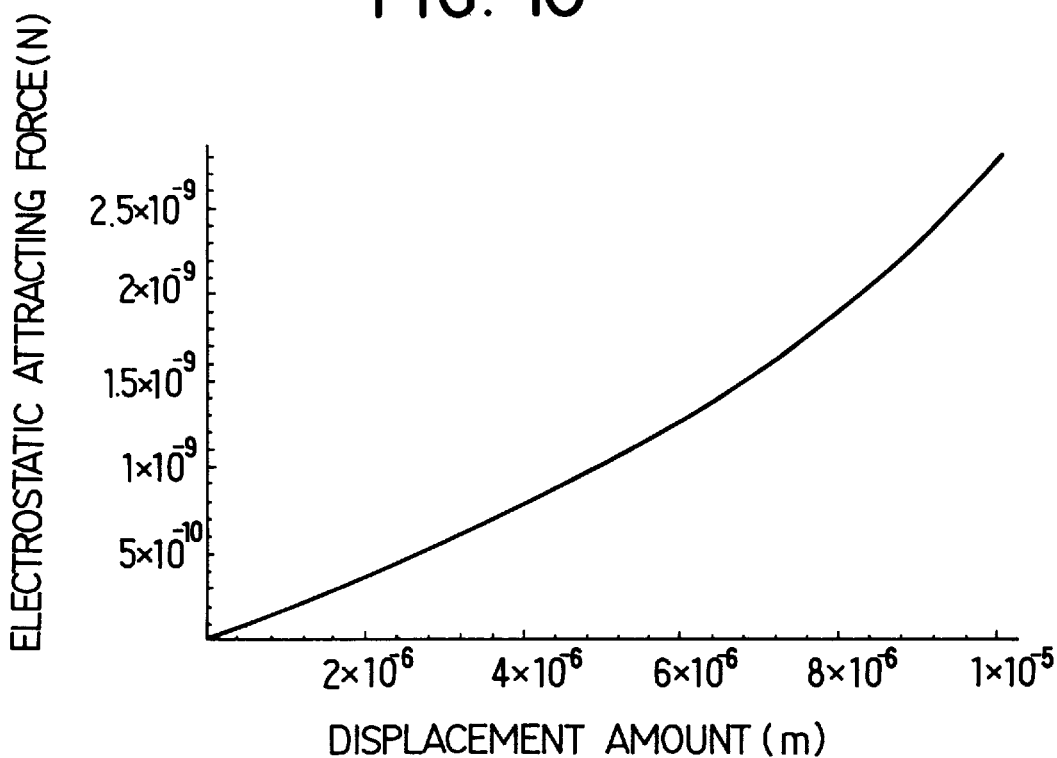
FIG. 10 is an enlarged graph of a part of FIG. 9 in which the displacement amount of the movable electrode is small.

Accordingly when potential difference $V_0$ is 5 V, electrostatic attracting force $F_e$ changes with respect to displacement amount d of the weighting movable electrode 12 as shown in FIG. 9. FIG. 10 shows an enlarged part of FIG. 9 in which displacement amount d is in a range of zero to $1 \times 10^{-5}$. As understood from FIGS. 9, 10, when displacement amount d is zero, no electrostatic attracting force is applied to the weighting movable electrode 12.

Figure 11:
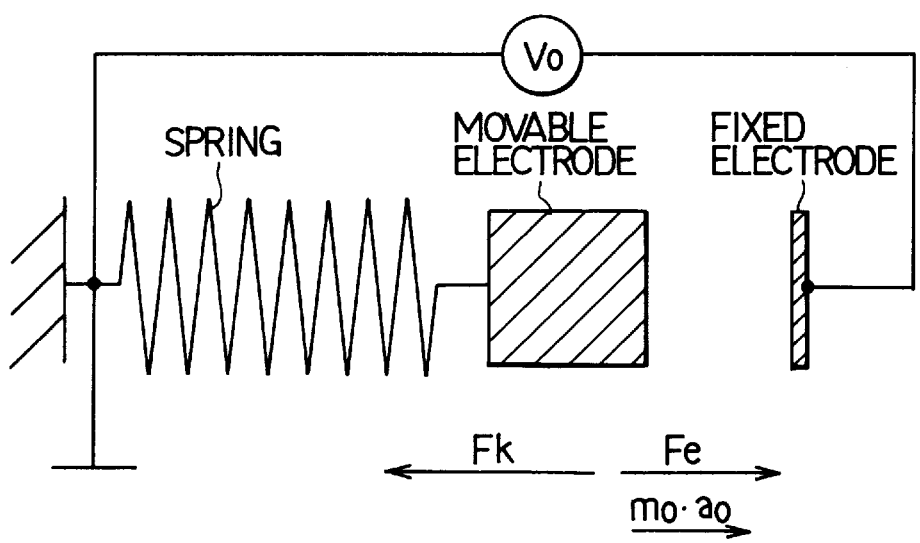
FIG. 11 is a model for explaining a relationship among a force applied to the movable electrode, a spring restoring force of beams, and the electrostatic attracting force between the movable electrode and the fixed electrode.

This is explained in more detail using a model schematically illustrated in FIG. 11. A spring (the beams 14–17) having spring constant k is supported by a member at an end thereof and is connected to a movable electrode with mass $m_0$ at the other end thereof. A fixed electrode is provided on an opposite side of the spring with respect to the movable electrode to make a predetermined interval with the movable electrode. Potential difference $V_0$ is applied between the fixed electrode and the spring from the outside. In this system, when acceleration having an absolute value $a_0$ in magnitude is applied to the movable electrode, force F applied to the movable electrode is fixed by spring restoring force $F_k$ of the beams and electrostatic attracting force $F_e$.

When displacement amount d of the movable electrode is small, assuming that electrostatic attracting force $F_e$ is proportional to displacement amount d, the relationship; $m_0 a_0 = F_k - F_e = kd - bd = (k-b)d$, wherein b is a proportional constant, is satisfied. Therefore, when the movable electrode is eccentrically displaced upon receiving acceleration, spring constant is apparently reduced by proportional constant b. In the acceleration sensor 100, a relatively large spring constant is set to prevent the weighting movable electrode 12 from hanging down by its self-weight, and at the same time the spring constant is apparently reduced by applying potential difference $V_0$ between the electrodes 12, 13, thereby providing large sensitivity.

The acceleration sensor 100 is manufactured by the processes explained referring to FIGS. 3, 4; however, as mentioned above, an SOI substrate may be used for the acceleration sensor. The manufacturing processes of this type of acceleration sensor will be explained with reference to FIGS. 12–19.

Figure 12:
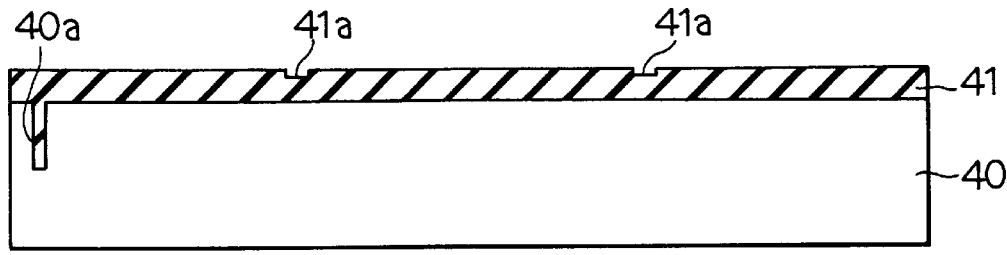
FIGS. 12–19 are cross-sectional views for explaining processes for manufacturing a modified one of the acceleration sensor of FIG. 1.

First, a single crystal silicon substrate 40 is prepared to serve as a first semiconductor substrate for forming an anchor part 11, a weighting movable electrode 12, the beams 14a, and a fixed electrode 13. As shown in FIG. 12, a groove 40a for alignment is formed on the silicon substrate 40 by trench-etching. Then, a silicon oxide layer 41 for serving as a sacrifice layer is deposited on the silicon substrate 40 as well as in the groove 40a by a CVD method or the like. The silicon oxide layer 41 is selectively etched using an etching mask formed by a photo-lithography process, so that recess parts 41a are formed on the silicon oxide layer 41.

Figure 13:
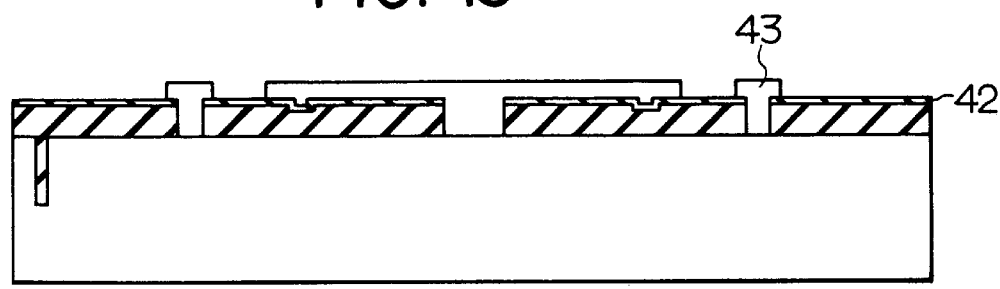

Next, as shown in FIG. 13 a silicon nitride layer (first insulating layer) 42 is formed on the silicon oxide layer 41 to serve as a stopper in a sacrifice layer etching process described below. Then, opening portions are formed in the silicon oxide and silicon nitride layers 41, 42 where the anchor part 11 and the fixed electrode 13 are to be formed, by a dry etching process and the like using a resist layer formed by a photo-lithography process. The opening portions are for connecting the anchor part 11 to a lower electrode described below, and the fixed electrode 13 to a wiring member which is also described below.

Subsequently, a polysilicon layer 43 is formed on the silicon nitride layer 42 as well as in the opening portions. Impurities are doped into the polysilicon layer 43 during or after the process of forming the polysilicon layer 43, thereby providing the conductive polysilicon layer 43. Then, as shown in FIG. 13, after a photo-lithography process is conducted to the polysilicon layer 43, the polysilicon layer 43 is etched so that a fixing part for the anchor part 11, the lower electrode, and the wiring member are provided in specific positions. The preferable thickness of the polysilicon layer 43 is in a range of 0.5 $\mu$m–2 $\mu$m. In the photolithography process of the polysilicon layer 43, as the thickness of the polysilicon layer 43 is so thin that the opening portions can be observed through the polysilicon layer 43. Therefore, a photo-mask is precisely disposed in a required position.

Figure 14:
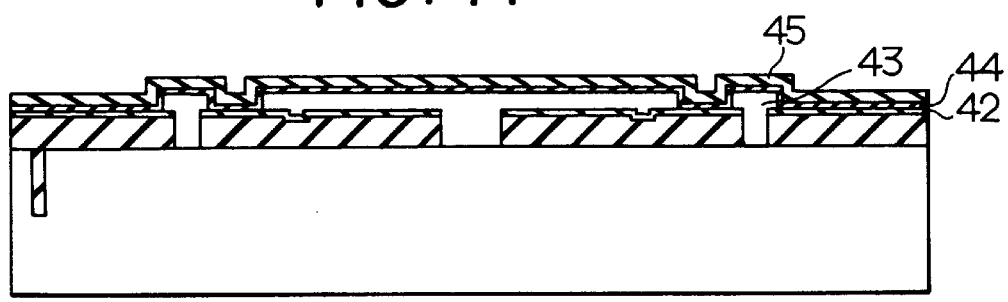
Figure 15:
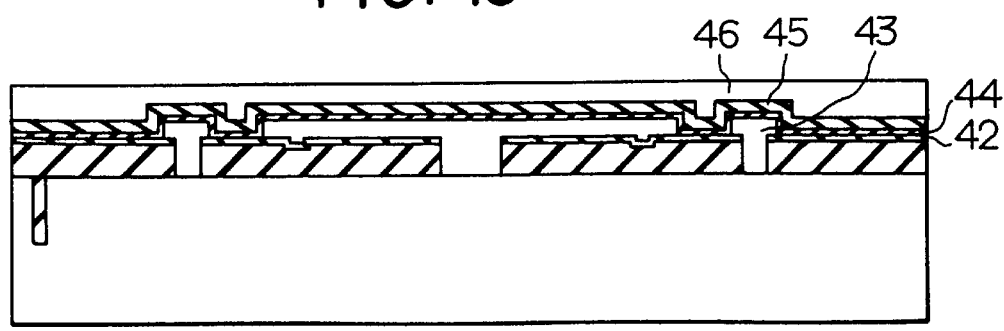

Next, as shown in FIG. 14, a silicon nitride layer 44 is formed on the polysilicon layer 43 and a silicon oxide layer (second insulating layer) 45 is formed on the silicon nitride layer 44. As shown in FIG. 15, a polysilicon layer 46 is further formed on the silicon oxide layer 45. The surface of the polysilicon layer 46 is mechanically polished to be evenly flat.

Figure 16:
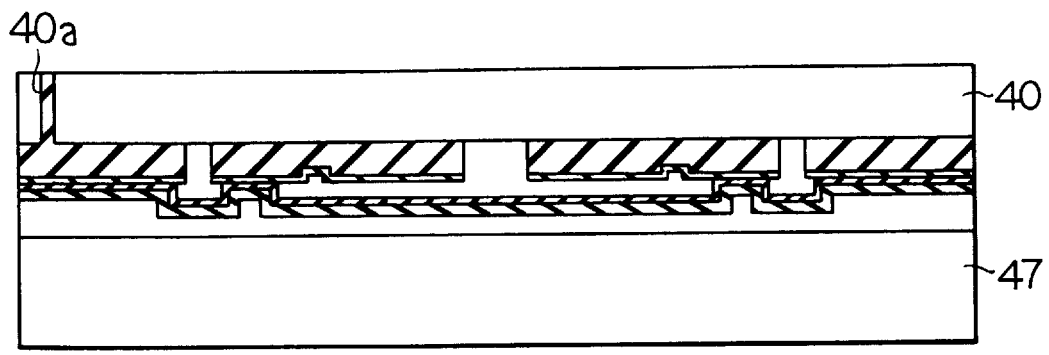

Then, a single crystal silicon substrate (second semiconductor substrate) 47 serving as a support substrate is joined to the polished surface of the polysilicon layer 46. Then, as shown in FIG. 16 in which the substrate 40 and the layers on the substrate 40 are indicated upside down with respect to FIGS. 12–15, the surface of the silicon substrate 40 on an opposite side of the polysilicon layer 46 is mechanically polished so that the substrate 40 is thinned to have a desired thickness. At that time, the polishing process is stopped when the groove 40a in the substrate 40 is exposed. Specifically, as soon as the silicon oxide layer 41 in the groove 40a is exposed and starts to be polished, the hardness of the substrate 40 to be polished changes, so that the end of the polishing process is easily detected. Impurities such as phosphorus may be doped into the substrate 40 so that the anchor part 11, the beams 14a, the movable electrode 12, and the fixed electrode 13 obtained from the substrate 40 become conductive.

Figure 17:
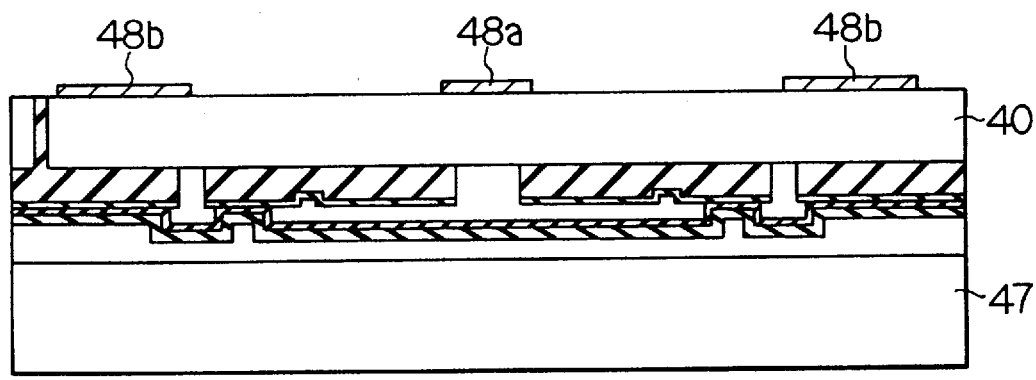
Figure 18:
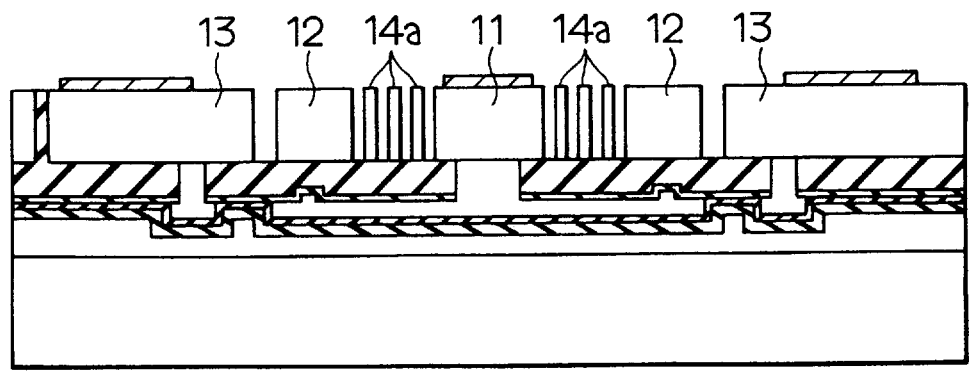

Thereafter, as shown in FIG. 17, aluminum layer are formed on the polished surface of the substrate 40 and is patterned to form aluminum electrodes 48a, 48b. Then, as shown in FIG. 18, the substrate 40 is etched using an etching mask formed by a photo-lithography process, so that the anchor part 11, the weighting movable electrode 12, the fixed electrode 13, and the beams 14a are provided. In this state, the weighting movable electrode 12 and the beams 14a are fixed to the substrate 47. The etching mask used in this process may be a soft mask such as a photo-resist mask, and be a hard mask such as an oxide layer.

Figure 19:
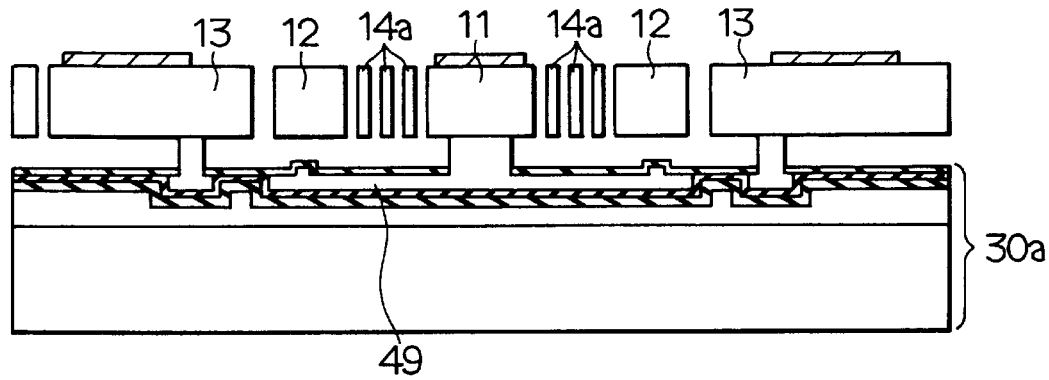

Finally, as shown in FIG. 19, the silicon oxide layer 41 as the sacrifice layer is removed by the above-described sacrifice layer etching process using an etching solution containing HF, so that the weighting movable electrode 12 and the beams 14a becomes movable. Herebelow, the substrate 47 and the layers 42–46 lying on the substrate 47 are integrally referred to as a substrate 30a. After the silicon oxide layer 41 is etched, a dry process is conducted using a sublimating agent such as para-dichlorobenzene to prevent the movable parts from contacting the substrate 30. In addition, due to the recess parts 41a shown in FIG. 12, protrusions are formed on the substrate 30a to face the movable electrode 12 to prevent the movable electrode 12 from attaching the surface of the substrate 30.

In the sacrifice layer etching process, because the etching solution containing HF is used, the fixing part of the polysilicon layer 43 underlying the anchor part 11 is not dissolved by the etching solution. This is because HF dissolves silicon oxide, but dose not dissolve polysilicon. Therefore, the etching process is inevitably stopped. It is not necessary to precisely control the concentration and the temperature of the etching solution containing HF and the etching time of the etching process, resulting in low manufacturing cost. Because of this, the spring constant of the beams 14a can be also readily controlled.

In the acceleration sensor 100 manufactured by the above-described processes, the lower electrode 49 (see FIG. 19) formed from the polysilicon layer 43 underlies the weighting movable electrode 12, the beams 14a, the anchor part 11, and is connected to the anchor part 11 via the fixing part integrated with the lower electrode 49. Accordingly, when the lower electrode 49 is set to have the same electric potential as the weighting movable electrode 12 and the beams 14a, the weighting movable electrode 12 is prevented from attaching the substrate 30a by the electrostatic attracting force produced between the weighting movable electrode 12 and the substrate 30a.

When the acceleration sensor is constructed as shown in FIG. 1, it is necessary for the anchor part 11 to be connected to an external circuit through a wire connected to the surface of the anchor part 11 by wire-bonding and the like.

However, in the acceleration sensor shown in FIG. 19, the anchor part 11 can be connected to the external circuit through the lower electrode 49. Generally the wire bonding of the wire requires an area with at least 200 μm in diameter. As opposed to this, in the acceleration sensor shown in FIG. 19, the area of the anchor part 11 can be reduced to less than 100 μm, resulting in size reduction of the sensor.

In this structure, although the anchor part, the weighting electrode, the beams, and the fixed electrode are formed on the semiconductor substrate, those parts may be formed on a glass substrate. The processes for manufacturing this type of the acceleration sensor will be explained referring to FIGS. 20–22.

Figure 20:
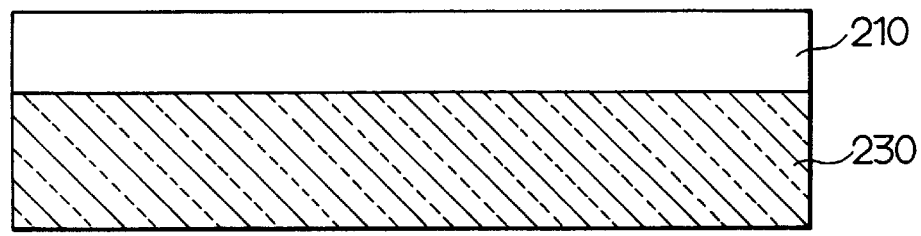
FIGS. 20–22 are cross-sectional views for explaining processes for manufacturing another modified one of the acceleration sensor of FIG. 1.
Figure 21:
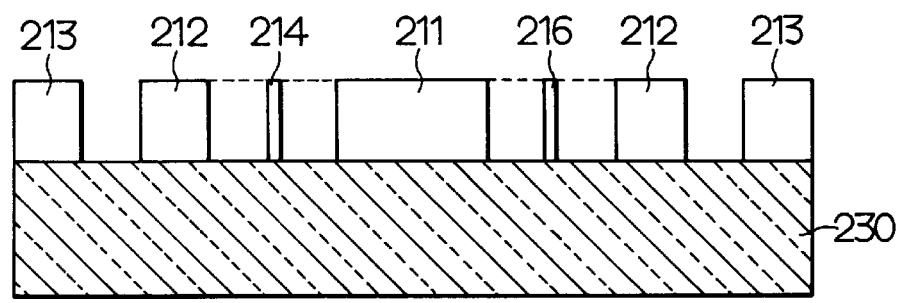
Figure 22:
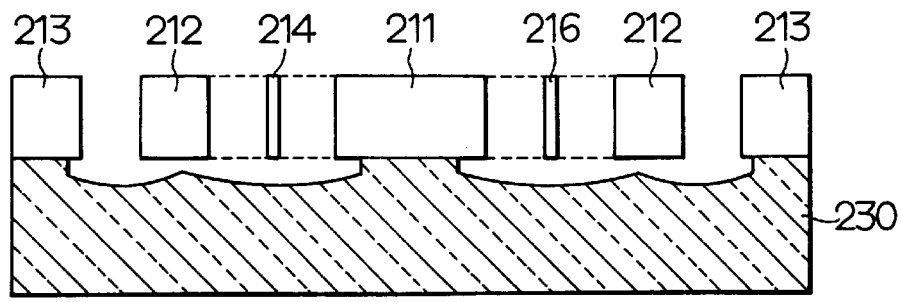

First, as shown in FIG. 20, a Pyrex glass substrate 230 and a low resistance silicon substrate 210 are joined to each other by anode coupling. Pyrex represents a trade name. Before the silicon substrate 210 is joined to the glass substrate 230, if necessary the surface of the silicon substrate 210 may be polished or be etched so that it is thinned to have a desired thickness. Next, as shown in FIG. 21, the silicon substrate 210 is etched to form an anchor part 211, beams 214, 216, a weighting movable electrode 212, and a fixed electrode 213 in predetermined shapes. Finally, as shown in FIG. 22, surface portions of the glass substrate 230 immediately under the weighting movable electrode 212 and the beams 214, 216 are removed by an etching process using an etching solution containing HF so that the weighting movable electrode 212 and the beams 214, 216 become movable. The glass substrate 230 is not limited to the Pyrex glass substrate, and any glass materials which can be joined to silicon by anode coupling and be dissolved by the etching solution containing HF can be used for the glass substrate 230.

(First Embodiment)

Figure 23:
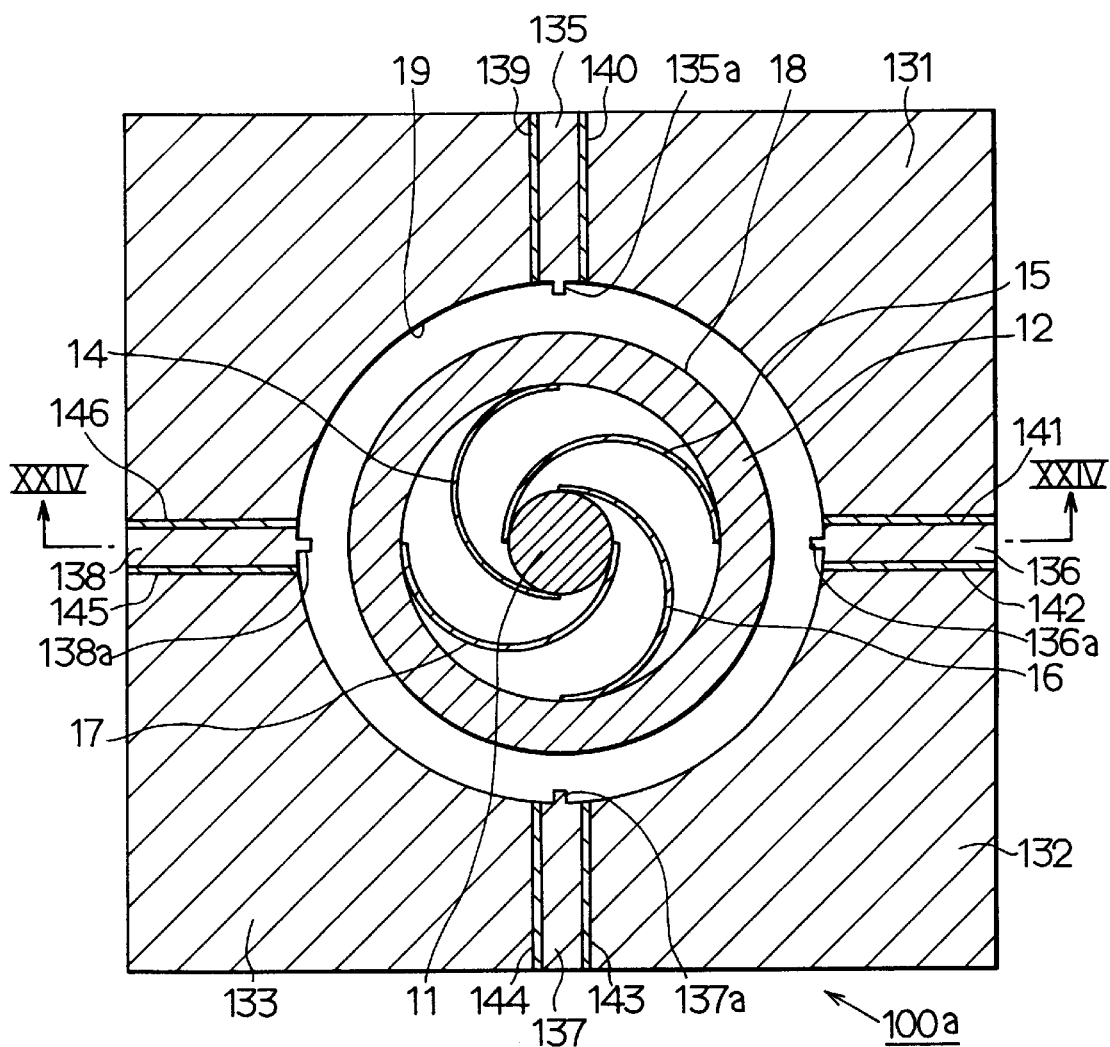
FIG. 23 is a plan view showing an acceleration sensor in a first preferred embodiment of the present invention.
Figure 24:
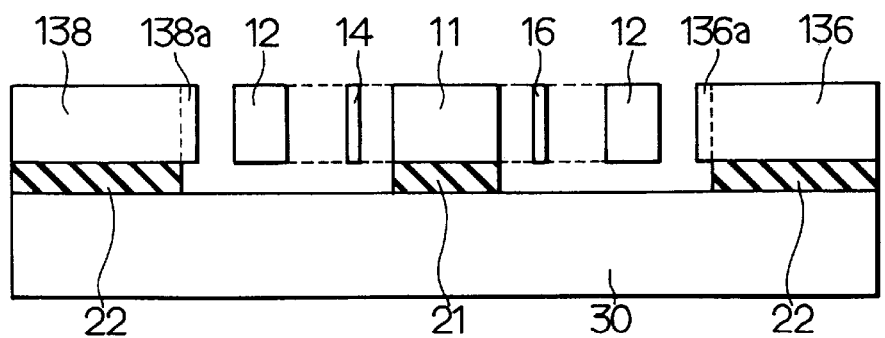
FIG. 24 is a cross-sectional view taken along XXIV—XXIV line in FIG. 23, showing the acceleration sensor.

A first preferred embodiment of the present invention are now explained referring to FIGS. 23, 24. An acceleration sensor 100a in the first embodiment is provided by modifying the basic structure of the acceleration sensor 100 shown in FIGS. 1, 2. In the following embodiments, the same parts and components as those of the acceleration sensor 100 shown in FIGS. 1, 2 are indicated with the same reference numerals and the same descriptions will not be reiterated.

Specifically, in the acceleration sensor 100a, the fixed electrode is divided into sensitivity controlling fixed electrodes 131–134 and fixed electrodes 135–138. Insulating separation layers 139–146 are disposed respectively between adjacent two electrodes of the sensitivity controlling fixed electrodes 131–134 and the fixed electrodes 135–138. The two adjacent electrodes of the fixed electrodes 131–138 may be separated from one another by a gap. The fixed electrodes 135–138 have protrusions 135a–138a for serving as contact points with the weighting movable electrode 12. The protrusions 135a–138a are made of the same material as that of the fixed electrodes 135–138.

To divide the fixed electrode, when the silicon layer 10 is etched as shown in FIG. 4, simultaneously, several grooves are formed in the fixed electrode to divide it into the fixed electrodes 131–138. Each of the grooves serves as the gap for separating one of the fixed electrodes 131–138 from the adjacent one. When the fixed electrodes 131–138 are separated from one another by the insulating separation layers 139–146, the grooves are filled with insulating material.

Figure 25:
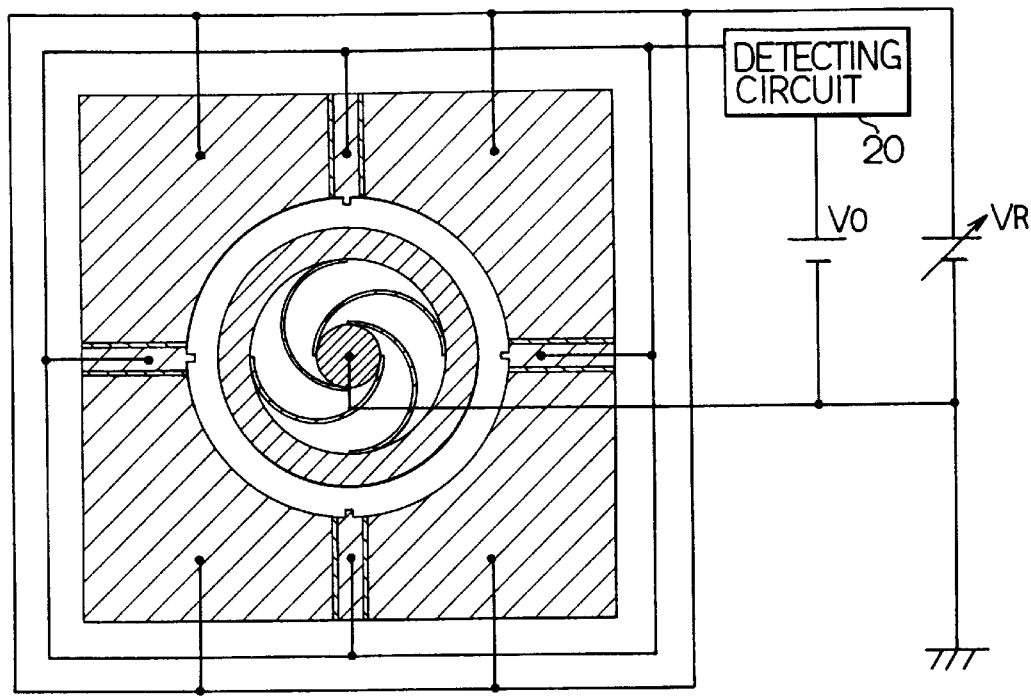
FIGS. 25–27 are schematic views showing electrical constructions of the acceleration sensor for detecting acceleration in the first embodiment.

Next, the operation of the acceleration sensor 100a will be explained. As shown in FIG. 25, voltage $V_O$ is applied between the weighting movable electrode 12 and the fixed electrodes 135–138, and voltage $V_R$ is applied between he weighting movable electrode 12 and the sensitivity controlling fixed electrodes 131–134. In this case, the sensitivity of the acceleration sensor 100a is controlled by independently controlling voltages $V_O$, $V_R$.

Figure 26:
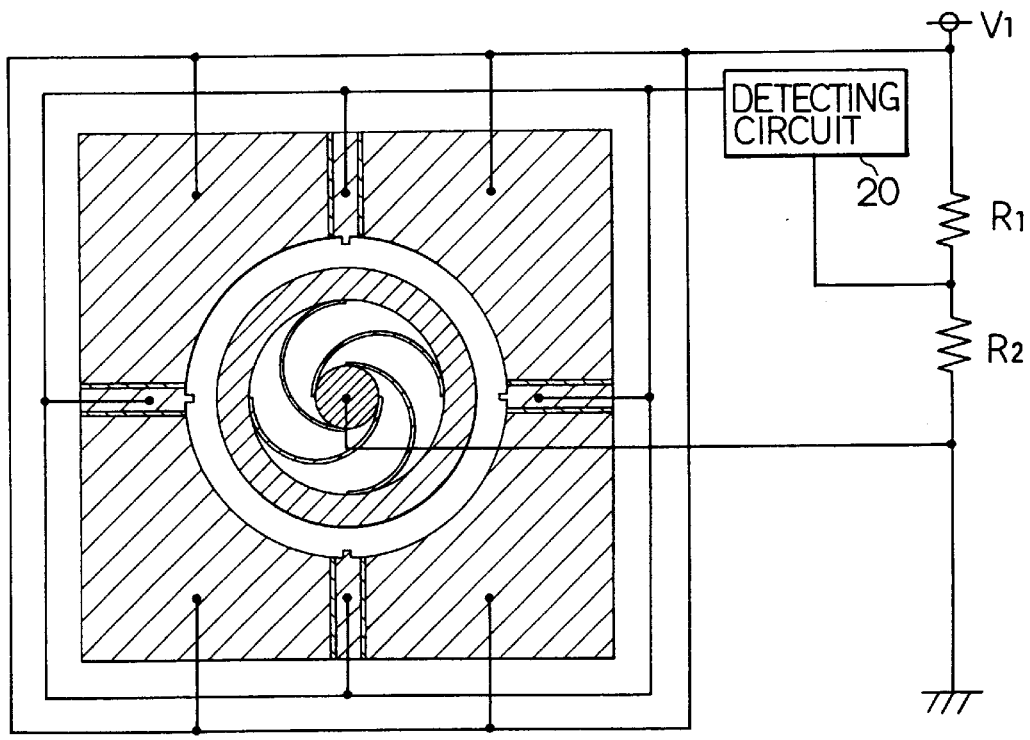
Figure 27:
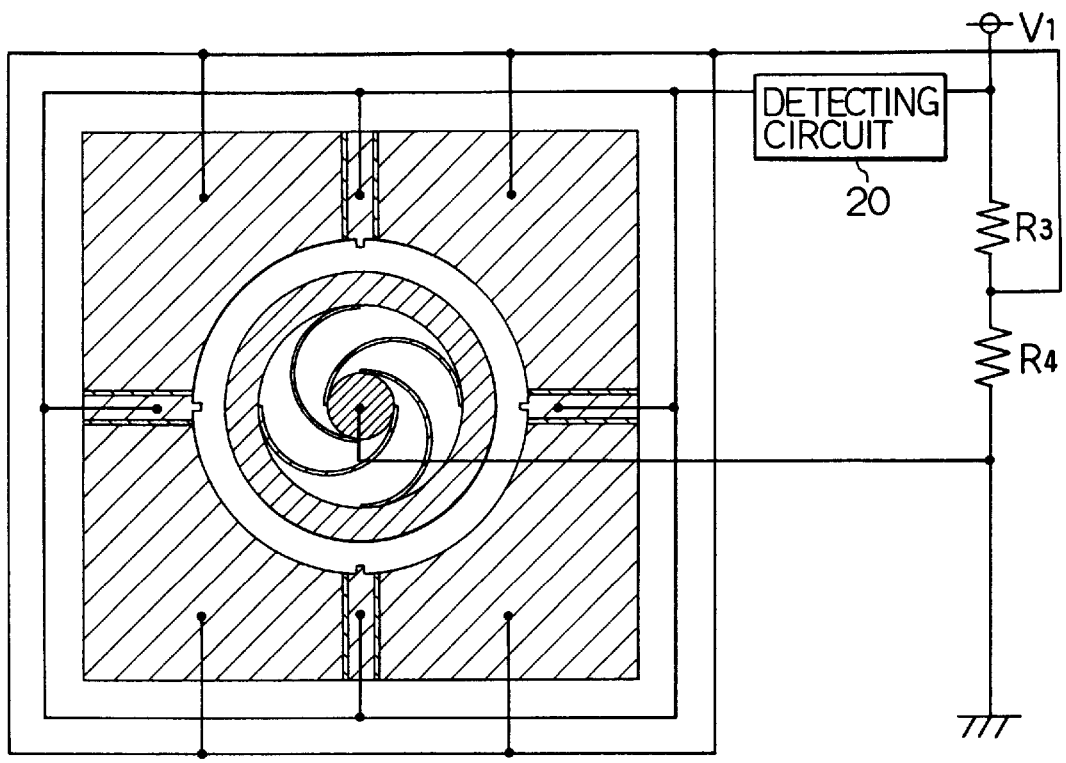

As shown in FIG. 26, voltage $V_1$ derived from an external power may be divided by resistive members R1, R2 into two voltages that are applied between the weighting movable electrode 12 and the fixed electrodes 135–138 and between the weighting movable electrode 12 and the sensitivity controlling fixed electrodes 131–134. In this case, the one external power is sufficient for the acceleration sensor 100a. To set the potential difference between the movable electrode 12 and the sensitivity controlling fixed electrodes 131–134 to be smaller than that between the movable electrode 12 and the fixed electrodes 135–138, in a manner shown in FIG. 27, voltage divided by resistive members R3, R4 can be applied between the electrode 12 and the sensitivity controlling fixed electrodes 131–134.

In this embodiment, the protrusions 135a–138a prevent the weighting movable electrode 12 from being attached to the sensitivity controlling fixed electrodes 131–134 by electrostatic attracting force produced between the weighting movable electrode 12 and the fixed electrodes 131–134. The electrostatic attracting force satisfies the above explained formulas (1)–(3), and as shown in FIGS. 9, 10 it increases as the interval between the weighting movable electrode 12 and the fixed electrodes decreases. More specifically, as understood from FIG. 9, the electrostatic attracting force suddenly increases when the interval between the weighting movable electrode 12 and the fixed electrodes decreases to some extent. Once the electrostatic attracting force suddenly increases, the weighting movable electrode 12 is attached to the fixed electrodes and keeps its state. This may results in faulty operation.

To prevent the attachment of the weighting movable electrode 12 to the fixed electrodes, in this embodiment, it is set that the electrostatic attracting force between the weighting movable electrode 12 and the sensitivity controlling fixed electrodes 131–134 is smaller than the spring restoring force of the beams 14–17, even when the weighting movable electrode 12 contacts one of the protrusions 135a–138a of the fixed electrodes 135–138, i.e., even when the interval between the weighting movable electrode 12 and the sensitivity controlling fixed electrodes 131–134 is the shortest. This point will be herebelow explained in more detail.

Figure 28:
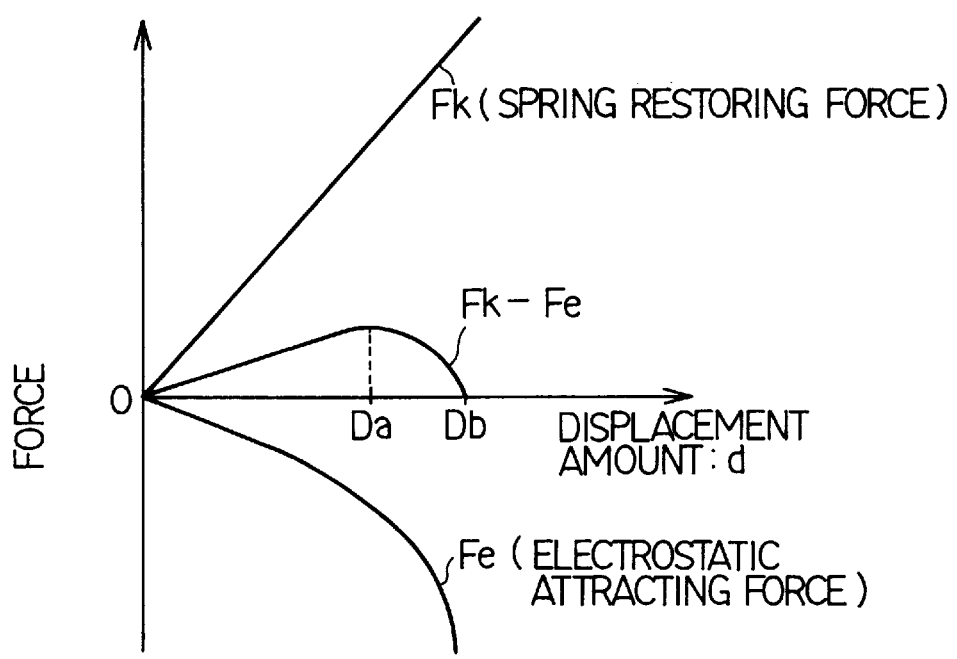
FIG. 28 is a graph showing relationships among spring restoring force $F_k$ of beams, electrostatic attracting force $F_e$ between a movable electrode and a fixed electrode, and displacement amount d of the movable electrode in the acceleration sensor of the first embodiment.

FIG. 28 shows relationships among spring restoring force $F_k$ of the beams 14–17, electrostatic attracting force $F_e$ between the weighting movable electrode 12 and the fixed electrode 13, and displacement amount d of the weighting movable electrode 12. As shown in FIG. 28, a value subtracted electrostatic attracting force $F_e$ from spring restoring force $F_k$, $F_k-F_e$, increases as displacement amount d increases from zero to $D_a$, becomes the maximum at $D_a$ and suddenly decreases as displacement amount d increases from $D_a$ due to sudden increase of electrostatic attracting force $F_e$. When displacement amount d is $D_b$, the value, $F_k-F_e$, becomes zero, and when displacement amount is larger than $D_b$, the value, $F_k-F_e$, is negative. That is, when the displacement amount exceeds $D_b$, the weighting movable electrode 12 is remained attached to one of the protrusions 135a–138a. In such a case, even after acceleration displacing the weighting movable electrode 12 disappears, the weighting movable electrode 12 is not separated from the one of the protrusions 135a–138a.

Therefore, in this embodiment, displacement amount d of the weighting movable electrode 12 is set so that electrostatic attracting force $F_e$ does not exceed spring restoring force $F_k$. That is, each length of the protrusions 135a–138a in a radial direction of the detected face 19 is fixed so that electrostatic attracting force $F_e$ does not exceeds spring restoring force $F_k$ even when the weighting movable electrode 12 contacts one of the protrusions 135a–138a.

Here, in the case where displacement amount d does not exceed $D_a$ when the weighting movable electrode 12 displaced by acceleration having a specific magnitude contacts one of the protrusions 135a–138a, as soon as the magnitude of acceleration decreases than the specific magnitude, the weighting movable electrode 12 separates from the one of the protrusions 135a–138a.

As opposed to this, in the case where displacement amount d is in a range of $D_a$ to $D_b$, the magnitude of acceleration for making the weighting movable electrode 12 contact with one of the protrusions 135a–138a is different from that for separating the weighting movable electrode 12 from the one of the protrusions 135a–138a. That is, when the weighting movable electrode 12 is brought in contact with the one of the protrusions 135a–138a by acceleration having the specific magnitude, the weighting movable electrode 12 does not separate from the one of the protrusions 135a–138a until the magnitude of acceleration decreases by some amount from the specific magnitude. Therefore, when displacement amount d is set in the range of $D_a$ to $D_b$, time in which the weighting movable electrode 12 contacts the one of the protrusions 135a–138a can be lengthened compared to the case where displacement amount d is set in a range of zero to $D_a$.

In this embodiment, as mentioned above, not displacement amount d of the weighting movable electrode 12 but the lengths of the protrusions 135a–138a in the radial direction of the detected face 19 are controlled to fit the above consideration. To decrease the lengths of the protrusions 135a–138a means to increase displacement amount d of the weighting movable electrode 12. Although the protrusions 135a–138a of the fixed electrodes 135–138 has an electric potential with respect to the weighting movable electrode 12, the electrostatic attracting force produced between the movable electrode 12 and the protrusions 135a–138a is smaller than that between the movable electrode 12 and the sensitivity controlling fixed electrodes 131–134, and is smaller that the spring restoring force of the beams 14–17 when the movable electrode 12 contacts one of the protrusions 135a–138a. The protrusions 135a–138a can be shaped as disclosed in FIGS. 12–18 of JP-A-9-145740.

In the above explanation, the sensitivity of the acceleration sensor is controlled by controlling the electrostatic static attracting force between the movable electrode 12 and the sensitivity controlling fixed electrodes 131–134 and the lengths of the protrusions 135a–138a in the radial direction of the detected face 19 are controlled to set the displacement of the movable electrode 12. However, it is also possible to control the sensitivity by changing the lengths of the protrusions 135a–138a in the radial direction of the detected face 19. The protrusions 135a–138a may be formed on the detecting face 18 of the movable electrode 12.

In the first embodiment, although the fixed electrode is divided into the four sensitivity controlling fixed electrodes 131–134 and the four fixed electrodes 135–138, the dividing number of the fixed electrode is not limited. Further, the present invention can be applied to a structure of an acceleration sensor other than the acceleration sensor 100 shown in FIGS. 1, 2.

Figure 29:
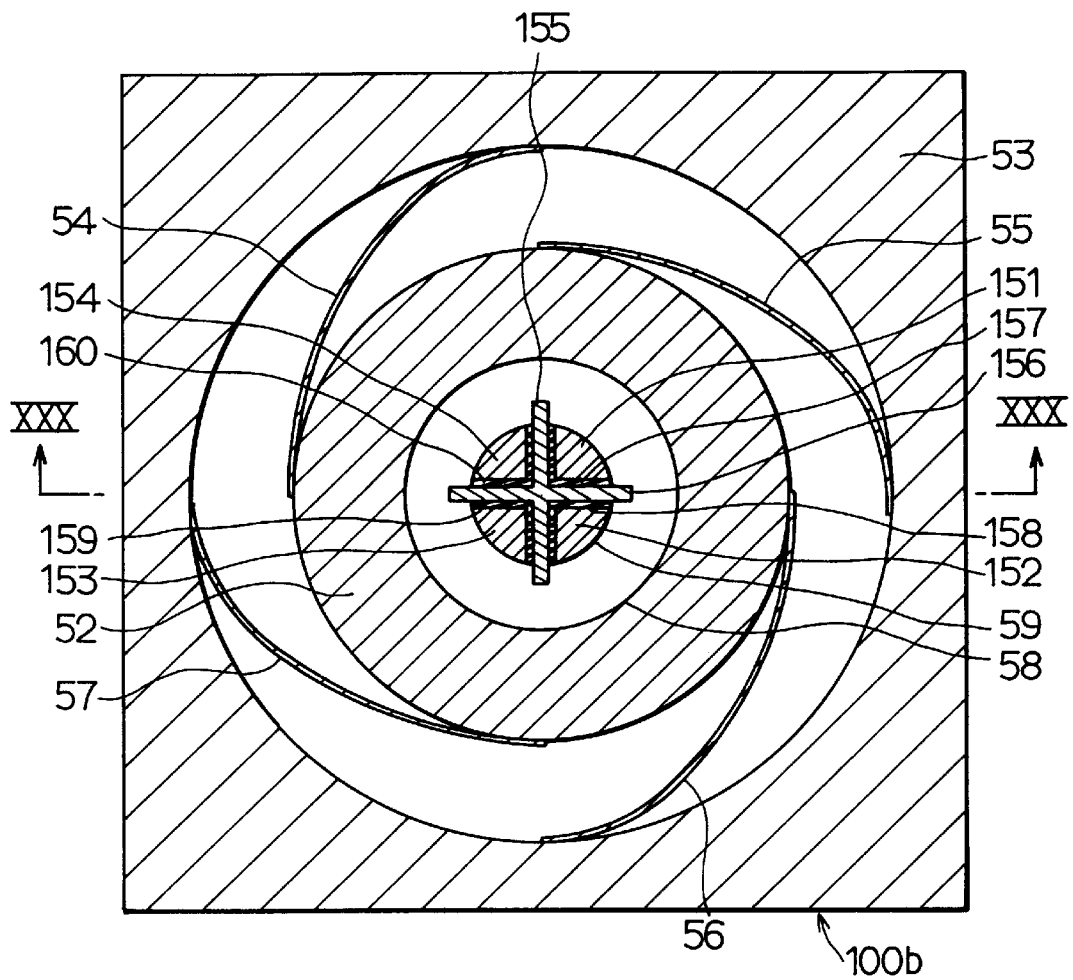
FIG. 29 is a cross-sectional view showing a modified one of the acceleration sensor in the first embodiment.
Figure 30:
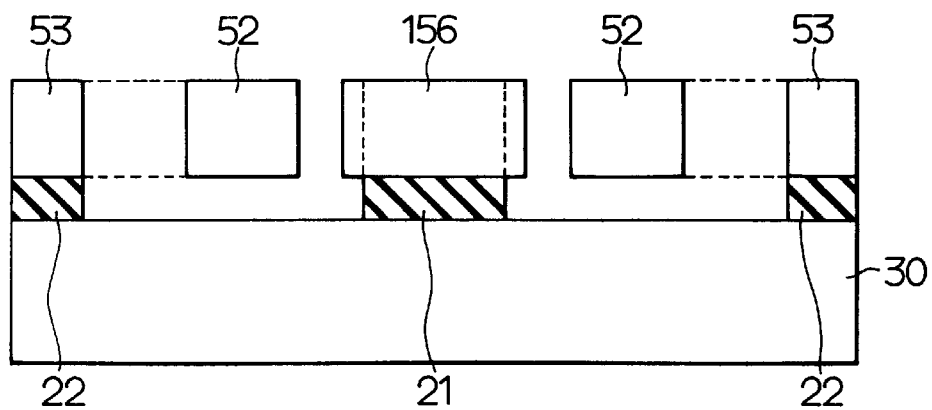
FIG. 30 is a cross-sectional view taken along XXX—XXX line in FIG. 29, showing the acceleration sensor.

Specifically, an acceleration sensor 100b shown in FIGS. 29, 30 has a ring-shaped weighting movable electrode 52 which is displaced by acceleration, a substantially cylindrical fixed electrode disposed at the central hollow portion of the weighting movable electrode 52 defining a specific interval with the weighting movable electrode 52, and an anchor part 53 disposed on an outer diameter side of the weighting movable electrode 52 and supporting the movable electrode 52 with beams 54–57. The inner circumferential side face of the weighting movable electrode 52 serves as a conductive detecting face 58, while the outer circumferential side face of the fixed electrode serves as a conductive detected face 59.

In this structure, the fixed electrode is divided into four sensitivity controlling fixed electrodes 151–154 and fixed electrodes 155, 156, each adjacent two of which are insulated from one another by corresponding one of insulating separation layers 157–160. The fixed electrodes 155, 156 protrude from the sensitivity controlling fixed electrodes 151–154 on both ends thereof in a radial direction of the fixed electrode, thereby providing four protrusions for serving as contact points with the movable electrode 52 and for preventing attachment of the movable electrode 52 to the fixed electrodes. By applying the electrical connections shown in FIGS. 25–27 to the acceleration sensor 100b, voltages can be independently applied between the movable electrode 52 and the sensitivity controlling fixed electrodes 151–154 and between the movable electrode 52 and the fixed electrodes 155, 156.

The acceleration sensors 100a, 100b may be constructed using an SOI substrate as explained referring to FIGS. 12–19. Accordingly, the size of the sensor can be reduced. The electrical wiring can be also readily performed. In this case, a method for dividing the fixed electrode into the fixed electrodes 131–138 is different in the two cases where the fixed electrodes 131–138 are insulated (separated) from one another by the insulating separating layers 139–146 and by the gaps.

In the case the fixed electrodes are insulated from one another by the insulating separation layers 139–146, referring to FIG. 12, when the groove 40a for alignment is formed, simultaneously a plurality of grooves for dividing the fixed electrode is formed in the substrate 40 by dry-etching. Then, when the silicon oxide layer 41 is formed on the substrata 40, the grooves are filled with the silicon oxide layer, thereby providing the insulating separation layer 138–146. In this case, when the silicon oxide layer 41 is removed by the etching process as shown in FIG. 19, it is necessary that the surfaces of the insulating separation layer 138–146 are masked not to be etched.

In the case the fixed electrodes 131–138 are separated from one another via the gaps, the gaps can be formed together with the anchor part, the movable electrode, the beams, and the fixed electrode by the etching process shown in FIG. 18. Otherwise, as mentioned above, after the grooves formed in the substrate 40 together with the groove 40a are filled with the silicon oxide layer 41, in the etching process for the silicon oxide layer 41 shown in FIG. 19, silicon oxide in the grooves can be removed so that the fixed electrodes 131–138 are separated from one another via the vacant grooves (gaps).

(Second Embodiment)

Figure 31:
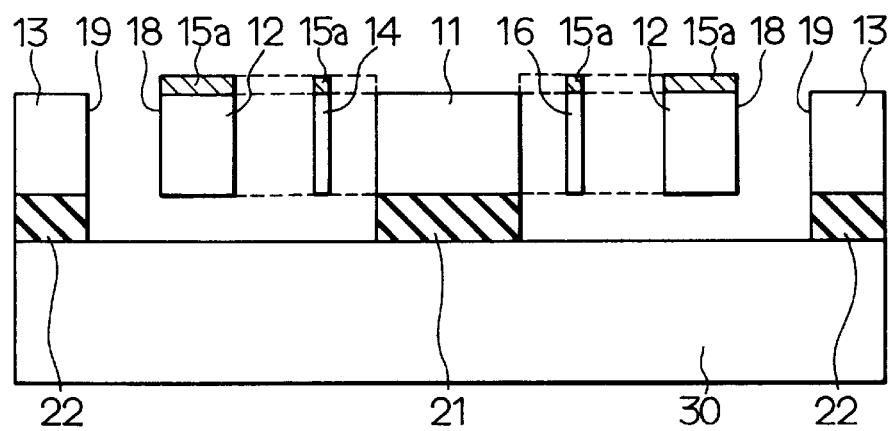
FIG. 31 is a cross-sectional view showing an acceleration sensor in a second preferred embodiment.

FIG. 31 shows an acceleration sensor in a second preferred embodiment. In the second embodiment, a thin film (deformation preventing thin film) 15a having tensile stress therein is formed on surfaces of the beams 14–17 and the movable electrode 12. The thin film 15a applies force to the movable electrode 12 in a direction opposite to a gravitational direction to prevent the beams 14–17 from deforming by the gravitational force of the movable electrode 12 in the gravitational direction. That is, the thin film 15a prevents the movable electrode 12 from hanging down by its self-weight. More specifically, the thin film 15a prevents the moment (bending and torsional moment) of the gravitational force of the movable electrode 12 from being applied to the beams 14–17, so that the deformation of the beams 14–17 is depressed. The thin film 15a having tensile stress can be made of for example nitride or metallic material having tensile stress.

Accordingly, in the second embodiment, because the beams 14–17 and the movable electrode 12 can be prevented from deforming in the gravitational direction, when acceleration having a specific magnitude or more is applied to the acceleration sensor in parallel with the surface of the substrate 30, the detecting face 18 of the movable electrode 12 contacts the detected face 19 of the fixed electrode 13 so that the sensor detects the acceleration with high accuracy.

Figure 32:
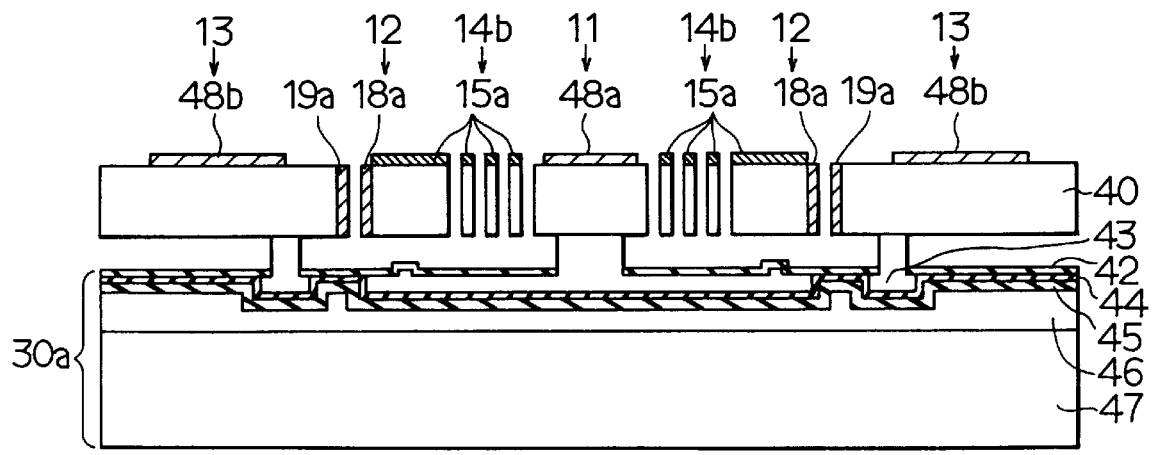
FIG. 32 is a cross-sectional view showing a modified one of the acceleration sensor in the second embodiment.
Figure 33A:
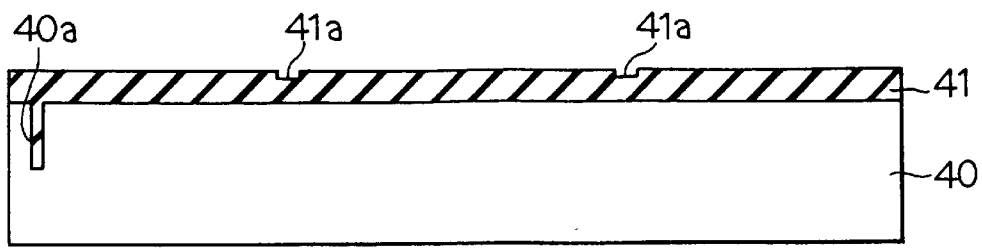
FIGS. 33A–33F are cross-sectional views for explaining processes of manufacturing the acceleration sensor of FIG. 32.
Figure 33B:
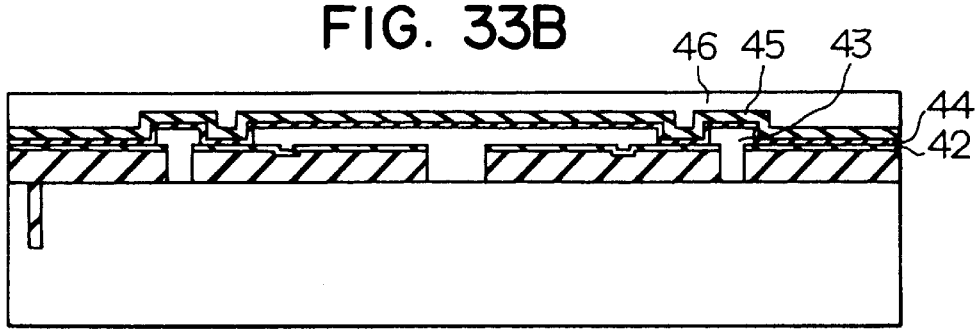
Figure 33C:
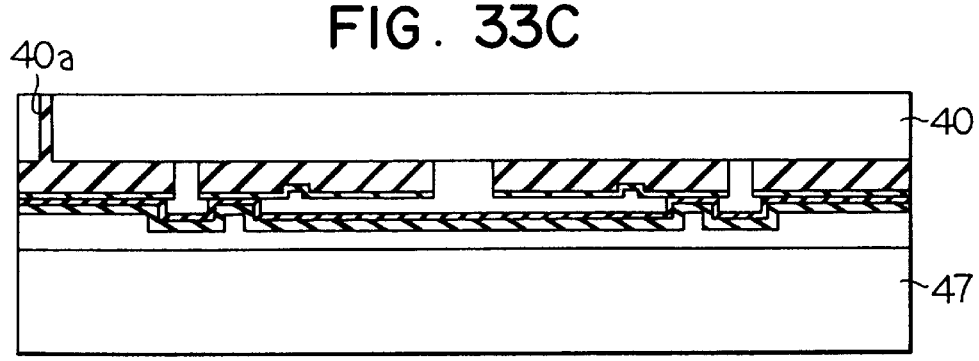

An SOI substrate can be adopted to the acceleration sensor in the second embodiment as shown in FIG. 32. The method of manufacturing this type of the acceleration sensor will be explained referring to FIGS. 33A–33F. Here, processes shown in FIGS. 33A–33C are substantially the same as those described above referring to FIGS. 12–16, and therefore the same descriptions will not be reiterated. Briefly, the first and second silicon substrates 47, 41 are laminated with one another through a plurality of layers 41–46, and the surface of the silicon substrate 40 is mechanically polished until the silicon oxide layer 41 in the groove 40a is exposed.

Figure 33D:
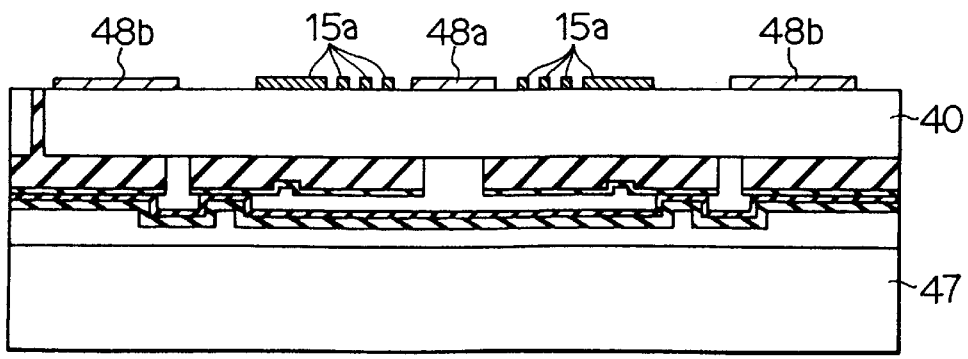
Figure 33E:
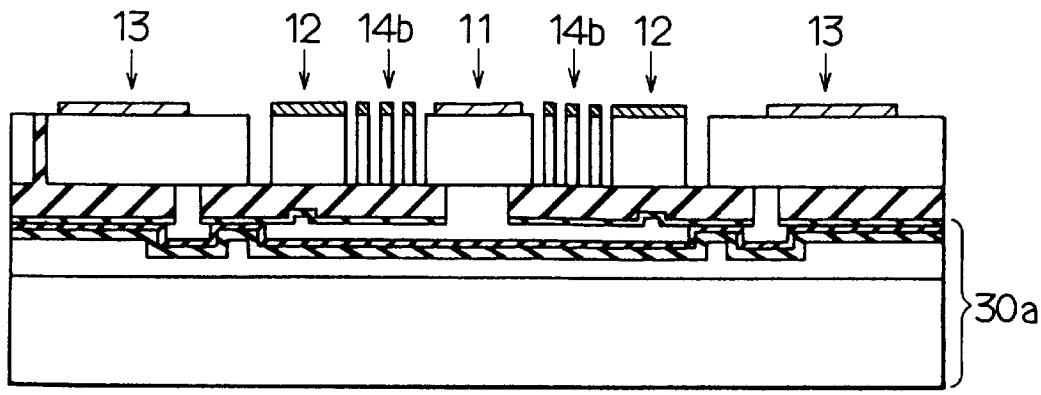

Then, as shown in FIG. 33D, after the aluminum electrodes 48a, 48b are formed on the substrate 40, the thin film 15a for depressing deformation of the beams are formed on the silicon substrate 40 by utilizing a photo-lithography technique. Further, as shown in FIG. 33E, the silicon substrate 40 is etched through an etching mask so that the anchor part 11, the weighting movable electrode 12, beams 14b, and the fixed electrode 13 are formed. The etching mask of the silicon substrate 40 may be a hard mask such as an oxide layer or be a soft mask such as photo-resist.

Next, the silicon oxide layer 41 is removed by a sacrifice layer etching process using an etching solution including HF, so that the weighting movable electrode 12 and the beams 14b become movable. After the sacrifice layer etching process, a dry process is conducted using a sublimating agent such as para-dichlorobenzene for preventing the beams 14b from attaching the substrate 30a. Here, the substrate 47 and the layers 42–46 lying on the substrate 47 are integrally referred to as the substrate 30a.

Figure 33F:
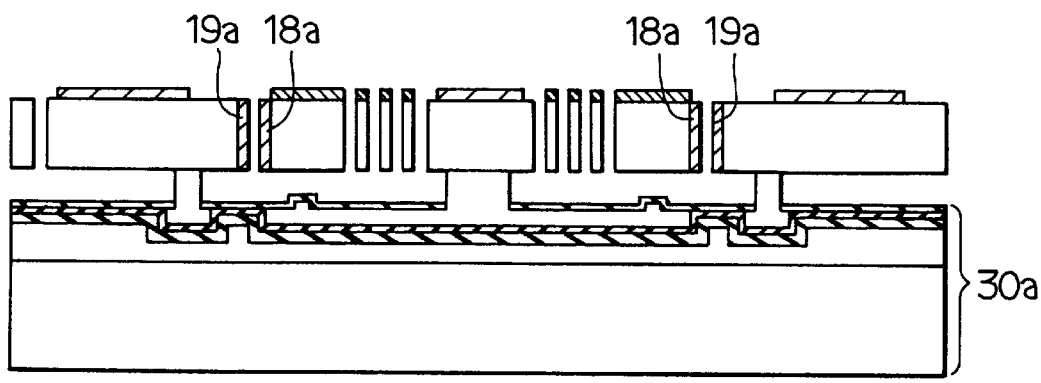

Thereafter, as shown in FIG. 33F, to reduce contact resistance between the detecting face 18 of the weighting movable electrode 12 and the detected face 19 of the fixed electrode 13, contact electrodes 18a, 19a are respectively formed on the cylindrical side faces of the electrodes 12, 13 to form the detecting face 18 and the detected face 19. The contact electrodes 18a, 19a are for example formed from gold having low contact resistance. When the contact electrodes 18a, 19a are made of material which is not dissolved by the etching solution for the silicon oxide layer 41, the contact electrodes 18a, 19a can be formed before the sacrifice layer etching process. Thus the acceleration sensor shown in FIG. 32 is manufactured.

In this acceleration sensor, the aluminum electrodes 48a, 48b of the anchor part 11 and the fixed electrode 13 are electrically connected to the detecting circuit via wires, and a specific potential difference is set between the electrodes 48a, 48b. Because the anchor part 11, the weighting movable electrode 12, the beams 14b, and the fixed electrode 13 are formed from the silicon substrate 40, the aluminum electrode 48a on the anchor part 11 and the contact electrode 18a on the weighting movable electrode 12 electrically communicate with each other, and the aluminum electrode 48b and the contact electrode 19a on the fixed electrode 13 also electrically communicate with each other.

As mentioned above, because the thin film 15a is formed on the beams 14b as well as on the weighting movable electrode 12 on an opposite side of the substrate 30a, the beams 14b are prevented from deforming in the gravitational direction by the gravitational force of the movable electrode 12. Preferably, the thin film 15a is formed only on the beams 14b and the movable electrode 12.

When acceleration larger than a specific magnitude is applied to the acceleration sensor in a direction parallel to the surface of the substrate 30a, the movable electrode 12 is displaced so that the contact electrode 18a of the movable electrode 12 contacts the contact electrode 19a of the fixed electrode 13. At that time, as the deformation of the movable electrode 12 is depressed by the thin film 15a, the contacting area between the contact electrodes 18a, 19a can be sufficiently assured. As soon as the contact electrode 18a contacts the contact electrode 19a, current flows between the aluminum electrodes 48a, 49a, and the detecting circuit detects the acceleration.

The polysilicon layer 43 underlying the anchor part 11 is conductive. Therefore, when the electric potential of the polysilicon layer 43 is controlled to be equal to that of the movable electrode 12, no electrostatic attracting force is generated between the movable electrode 12 and the substrate 30a. As a result the movable electrode 12 is prevented from hanging down toward the substrate 30a.

Figure 34:
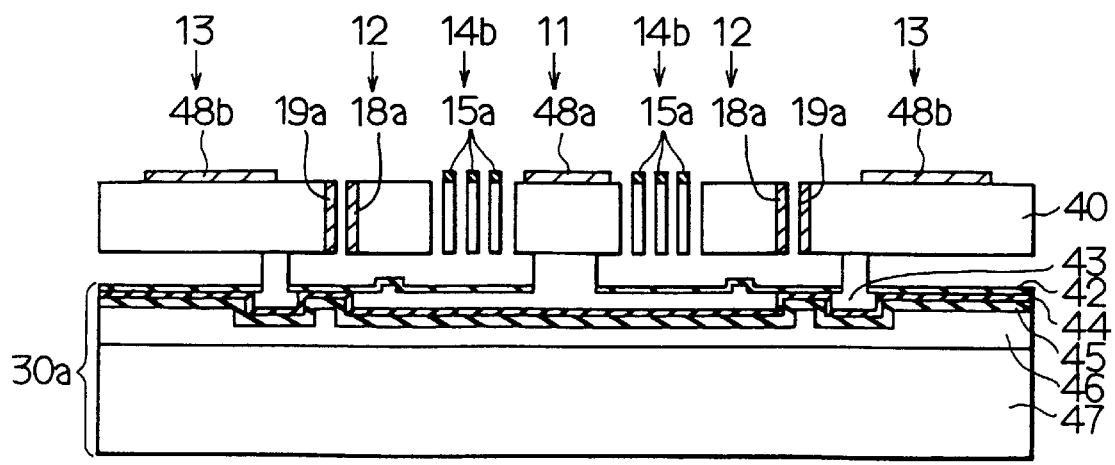
FIG. 34 is a cross-sectional view showing another modified one of the acceleration sensor in the second embodiment.

In the above acceleration sensor, the thin film 15a for depressing deformation of the beams 14b is formed on the beams 14b and the movable electrode 12; however as shown in FIG. 34 the thin film 15a may be formed only on the beams 14b. In this case, the movable electrode 12 is not warped by the thin film 15a. In both acceleration sensors shown in FIGS. 32, 34, the tensile stress of the thin film 15a depresses the deformation of the beams 14b. When the tensile stress can keep the beams 14b and the movable electrode 12 approximately parallel to the surface of the substrate 30a, the detecting face 18a of the movable electrode 12 moves approximately in parallel to the surface of the substrate 30a, thereby improving detecting accuracy of the sensor.

The thin film 15a for preventing the deformation of the beams 14b can be formed from shape memory alloy. In this case, before the beams and the movable electrode are deformed, the shape memory alloy film is formed on the beams and the movable electrode and is heated to memorize the shape. Then, if the beams and the movable electrode are deformed, the shape memory alloy film is heated again to be restored to its initial shape.

The second embodiment can be combined with the first embodiment. That is, for example, in the acceleration sensor 100a shown in FIGS. 23, 24, the thin film 15a can be formed on the beams 14–17 and on the movable electrode 12 on the opposite side of the substrate 30 to prevent the movable electrode 12 from hanging down toward the substrate 30.

(Third Embodiment)

The second embodiment proposes the acceleration sensor in which the beams and the weighting movable electrode are prevented from deforming by its self-weight. As opposed to this, a third preferred embodiment proposes an acceleration sensor capable of accurately detecting acceleration even when the beams and the weighting movable electrode are deformed by the self-weight.

Figure 35:
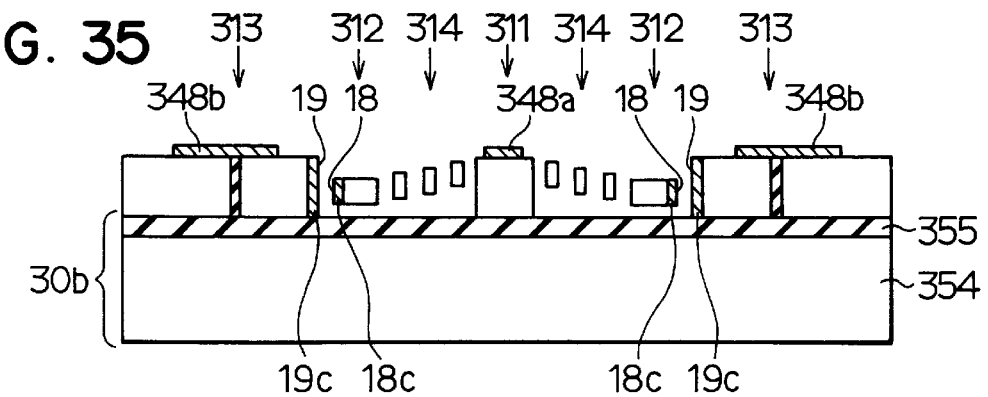
FIG. 35 is a cross-sectional view showing an acceleration sensor in a third preferred embodiment.

Referring to FIG. 35, the acceleration sensor in the third embodiment includes a substrate 30b composed of a silicon substrate 354 and an insulating layer 355 disposed on the silicon substrate 354. An anchor part 311, a weighting movable electrode 312, beams 314, a fixed electrode 313 are disposed on the substrate 30b. The anchor part 311, the surfaces of the anchor part 311, the weighting movable electrode 312, the beams 314, and the fixed electrode 313 on an opposite side of the substrate 30b are on the same plane when the movable electrode 312 and the beams 314 do not hang down toward the substrate 30b at all by the self-weight thereof, i.e., when no gravitational force is applied to the movable electrode 312 and the beams 314. The thicknesses of the movable electrode 312 and the beams 314 are thinner than that of the anchor part 311 and the fixed electrode 313.

Aluminum electrodes 348a, 348b are formed on the anchor part 311 and the fixed electrode 313. Contact electrodes 18c, 19c are respectively formed on the side walls of the weighting movable electrode 312 and the fixed electrode 313 to face one another. The surface of the contact electrode 18c serves as the detecting face 18 of the movable electrode 318, while the surface of the contact electrode 19c of the fixed electrode 313 serves as the detected face 19 of the fixed electrode 313.

By employing the above structure, even if the movable electrode 312 and the beams 314 hang down toward the substrate 30b by the self-weight together with the contact electrode 18c, the contact electrode 18c contacts the contact electrode 19c to accurately detect acceleration. This is because the area of the contact electrode 19c of the fixed electrode 313 is wider than that of the contact electrode 18c in a direction perpendicular to the surface of the substrate 30b. In addition, because the thicknesses of the movable electrode 312 and the beams 314 are thinner than that of the anchor part 311, the movable electrode 312 and the beams 314 hardly contact the substrate 30b even when they hang down by the self-weight.

Figure 36A:
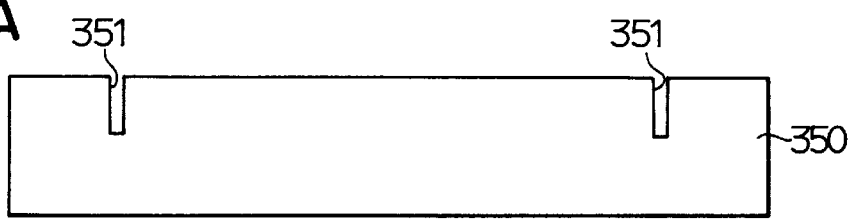
FIGS. 36A–36G are cross-sectional views for explaining processes of manufacturing the acceleration sensor in the third embodiment.
Figure 36B:
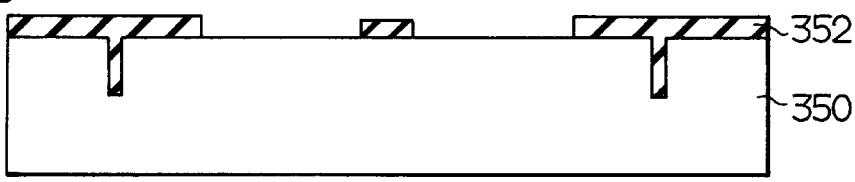
Figure 36C:
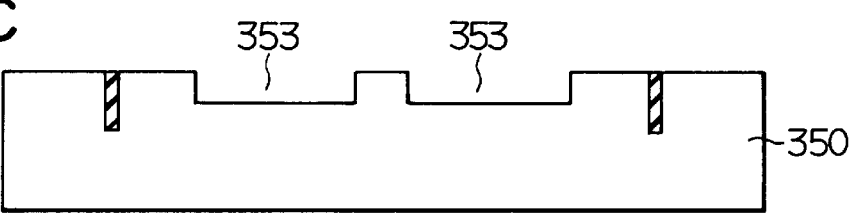

The above-mentioned acceleration sensor is manufactured as follows. First, as shown in FIG. 36A, grooves 351 for alignment are formed on a silicon substrate (first substrate) 350 by trench-etching. Then, as shown in FIG. 36B, a silicon oxide layer 352 is formed on the substrate 350 as well as in the grooves 351 by a CVD method or the like, and it is patterned. Using this silicon substrate 352 as a mask, as shown in FIG. 36C, the silicon substrate 350 is etched by an alkaline solution such as TMAH or KOH solution, thereby forming recess parts 353. After the etching process, the silicon oxide layer 352 is removed by an etching solution including HF and the like.

Figure 36D:
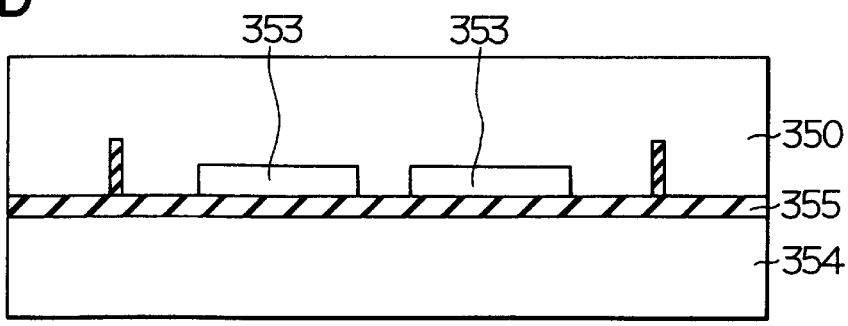
Figure 36E:
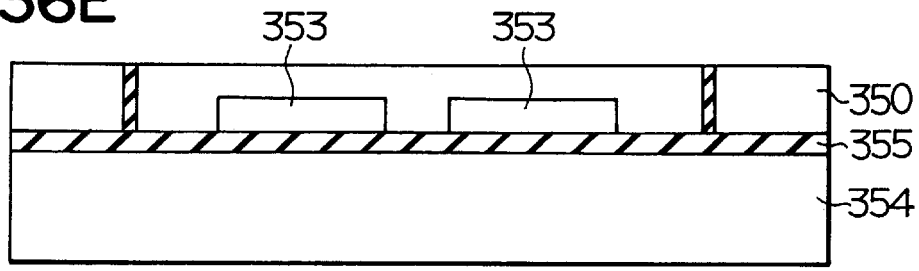
Figure 36F:
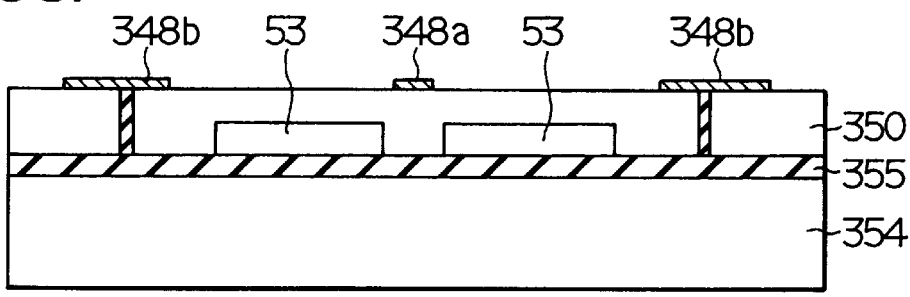

Subsequently, as shown in FIG. 36D the silicon substage 350 is joined to the single crystal silicon substrate (second substrate) 354 on which the insulating layer 355 is formed. Then, as shown in FIG. 36E the silicon substrate 350 is thinned, for example, by mechanically polishing the surface thereof on an opposite side of the substrate 354 until the grooves 51 are exposed. Impurities such as phosphorus are doped into the silicon substrate 350 such that the silicon substrate 350 works as an electrode. On the polished surface of the silicon substrate 350, as shown in FIG. 36F, the aluminum electrodes 348a, 348b are formed using the photo-lithography technique and the like.

Then, after an etching mask is formed on the substrate 350 by a photo-lithography process, the anchor part 311, the movable electrode 312, the beams 314, and the fixed electrode 313 are formed by dry-etching thin parts of the substrate 350 through the etching mask. In this case, due to the recess parts 353, the movable electrode 312 and the beams 314 have a thickness thinner than that of the anchor part 311 and the fixed electrode 313. The etching mask for the substrate 350 may be a soft mask such as photo-resist, and be a hard mask such as an oxide layer. Finally, the contact electrodes 18c, 19c of the movable electrode 312 and the fixed electrode 313 are formed. Thus the acceleration sensor shown in FIG. 35 is manufactured.

In the above-mentioned manufacturing method, as the movable electrode 312 and the beams 314 are formed in a movable state by dry-etching the substrate 350, it is not necessary to conduct the sacrifice layer etching process for making the movable electrode and the beams in the movable state and the dry process after the sacrifice layer etching process.

Figure 37:
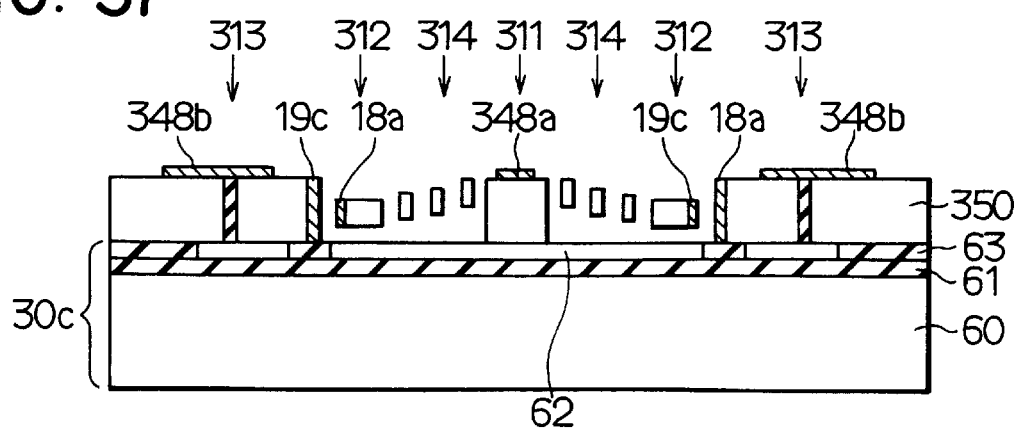
FIG. 37 is a cross-sectional view showing a modified one of the acceleration sensor in the third embodiment.

As shown in FIG. 37, a lower electrode (conductive thin layer) 62 may be disposed under the anchor part 311, the movable electrode 312, the beams 314, and the fixed electrode 313. Specifically, in FIG. 37, a substrate 30c is composed of a silicon substrate 60, an insulating layers 61, 63, and the lower electrode 62 made of polysilicon. The anchor part 311 can be electrically connected to an external circuit through the lower electrode 63.

Figure 38A:
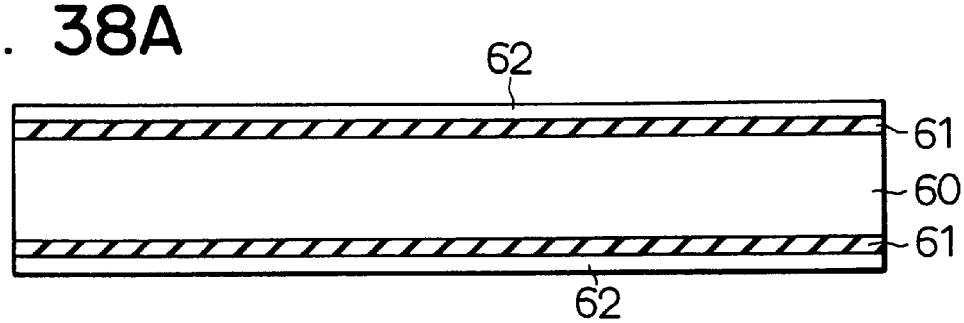
FIGS. 38A–38G are cross-sectional views for explaining processes of manufacturing the acceleration sensor shown in FIG. 37.
Figure 38B:
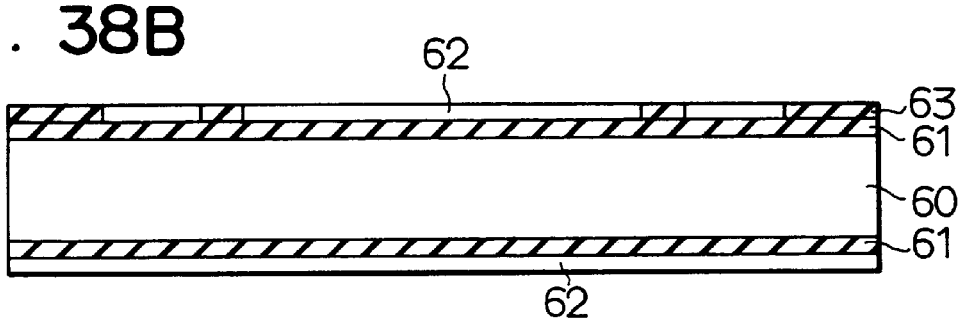
Figure 38C:
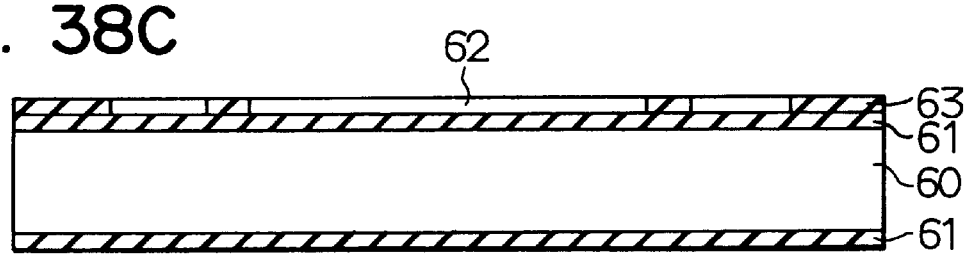

Next, the method of manufacturing the acceleration sensor shown in FIG. 37 will be explained. First, as explained above referring to FIGS. 36A–36C, the recess part 353 and the grooves 351 filled with silicon oxide are formed on the silicon substrate 350 serving as the first substrate. Concerning the second substrate, as shown in FIG. 38A, thermally oxidized layers 61 are formed on both surfaces of the single crystal silicon substrate 60, and polysilicon layers 62 are respectively formed on the thermally oxidized layers 61. Then, after one of the polysilicon layers 62 is patterned in a specific shape, a silicon oxide layer 63 is formed as shown in FIG. 38B by a CVD method. The other of the polysilicon layer 62 is removed as shown in FIG. 38C. Then, the surface of the polysilicon layer 62 and the silicon oxide layer 63 are polished to be flat.

Figure 36G:
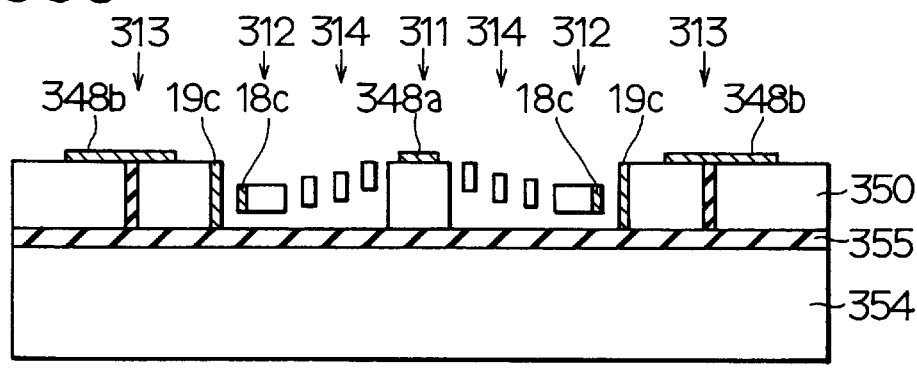
Figure 38D:
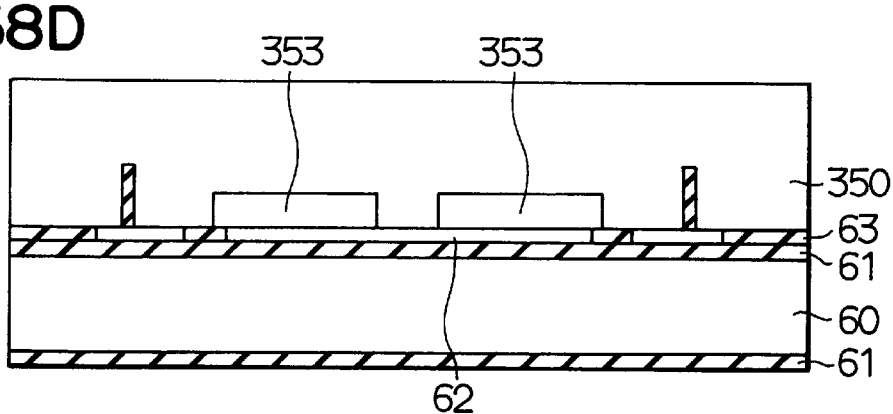
Figure 38E:
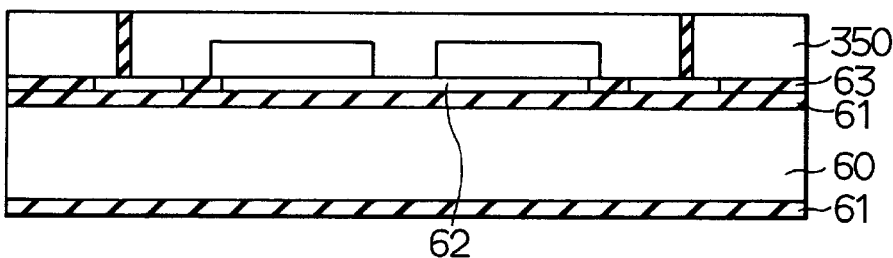
Figure 38F:
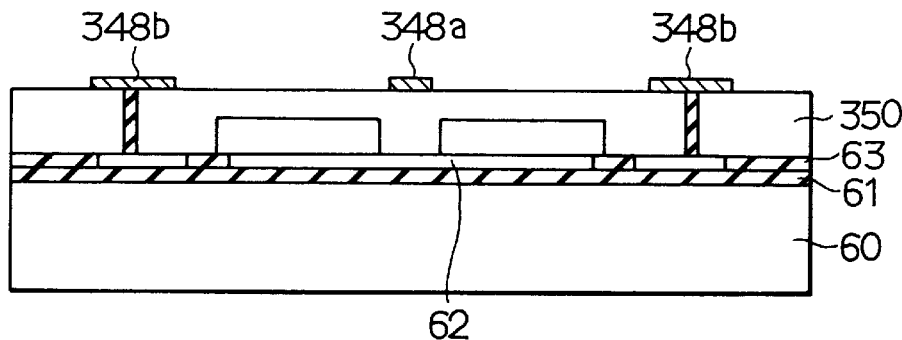
Figure 38G:
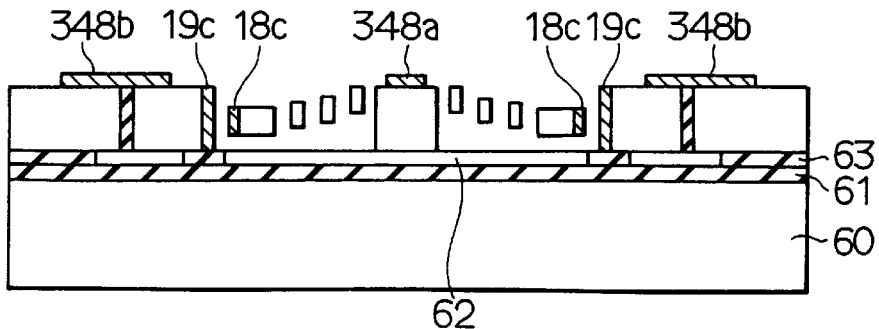

Subsequently, as shown in FIG. 38D, the first and second substrates 60, 350 are joined to each other so that the polysilicon layer 62 and the recess parts 353 face one another. The successive processes shown in FIGS. 38E–38G are substantially the same as those explained referring to FIGS. 36E–36G. The same explanation will not be reiterated. Thus, the acceleration sensor shown in FIG. 37 are manufactured.

The third embodiment can be combined with the first and second embodiment. In the first to third embodiments the substrate, the anchor part, the weighting movable electrode, the beams, and the fixed electrode can be variously modified as disclosed in JP-A-9-145740. For example, the substrate may be made of glass. The fixed electrode can have protrusions on the detected face thereof to increase contact pressure when the detecting face of the movable electrode contacts the fixed electrode. The fixed electrode may be disposed at the central portion of the ring shaped movable electrode. In this case, the anchor part is disposed on the outer diameter side of the movable electrode with the beams connecting the anchor part and the movable electrode. The beams may be made of spiral springs. The above-mentioned acceleration sensor includes the four beams; however, only one beam is sufficient to support the weighting movable electrode in the acceleration sensor. In the above embodiments, although acceleration is detected when the detecting face of the movable electrode contacts the detected face of the fixed electrode, instead, acceleration can be detected based on a change in magnitude of the electrostatic attracting force between the detecting face of the movable electrode and the detected face of the fixed electrode.

(Fourth Embodiment)

In the acceleration sensor described above, when acceleration is applied to the sensor in a direction perpendicular to the substrate, the movable portion including the movable electrode and beams may be displaced to contact the silicon substrate. This contact causes current in the substrate, resulting in erroneous detection by a detecting circuit. Therefore, a fourth preferred embodiment proposes an acceleration sensor capable of preventing such erroneous detection caused when the acceleration is produced in the perpendicular direction.

Figure 39A:
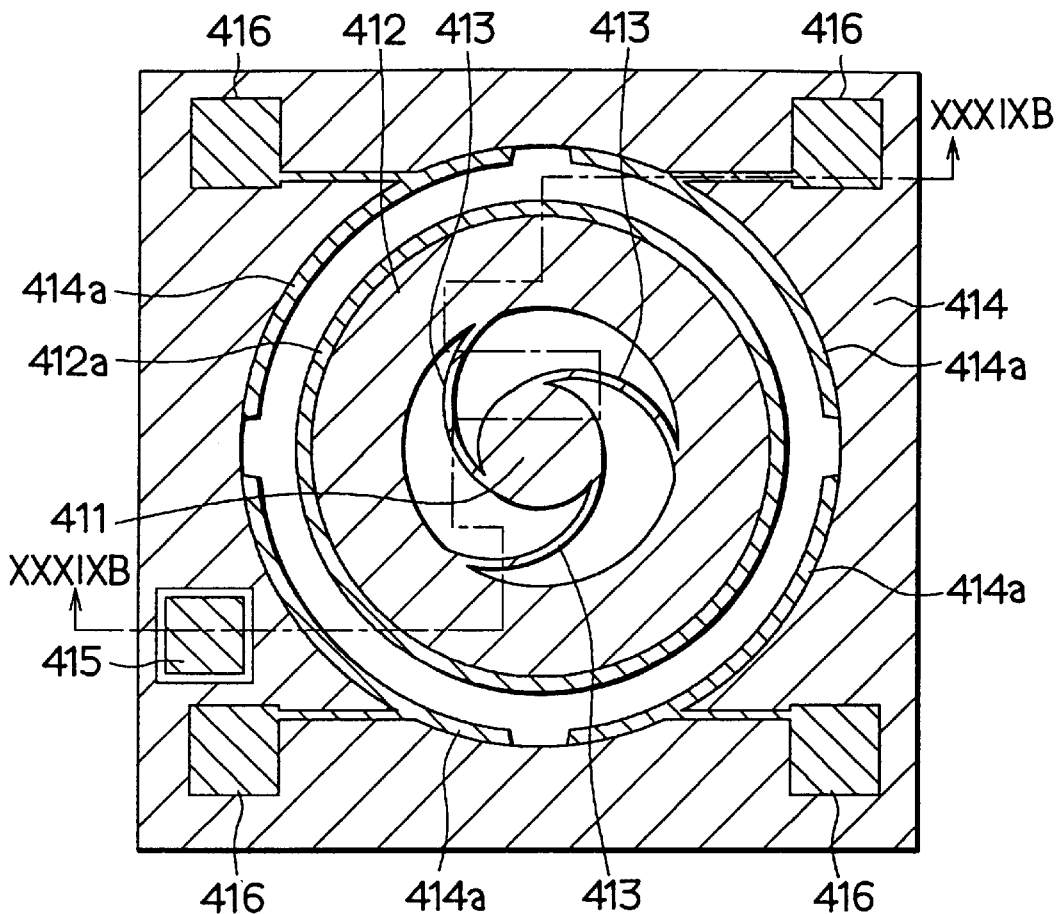
FIG. 39A is a plan view showing an acceleration sensor in a fourth preferred embodiment.
Figure 39B:
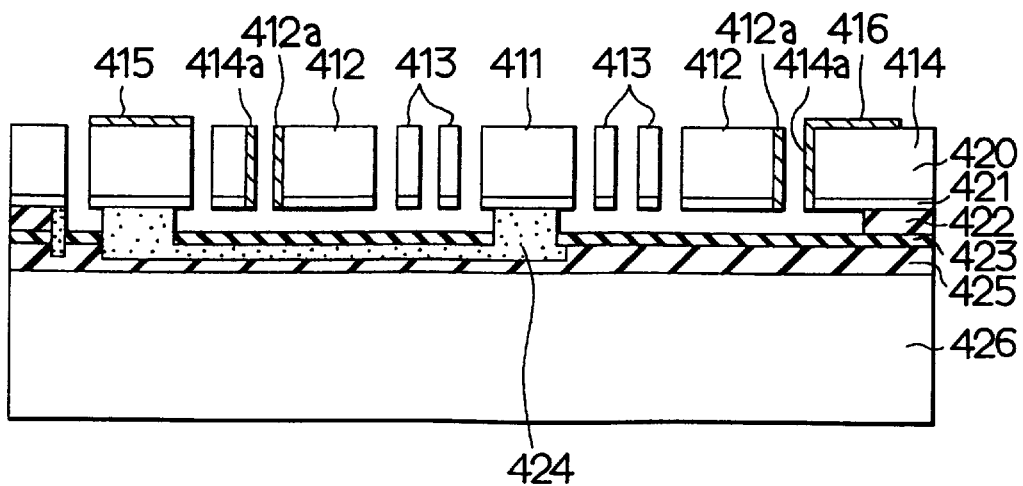
FIG. 39B is a cross-sectional view taking along a XXXIXB—XXXIXB in FIG. 39A.

Referring to FIGS. 39A and 39B, an anchor part 411 is fixedly disposed at the central portion of the acceleration sensor in the fourth embodiment, and a weighting movable electrode 412 is supported by the anchor part 411 through three beams 413 to be disposed around the anchor part 411.

Accordingly, when acceleration is produced in a horizontal direction, i.e., in a parallel direction approximately parallel to the substrate surface, the beams 413 elastically deform to displace the movable electrode 412 in the horizontal direction. The movable electrode 412 has a contact electrode 412a on the columnar circumferential side wall thereof. A fixed electrode 414 is disposed on the outer circumferential side of the movable electrode 412, and has a contact electrode 414a on the circumferential side face thereof facing the contact electrode 412a.

The anchor part 411, the movable electrode 412, the beams 413, and the fixed electrode 414 are formed by processing a silicon substrate. An N+ diffusion layer 421 is disposed on the lower surfaces of these portions to reduce resistance. The anchor part 411 is fixed to the silicon substrate 426 through an oxide film 425 and a polysilicon layer 424. The fixed electrode 414 is fixed to the silicon substrate 426 through the oxide film 425, a nitride film 423, and an oxide film 422. The polysilicon film 424 extends from the lower portion of the anchor part 411 to a lower portion of a pad 415. Accordingly, an electrical potential of the movable electrode 412 (the contact electrode 412a) can be controlled from the pad 415 through the polysilicon film 424, the anchor part 411, and the beams 413. The contact electrode 414a on the fixed electrode 414 is electrically connected to pads 416 so that an electrical potential of the fixed electrode 414 (contact electrode 414a) is controlled from the pads 416.

Figure 40:
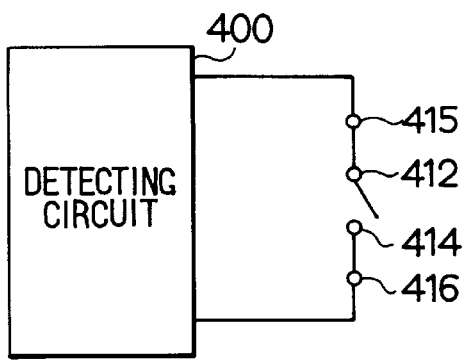
FIG. 40 is a diagram showing an electrical constitution for detecting acceleration in the acceleration shown in FIGS. 39A and 39B.

FIG. 40 shows an electrical constitution for detecting the acceleration. A detecting circuit 400 sets the movable electrode 412 at a high potential through the pad 415, and sets the fixed electrode 414 at a low potential through the pads 416. As a result, a specific potential difference is produced between the movable electrode 412 and the fixed electrode 414. In this state, when the acceleration having a magnitude larger than a specific magnitude is produced in the horizontal direction, the movable electrode 412 is displaced so that the contact electrodes 412a, 414a contact one another. At that time, because the specific potential difference is set between the movable electrode 412 and the fixed electrode 414, current flows from the movable electrode 412 to the fixed electrode 414. As a result, the detecting circuit 400 detects that the acceleration having a magnitude larger than the specific magnitude occurs.

The movable electrode 412 and the beams 413 constitute a movable part which is moved upon receiving the acceleration, and are displaced not only in the horizontal direction but only in a vertical direction in which the acceleration occurs, i.e., in a perpendicular direction approximately perpendicular to the substrate surface. At that time, as shown in FIG. 39B, because the nitride film 423 and the oxide film 425 are disposed under the movable part, even if the movable part is displaced in the perpendicular direction, the movable part is electrically insulated from the silicon substrate 426. No current flows from the movable part to the silicon substrate 426. As a result, even when the acceleration occurs in the perpendicular direction, the erroneous detection of the detecting circuit 400 can be prevented.

Next, a process for manufacturing the above-mentioned acceleration sensor will be explained referring to FIGS. 41A–41D and 42A–42C.

Figure 41A:
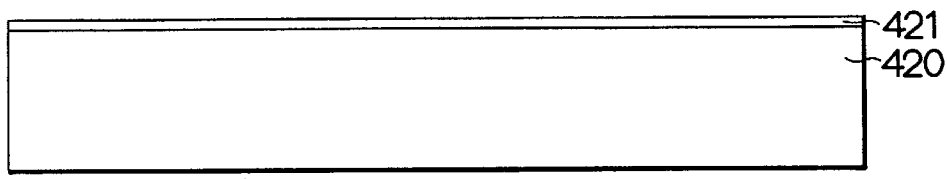
FIGS. 41A to 41D are cross-sectional views showing manufacturing steps of the acceleration sensor shown in FIGS. 39A and 39B.
Figure 41B:
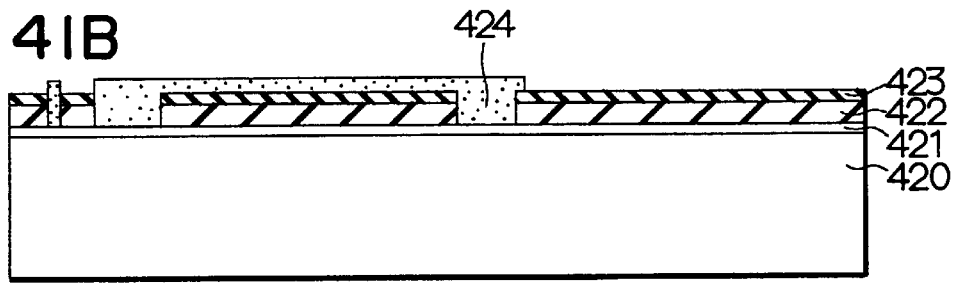
Figure 41C:
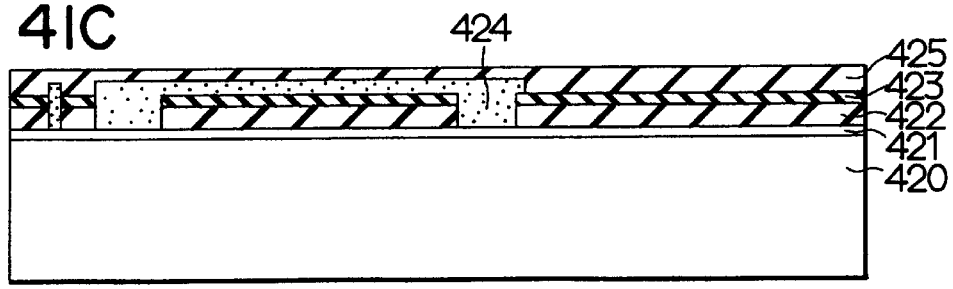
Figure 41D:
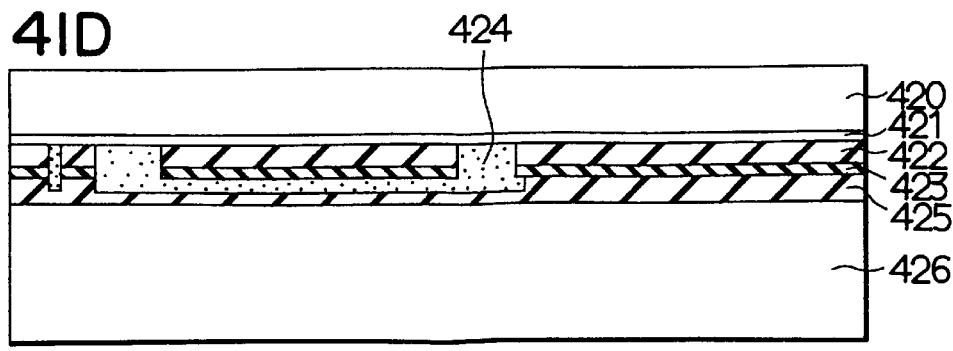

First, in a step shown in FIG. 41A, a single crystal silicon substrate 420 is prepared. The silicon substrate 420 can have crystal orientation of (100), (110), or (111) plane. The N+ diffusion layer 421 is formed in a surface part of the silicon substrate 420 by implanting phosphorus or arsenic thereinto to reduce contact resistance. Next, in a step shown in FIG. 41B, the oxide film 422 and the nitride film 423 are deposited on the silicon substrate 420, and openings are formed in the oxide and nitride films 422, 423. After that, the polysilicon film 424 doped with phosphorus is formed in the openings and on the nitride film 423 with 0.2 $\mu$m to 1.0 $\mu$m thickness, and is pattered. After that, in a step shown in FIG. 41C, the oxide film 425 is deposited on the polysilicon film 424. The surface of the oxide film 425 is flattened by a chemical-mechanical polishing (CMP) treatment. In a step shown in FIG. 41D, the oxide film 425 is bonded to another single crystal silicon substrate 426. Further, the silicon substrate 20 is thinned from the side opposite the silicon substrate 426 by chemical-mechanical polishing or the like.

Figure 42A:
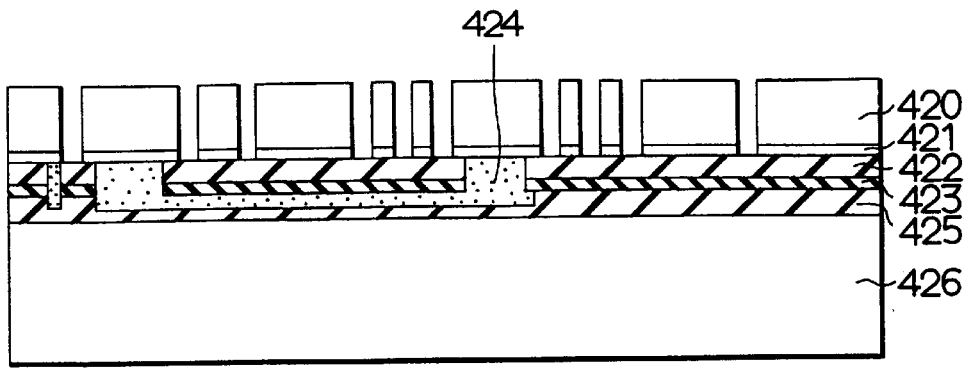
FIGS. 42A to 42c are cross-sectional views showing manufacturing steps following the steps of FIGS. 41A to 41D.
Figure 42B:
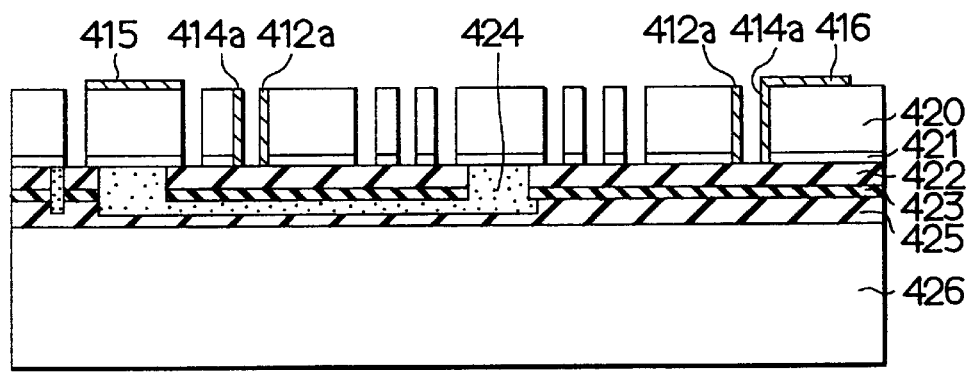
Figure 42C:
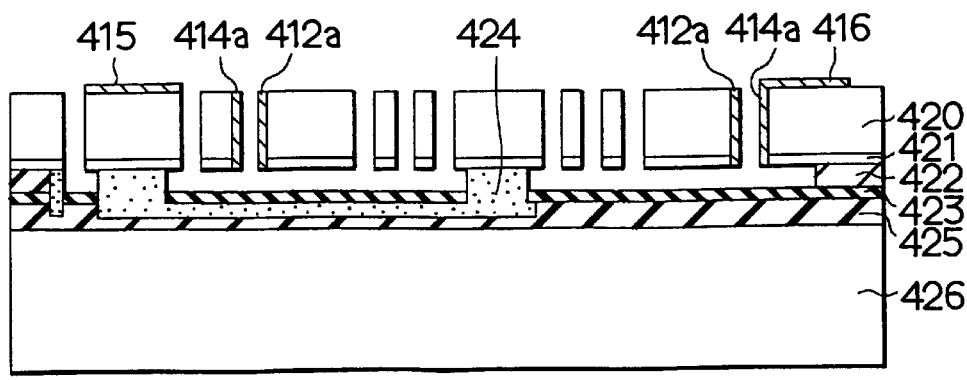

Next, in a step shown in FIG. 42A, trenches are formed in the silicon substrate 420 to have a beam structure pattern by photo-lithography. As a result, the anchor part 411, the movable electrode 412, the beams 413, and the fixed electrode 414 are provided. In a step shown in FIG. 42B, a wiring pattern including the contact electrodes 412a, 414a, the pads 415, 416, and a connection member connecting the contact electrode 414a and the pads 416 are formed by selectively depositing TiW. Further, in a step shown in FIG. 42C, specific portions of the oxide film 422 is removed by sacrifice layer etching using an HF based etching solution, thereby making the movable electrode 412 and the beams 413 movable. Thus, the acceleration sensor shown in FIGS. 39A and 39B is manufactured.

Figure 43:
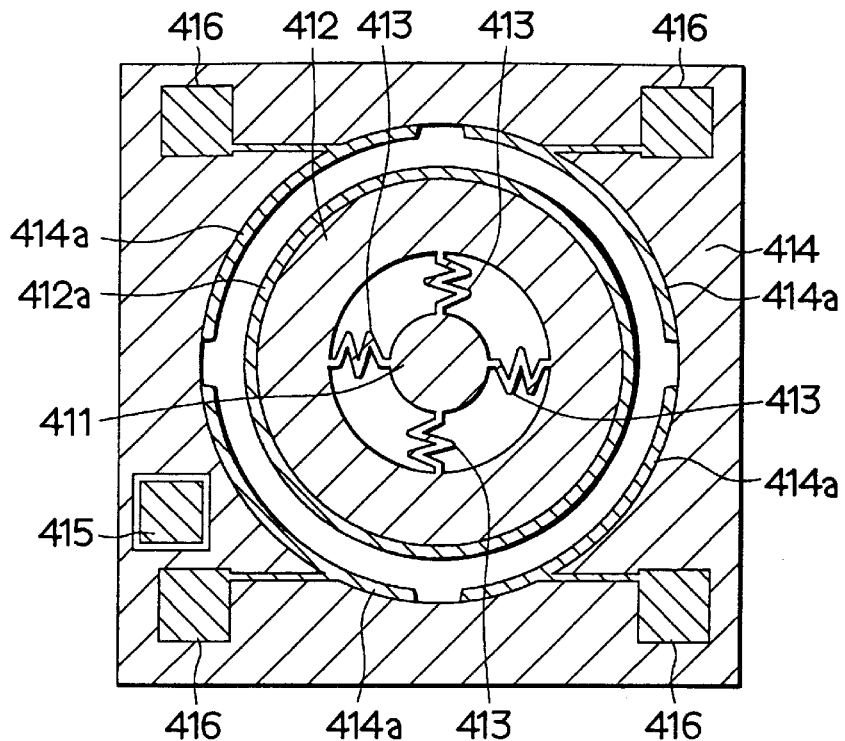
FIGS. 43 to 46 are plan views showing modified examples of the acceleration sensor in the fourth embodiment.
Figure 44:
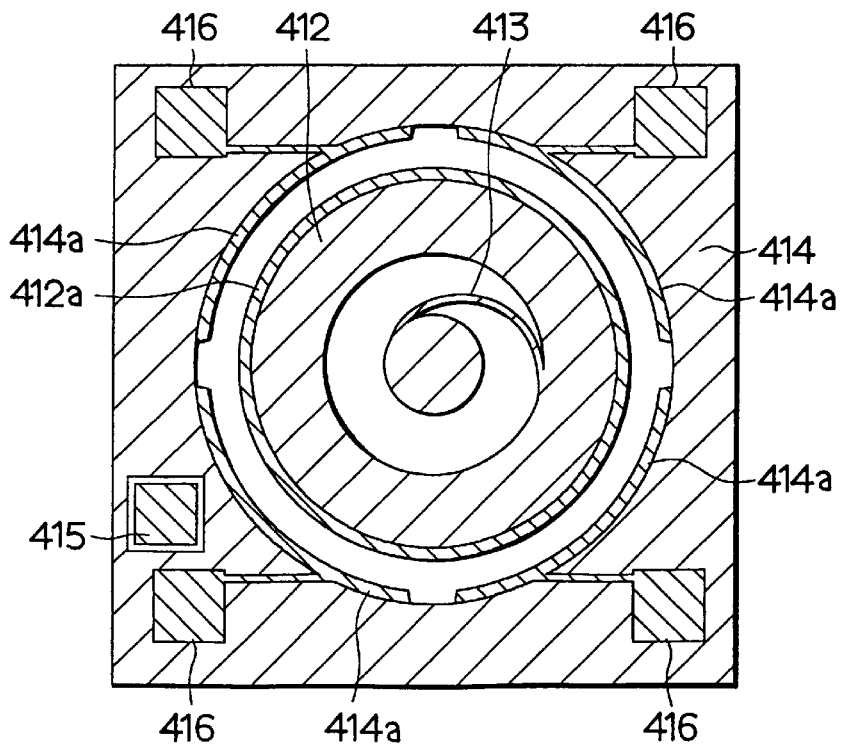
Figure 45:
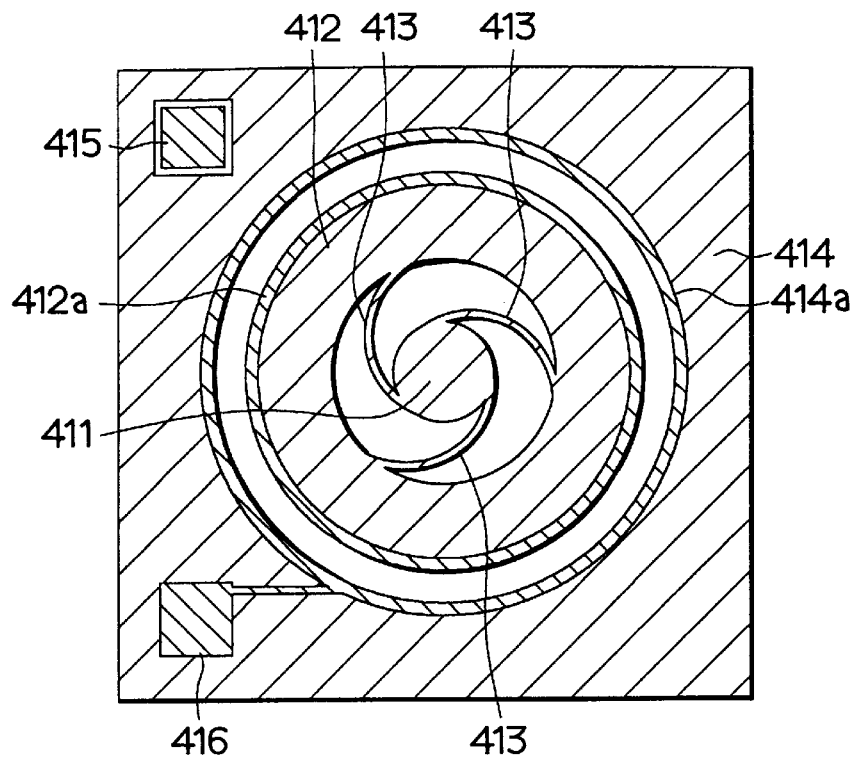

Incidentally, the shape of the beams 431 may be changed provided that a specific spring constant is provided. For example, the beams 431 can be modified as shown in FIGS. 43 and 44. The contact electrode 414a formed on the circumferential side wall of the fixed electrode 414 needs not be divided into several parts as shown in FIG. 39A, and may be composed of an integrated member as shown in FIG. 45. In this case, the contact electrode 414a needs only one pad 416.

Figure 46:
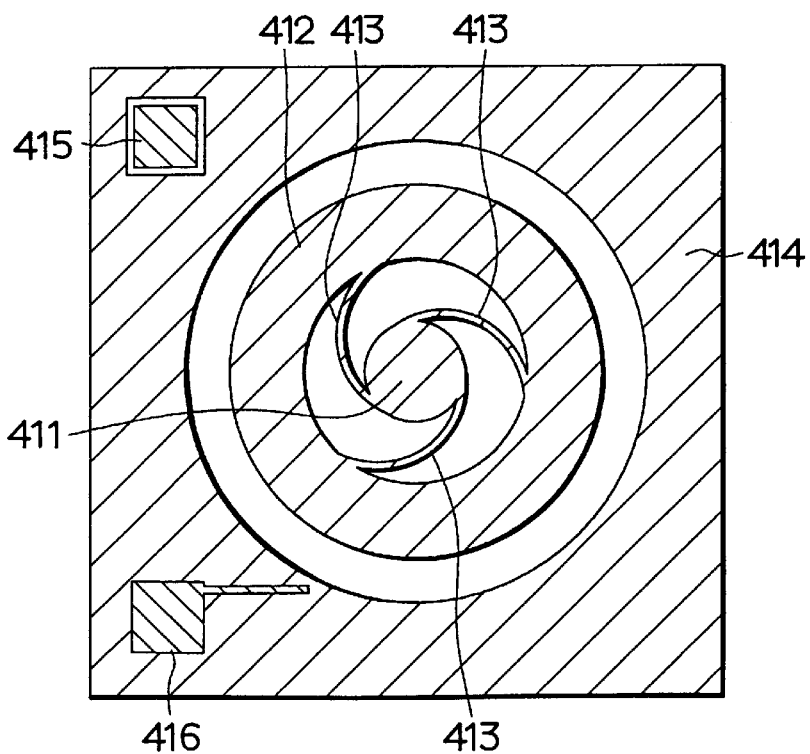
Figure 47A:
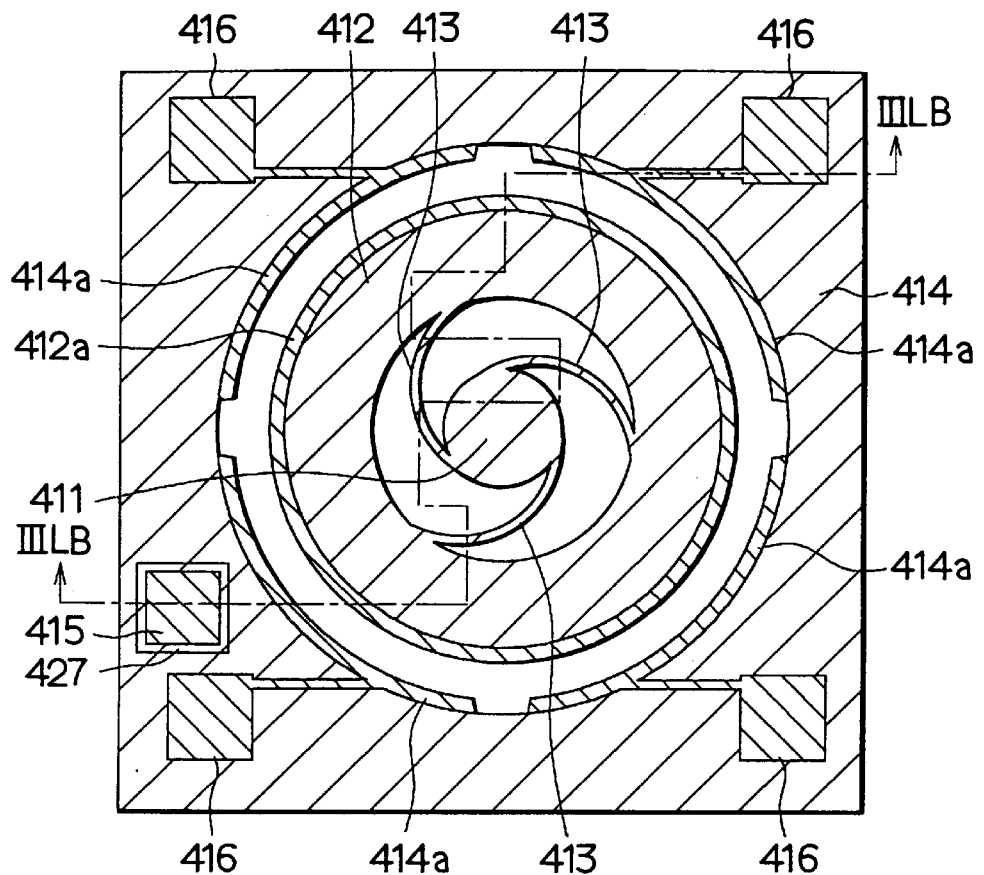
FIG. 47A is a plan view showing another modified example of the acceleration sensor in the fourth embodiment.
Figure 47B:
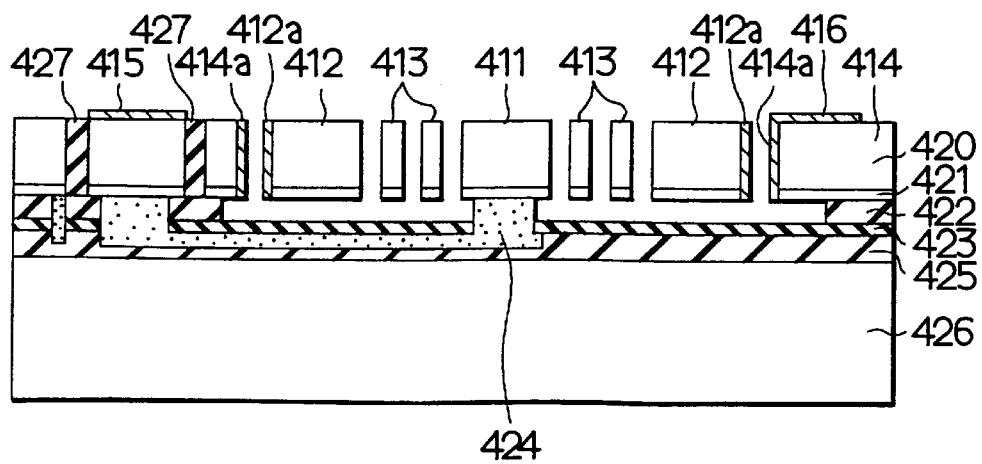
FIG. 47B is a cross-sectional view taken along a IIILB—IIILB in FIG. 47A.
Figure 48A:
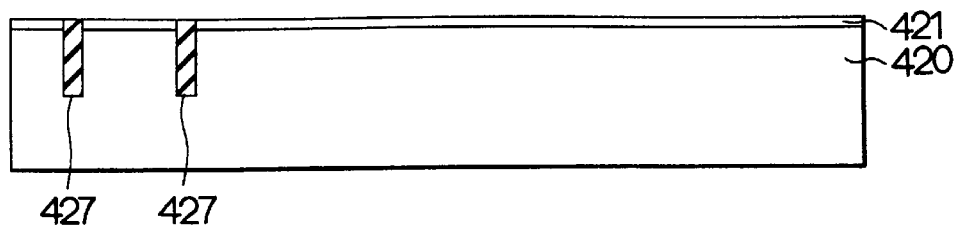
FIGS. 48A to 48D are cross-sectional views showing manufacturing steps of the acceleration sensor shown in FIGS. 47A and 47B.
Figure 48B:
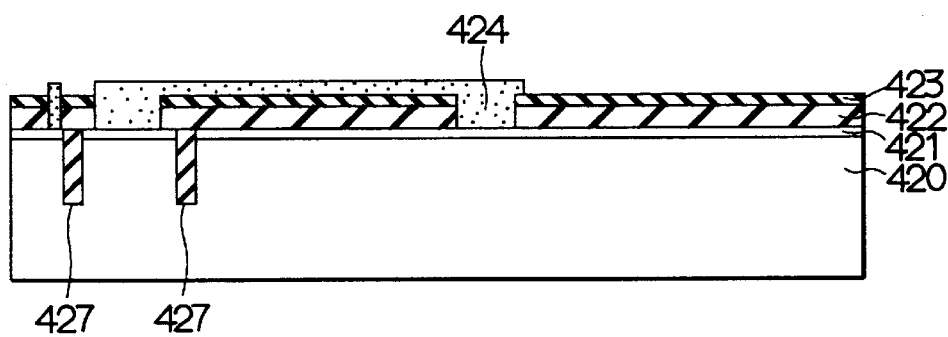
Figure 48C:
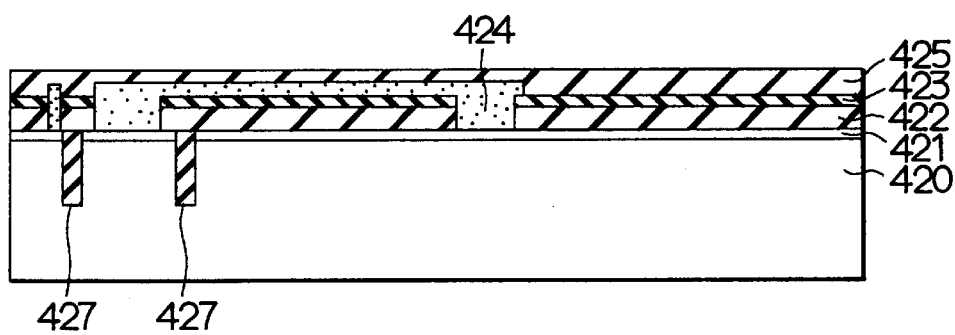
Figure 48D:
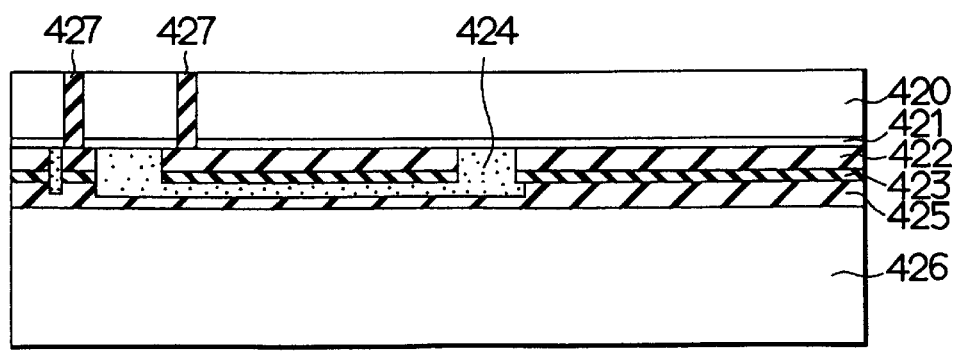

Provided that the movable electrode 412 and the fixed electrode 414 have specific contact resistance at a contact portion between the circumferential side faces thereof, as shown in FIG. 46, the movable electrode 412 and the fixed electrode 414 can dispense with contact electrodes 412a, 414a, respectively. Further, the trench surrounding the pad 415 may be filled with an oxide film 427 as shown in FIGS. 47A and 47b. The oxide film 427 can serve as a stopper when the silicon substrate 420 is polished.

The process of manufacturing the acceleration sensor shown in FIGS. 47A and 47B is explained referring to FIGS. 48A–48D. First, in a step shown in FIG. 48A, the N+ diffusion layer 421 is formed in the surface part of the silicon substrate 420. After that, a trench is formed in the silicon substrate 420, and is filled with the oxide film 427. Next, in a step shown in FIG. 48B, the oxide film 422 and the nitride film 423 are deposited, and openings are formed in the films 422, 423. After that, the polysilicon film 424 is formed in the openings and on the nitride film 423, and is patterned. In a step shown in FIG. 48C, the oxide film 425 is deposited on the polysilicon film 424, and the surface of the oxide film 425 is flattened. Then, in a step shown in FIG. 10D, after the silicon substrate 420 is bonded to the silicon substrate 426, the silicon substrate 420 is thinned by chemical-mechanical polishing or the like from the side opposite to the silicon substrate 426. At that time, the oxide film 427 buried in the trench serves as the stopper for the polishing. The successively performed steps are substantially the same as those shown in FIGS. 42A to 42C.

(Fifth Embodiment)

In the fourth embodiment, the beam structure is formed through a sacrifice layer etching step; however, there is a possibility that the beam structure is attached to the silicon substrate side during the sacrifice layer etching step. Therefore, in a fifth preferred embodiment, the beam structure is formed without performing the sacrifice layer etching step.

Figure 49A:
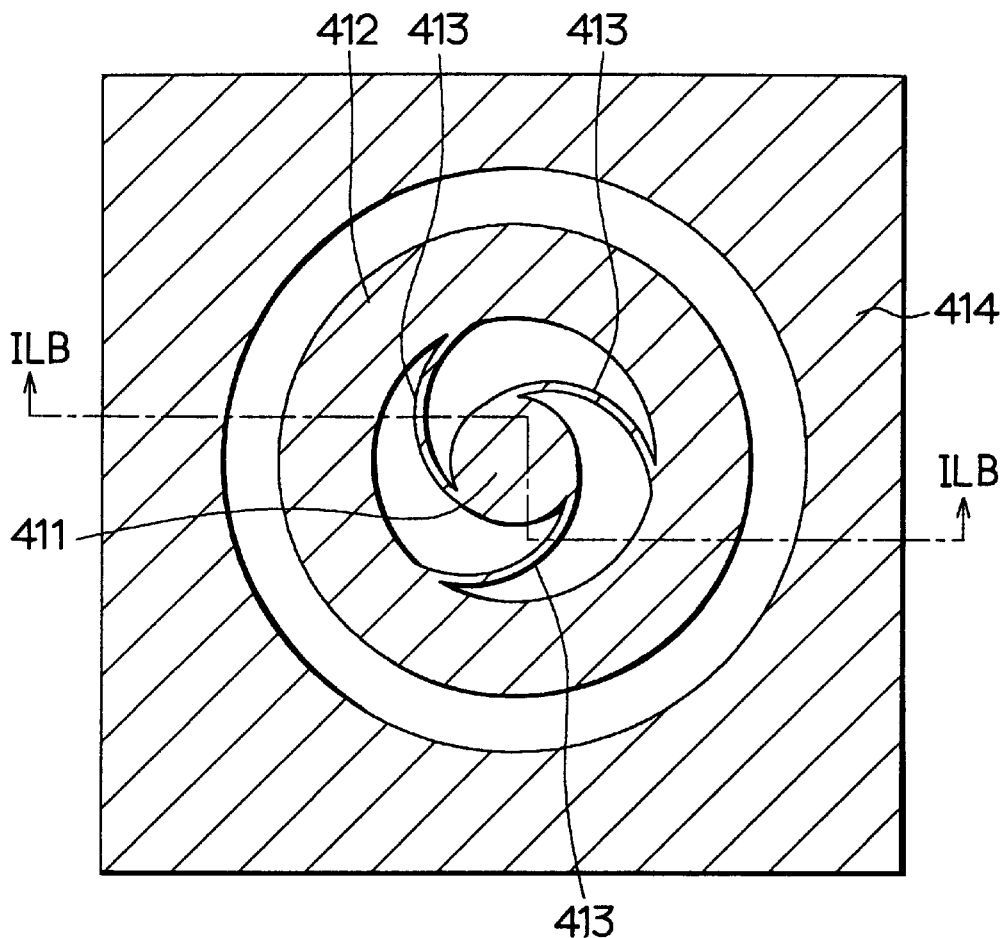
FIG. 49A is a plan view showing an acceleration sensor in a fifth preferred embodiment.
Figure 49B:
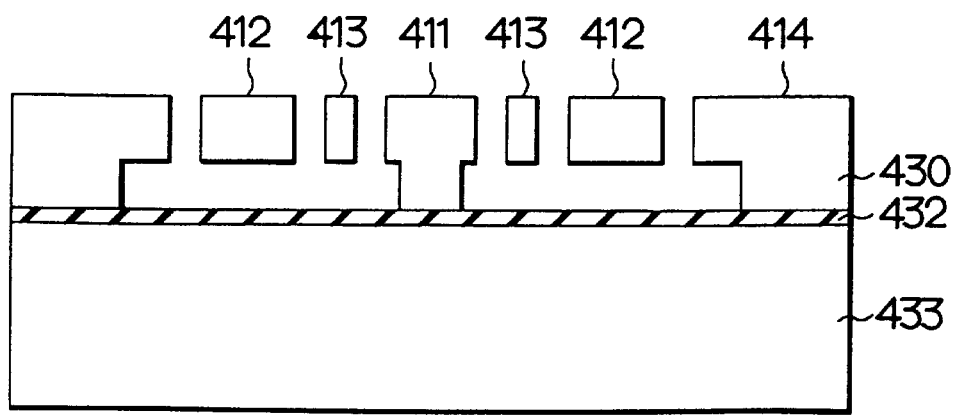
FIG. 49B is a cross-sectional view taken along a ILB—ILB line in FIG. 49A.

FIGS. 49A and 49B show an acceleration sensor in the fifth embodiment, and FIGS. 50A to 50D show the process for manufacturing the acceleration sensor. In the Figures, the same parts as those in the fourth embodiment are indicated by the same reference numerals.

Figure 50A:
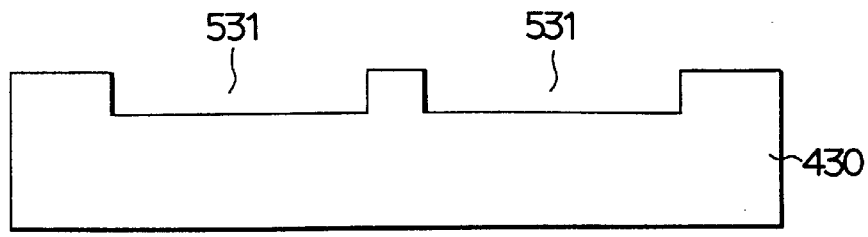
FIGS. 50A to 50D are cross-sectional views showing manufacturing steps of the acceleration sensor shown in FIGS. 49A and 49B.
Figure 50B:
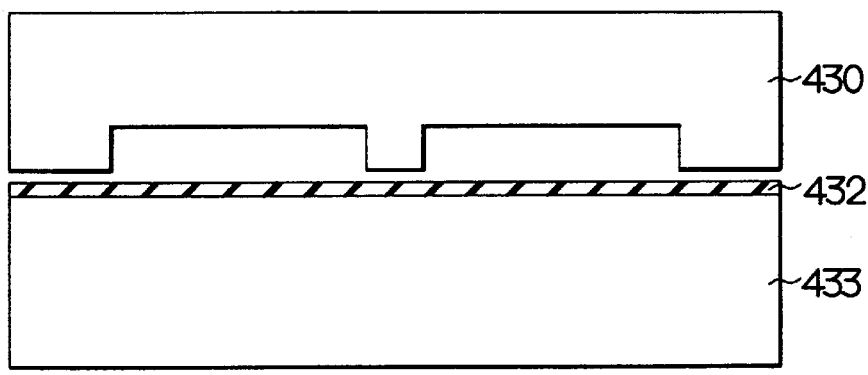
Figure 50C:
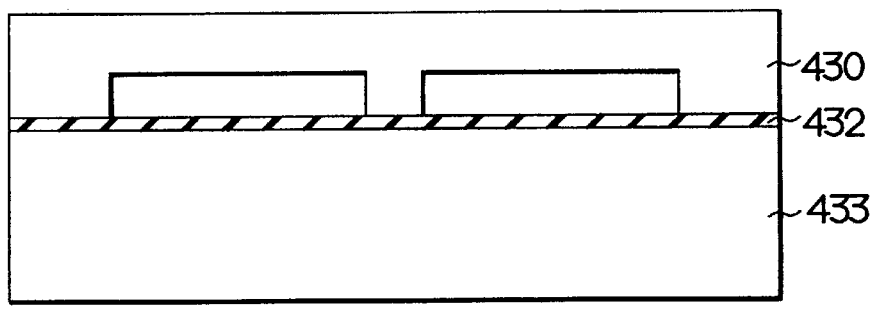
Figure 50D:
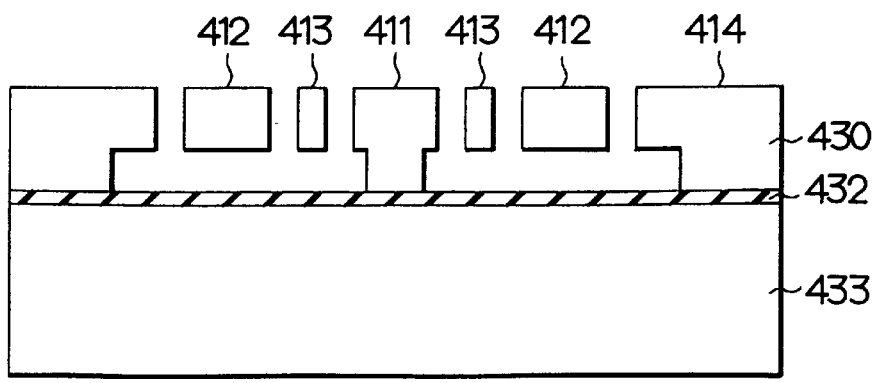

First, in a step shown in FIG. 50A, recesses 531 are formed in a single crystal silicon substrate 430. Next, in a step shown in FIG. 50B, the silicon substrate 430 is bonded to a single crystal silicon substrate 433 on which a thermally oxidized film 432 is formed. In a step shown in FIG. 50C, the silicon substrate 430 is thinned from a side opposite to the silicon substrate 433 by chemical-mechanical polishing or the like. After that, impurities such as phosphorus are diffused into the silicon substrate 430, thereby making the silicon substrate 430 an electrode. Then, in a step shown in FIG. 50D, after forming pads (not shown), several trenches are formed in the silicon substrate 30 where the recesses 531 are formed, thereby forming the anchor part 411, the movable electrode 412, the beams 413, and the fixed electrode 414.

In this embodiment, likewise, a specific potential difference between the movable electrode 412 and the fixed electrode 414 are set by the detecting circuit 400 shown in FIG. 40 through the pads (not shown). Accordingly, when acceleration is produced in the horizontal direction so that the movable electrode 412 contacts the fixed electrodes 414, current flows between the electrodes 412, 414. As a result, the acceleration occurring in the horizontal direction can be detected. In addition, because the oxide film 432 is disposed under the movable part composed of the movable electrode 412 and the beams 413, even when the acceleration occurs in the perpendicular direction, the movable part does not directly contact the silicon substrate 433. Consequently, the detecting circuit 400 does not execute erroneous detection even when the acceleration occurs in the perpendicular direction.

The movable and fixed electrodes 412, 414 can have contact electrodes on the circumferential side walls thereof similarly to the fourth embodiment. Provided that the beams 413 have a specific spring constant, the shape of the beams 413 can be variously changed. Further, in the fourth and fifth embodiments, although the insulation film is formed on the surface of the silicon substrate, it may be formed on the lower surfaces of the movable electrode 412 and the beams 413.

(Sixth Embodiment)

Figure 51A:
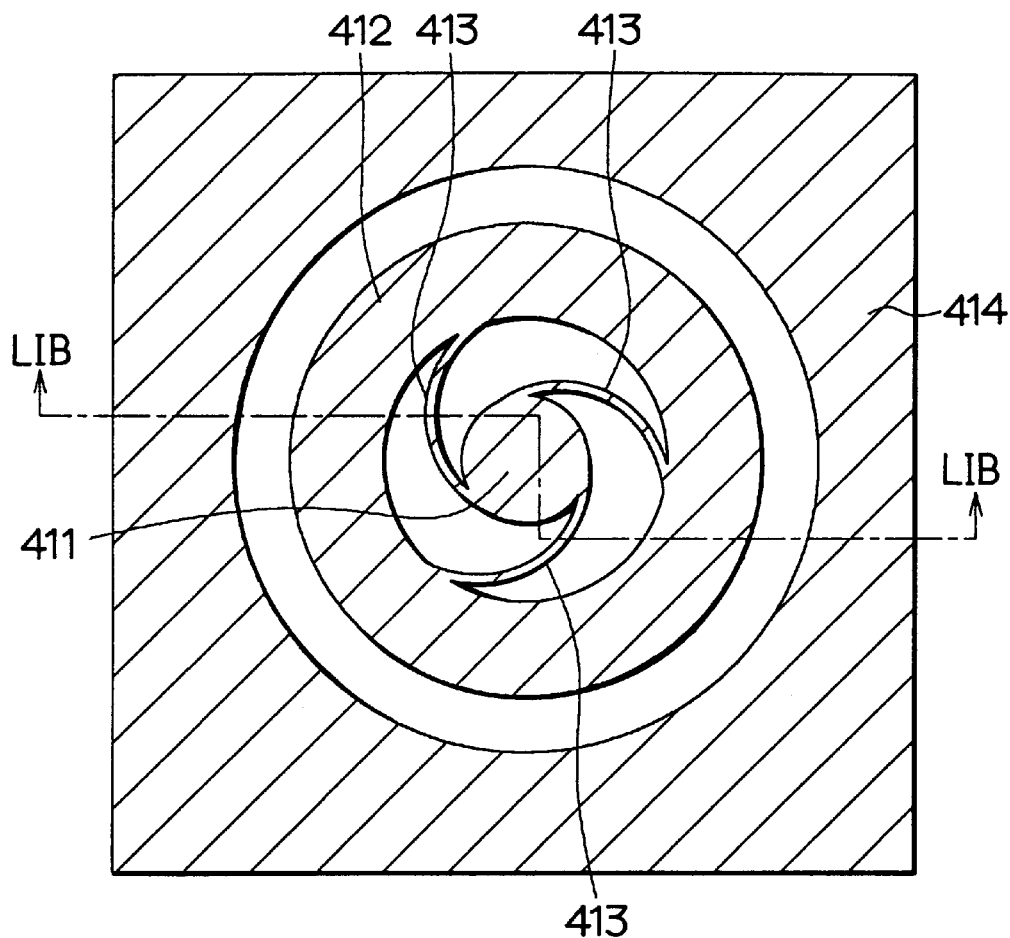
FIG. 51A is a plan view showing an acceleration sensor in a sixth preferred embodiment.
Figure 51B:
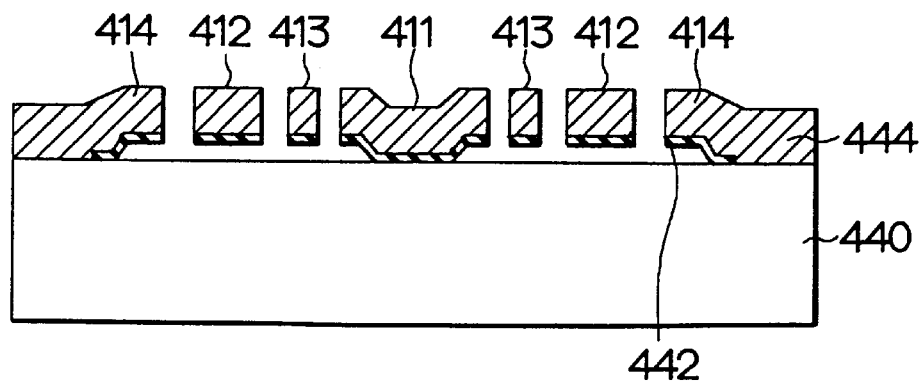
FIG. 51B is a cross-sectional view taken along a LIB—LIB in FIG. 51A.
Figure 52A:
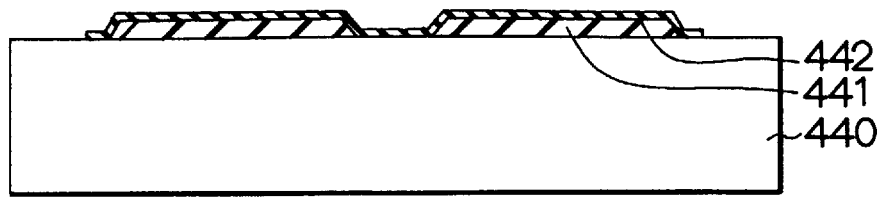
FIGS. 52A to 52D are cross-sectional views showing manufacturing steps of the acceleration sensor shown in FIGS. 51A and 51B.
Figure 52B:
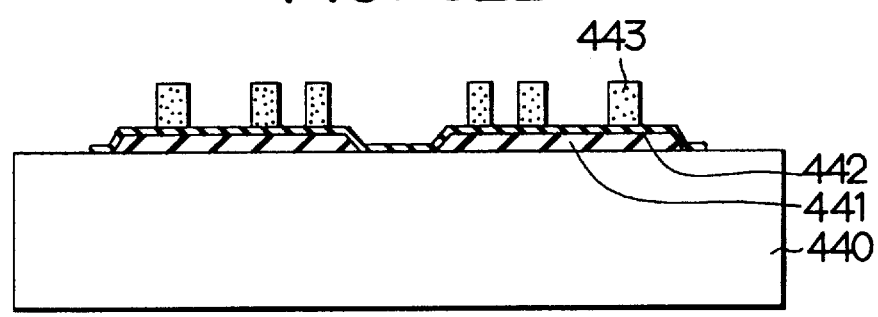
Figure 52C:
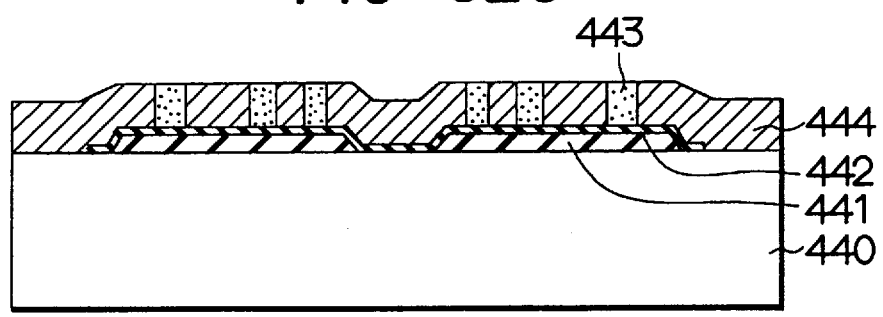
Figure 52D:
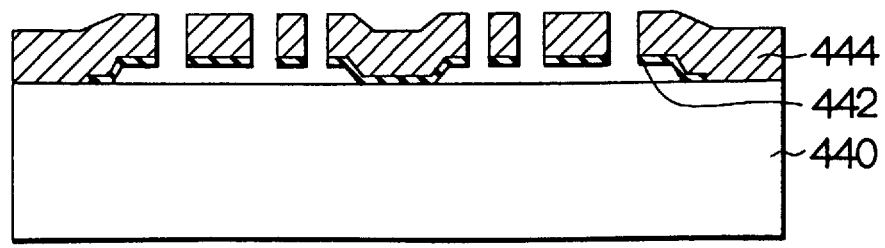

In the fourth and fifth embodiments, the anchor part 411, the movable electrode 412, the beams 413, and the fixed electrode 414 are formed by processing the silicon substrate; however, they may be formed from metallic material. Such an acceleration sensor in a sixth preferred embodiment is shown in FIGS. 51A and 51B. In this embodiment, the anchor part 411, the movable electrode 412, the beams 413, and the fixed electrode 414 are made of a nickel (Ni) film 444, and a nitride film 442 is formed on the lower surface of the Ni film 444.

FIGS. 52A to 52D show a process of manufacturing the above-mentioned acceleration sensor. First, in a step shown in FIG. 52A, an oxide film 441 is deposited on a single crystal silicon substrate 440, and is patterned. Further, the nitride film 442 is deposited on the oxide film 441, and is patterned. After that, in a step shown in FIG. 52B, a resist film is formed from a resist material such as SU-8 resist, and patterning is carried out with a beam structure pattern to provide the resist 443 having a large aspect ratio. Then, in a step shown in FIG. 52C, the Ni film 444 is formed by Ni-plating. After that, in a step shown in FIG. 52D, the resist 443 is removed by $O_2$ ashing. The nitride film 442 is further removed by sacrifice layer etching using HF based etching solution. Thus, the anchor part 411, the movable electrode 412, the beams 413, and the fixed electrode 414 are formed from the Ni film 444.

In this embodiment, likewise, the movable electrode 412 and the fixed electrode 414 are electrically connected to the detecting circuit 400 shown in FIG. 40. Accordingly, the detecting circuit 400 detects the acceleration produced in the horizontal direction. In addition, because the nitride film 442 is disposed on the lower faces of the movable electrode 412 and the beams 413, even when the movable part is displaced in the perpendicular direction, the movable part is electrically insulated from the silicon substrate 440. As a result, the erroneous detection of the detecting circuit 400 does not occur even when the acceleration occurs in the perpendicular direction.

Further, because the movable electrode 412 and the fixed electrode 414 are made of metallic material, contact deficiency is not liable to be caused due to abrasion and the like even after the two electrodes contact one another many times. That is, in the case where the contact electrodes 412a, 414a are provided as in the fourth embodiment, the contact electrodes 412a, 414a are liable to be abraded or separated from the movable and fixed electrodes 412, 414 to cause contact deficiencies when the electrodes 412, 414 contact one another many times. This embodiment can prevent such contact deficiencies. Although the insulation film 442 is formed on the lower surfaces of the movable electrode 412 and the beams 413 in this embodiment, it may be formed on the surface of the silicon substrate 440.

(Seventh Embodiment)

Figure 53A:
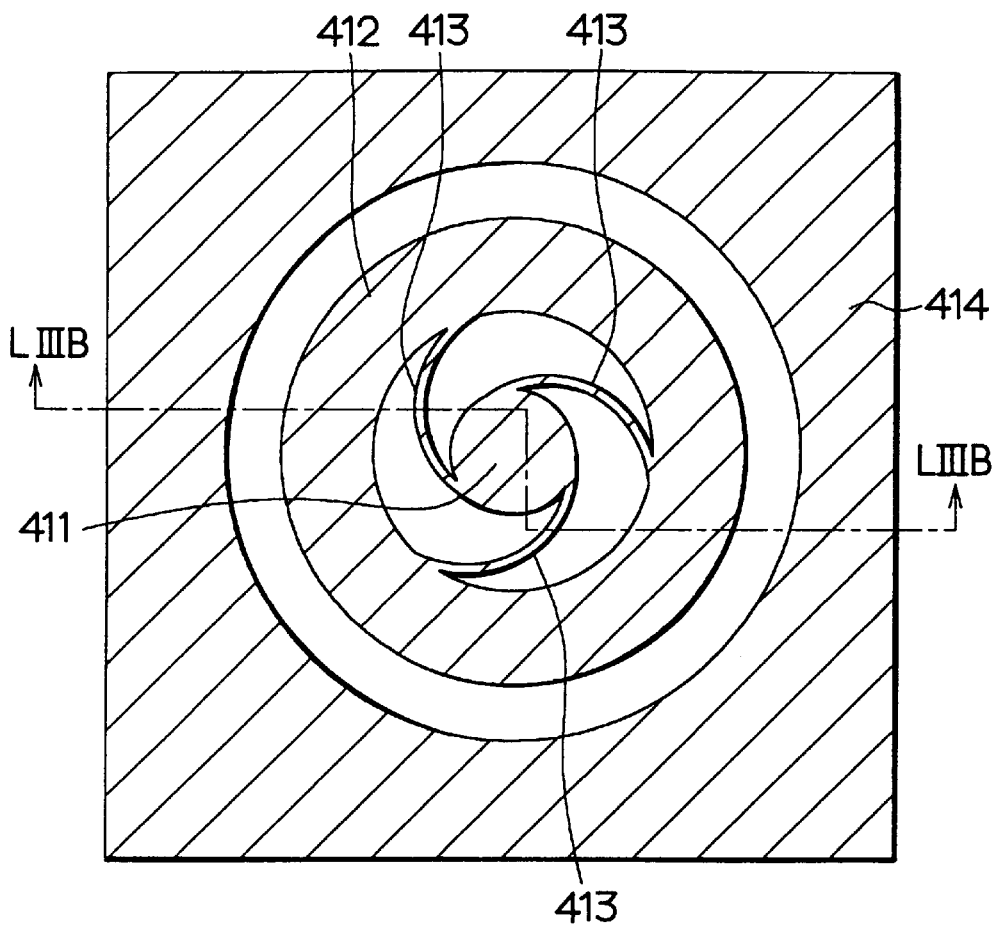
FIG. 53A is a plan view showing an acceleration sensor in a seventh preferred embodiment.
Figure 53B:
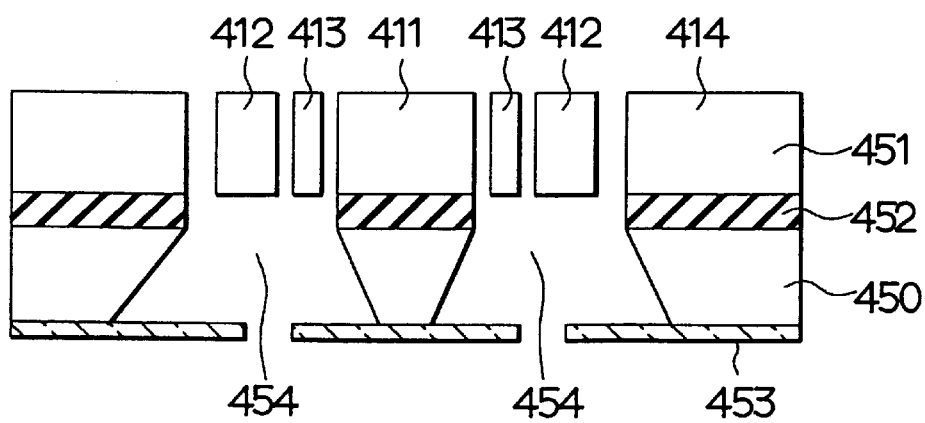
FIG. 53B is a cross-sectional view taken along a LIIIB—LIIIB in FIG. 53A.

In the fourth to sixth embodiments, an insulation film is interposed between the movable part and the silicon substrate to prevent the movable part from directly contacting the silicon substrate, thereby preventing erroneous detection caused by the acceleration occurring in the perpendicular direction. In a seventh preferred embodiment, another method is employed to prevent the erroneous detection described above. That is, referring to FIGS. 53A and 53B, in the seventh embodiment, a silicon substrate 450 on which the movable part is provided has cavities 454 underlying the movable electrode 412 and the beams 413. Accordingly, the movable part is prevented from contacting the silicon substrate 450 when it is displaced in the perpendicular direction.

Figure 54A:
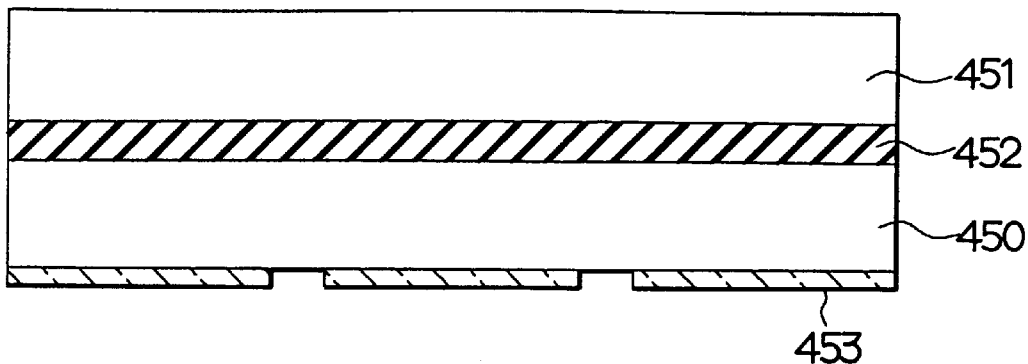
FIGS. 54A to 54c are cross-sectional views showing manufacturing steps of the acceleration sensor shown in FIGS. 53A and 53B.
Figure 54B:
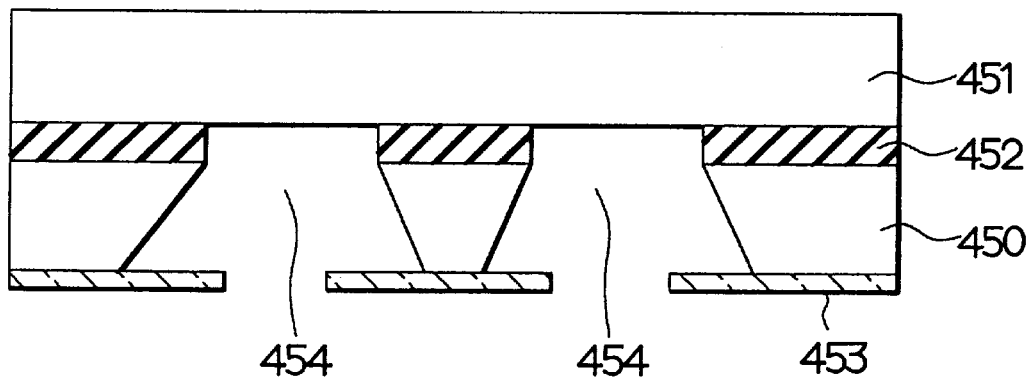
Figure 54C:
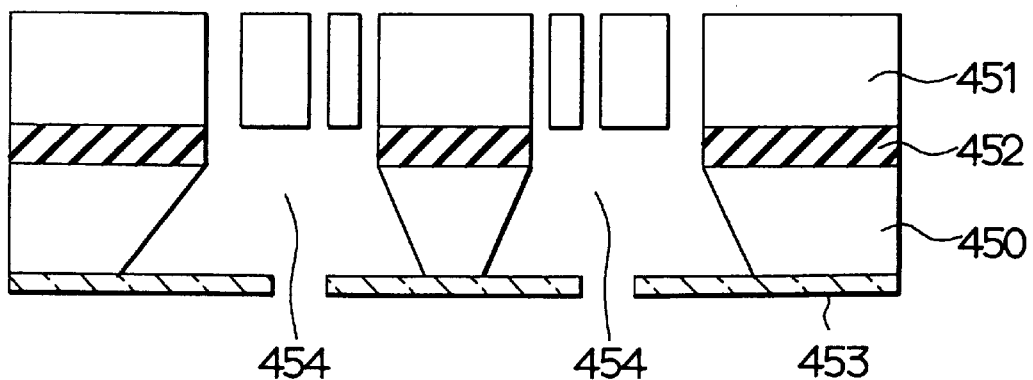

FIGS. 54A to 54C show a process of manufacturing the acceleration sensor in the seventh embodiment. First, in a step shown in FIG. 54A, an SOI substrate composed of silicon substrates 450, 451, and an oxide film 452 interposed between the substrates 450, 451 is prepared. Then, a glass plate 453 having openings at specific portions is bonded to the back face of the silicon substrate 450 by anode-coupling. Next, in a step shown in FIG. 54B, etching is carried out using KOH solution from the back face of the silicon substrate 450 so as to remove portions of the silicon substrate 450 and the oxide film 452 corresponding to the movable part. Then, in a step shown in FIG. 54C, trenches are formed in the silicon substrate 451 to provide the anchor part 411, the movable electrode 412, the beams 413, and the fixed electrode 414.

According to the method described above, the beam structure can be provided without performing the sacrifice layer etching as in the fifth embodiment. In this embodiment, although the cavities 454 are formed to pass through the silicon substrate 450, the cavities 454 always need not pass through the silicon substrate 450.

(Eighth Embodiment)

An acceleration sensor in an eighth preferred embodiment has the same structure and the same circuitry constitution as those of the acceleration sensor in the first embodiment shown in FIGS. 23 to 25.

As explained in the first embodiment referring to FIG. 28, the displacement amount of the movable electrode 12 contacting one of the protrusions 135a–138a of the fixed electrodes 135–138 is set so that the electrostatic attracting force $F_e$ produced between the movable electrode 12 and the sensitivity controlling fixed electrodes 131–134 does not exceed the spring restoring force $F_k$ of the beams 14–17, by controlling the lengths of the protrusions 135a–138a and the electrostatic attracting force $F_e$. Accordingly, in the first embodiment, as soon as the magnitude of the acceleration decreases to be less than a specific magnitude capable of causing the contact between the movable electrode 12 and one of the protrusions 135a–138a, the movable electrode 12 is detached from the one of the protrusions 135a–138a, thereby preventing unnecessary attachment of the movable electrode 12 to the fixed electrodes 135–138.

To the contrary, in the eighth embodiment, the movable electrode 12 is controlled to contact one of the protrusions 135a–138a when the electrostatic attracting force $F_e$ becomes equal to or more than the spring restoring force $F_k$. That is, referring to FIG. 28, when the movable electrode 12 is displaced by $D_b$ or more, the movable electrode 12 contacts one of the protrusions 135a–138a. Accordingly, even when the magnitude of the acceleration applied to the sensor becomes zero, the movable electrode 12 is kept in contact with the one of the protrusions 135a–138a. This means that once the acceleration having the specific magnitude or more is applied to the acceleration sensor, the sensor can memorize that the acceleration is applied thereto even after the acceleration disappears.

The thus constructed acceleration sensor in the eighth embodiment can be adopted for precision machines such as a personal computer. When the machines are broken by impact and the like, the acceleration sensor can indicate whether acceleration was produced by the impact and the like or not. In this case, the memorized state of the acceleration sensor can be canceled by stopping the supply of voltage $V_R$ across the movable electrode 12 and the sensitivity controlling fixed electrodes 131–134. Voltage $V_R$ is supplied by a power supply.

Incidentally, the acceleration sensor is constructed as an acceleration switch that is turned on when acceleration more than a specific magnitude is applied thereto; however, the detection level (herebelow, referred to as switch-ON level) capable of detecting the acceleration is affected by quality of the manufactured sensor shape. For example, when the beams 14–17 made of spiral springs has variations in spring constant due to variations in spring width thereof, the variations cause a change in the switch-ON level.

Figure 55:
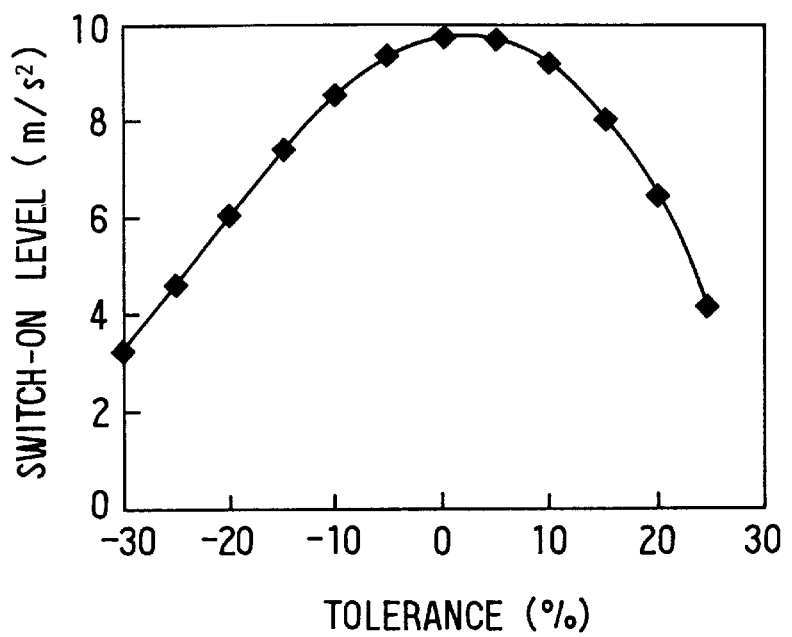
FIG. 55 is a graph showing a relationship between switch-ON levels and tolerances of a sensor shape in an eighth preferred embodiment.
Figure 56:
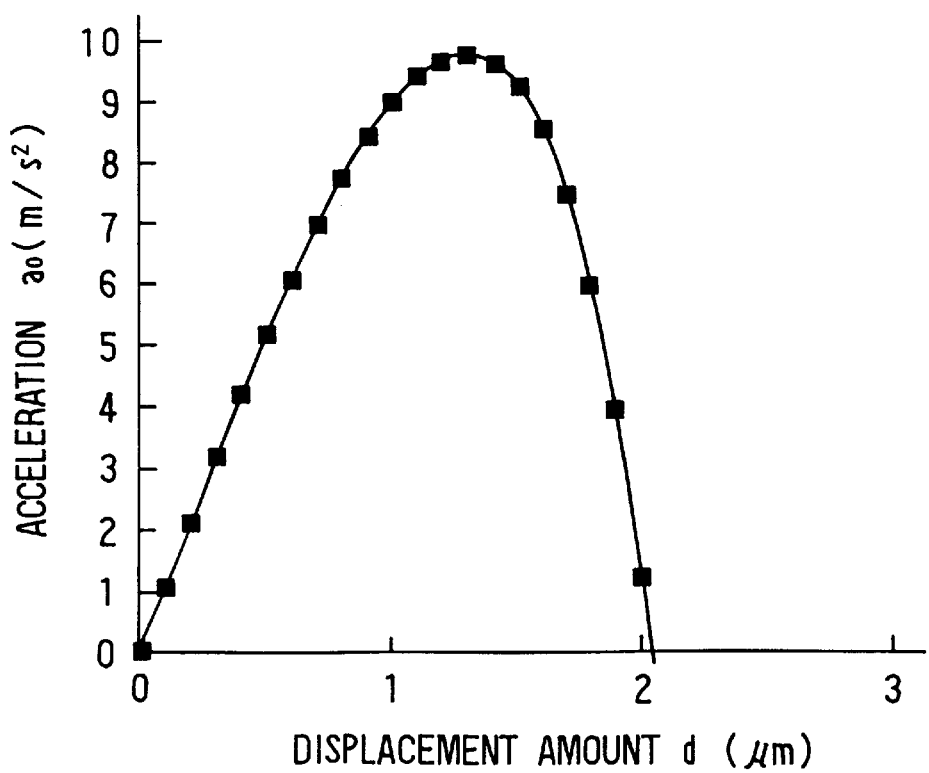
FIG. 56 is a graph showing a relationship between accelerations $a_0$ and displacement amounts d.

FIG. 55 shows switch-ON levels with respect to such a shape tolerance as an example. The result shown in the figure is obtained from the acceleration switch that is set so that it is turned on when acceleration of 9.8 m/s$^2$ is applied thereto in the state where voltage $V_R$ of 2.5 V is applied across the movable electrode 12 and the sensitivity controlling fixed electrodes 131–134. In the acceleration switch, an inner diameter of the sensitivity controlling fixed electrodes 131–134 having a central point the same as that of the anchor part 11 is 187.5 $\mu$m. The acceleration switch is constructed so that the movable electrode 12 displaced by 2.5 $\mu$m contacts one of the protrusions 135a–138a. In this case, when a vertical axis indicates acceleration $a_0$ which is calculated from a formula of $(F_k-F_e)/m_0$ in which $m_0$ is a mass of the movable electrode 12, and a horizontal axis indicates displacement amount d of the movable electrode 12, acceleration $a_0$, i.e., $(F_k-F_e)/m_0$, has characteristics shown in FIG. 56. The above-described switch-ON level can be determined from the peak of $(F_k-F_e)/m_0$ in FIG. 56.

Then, the acceleration switch (herebelow referred to as sample) is adjusted with respect to the manufacturing variations described above. First, an acceleration applying test is carried out by applying voltage $V_R$ of 2.5 V to the sample. When the sample is turned on at 8.5 m/s$^2$, it is known from FIG. 55 that the quality, i.e, the tolerance of the sample is −10% or +12%.

Figure 57:
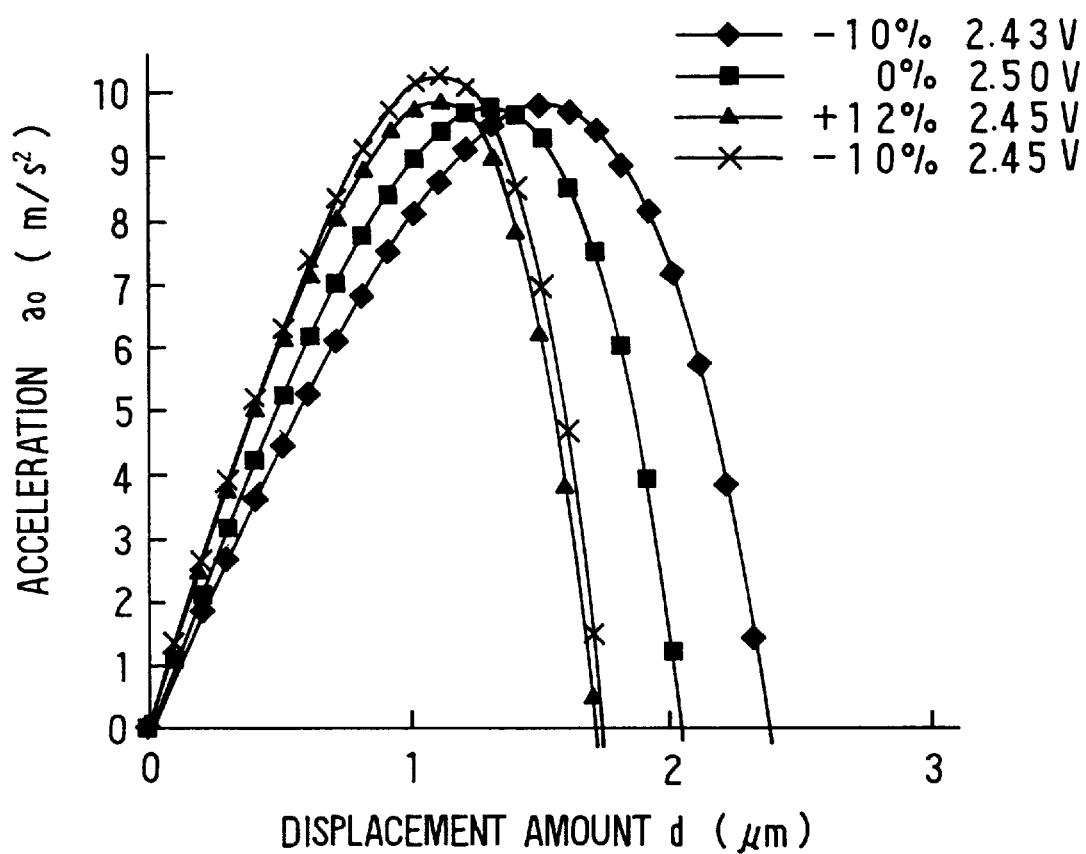
FIG. 57 is a graph showing relationships between the accelerations ao and the displacement amounts d when an applied voltage is varied in states where tolerances are −10%, 0%, and +12%, respectively.

Here, voltages capable of adjusting the switch ON level to 9.8 m/s$^2$ with respect to various tolerances are calculated in advance. For example, when the tolerance is −10% and the applied voltage is 2.43 V, or when the tolerance is +12% and the applied voltage is 2.45 V, as shown in FIG. 57, the switch-ON level is controlled to be 9.8 m/s$^2$. Therefore, next, the applied voltage is set to be 2.43 V or 2.45 V. For example, if the switch-ON level becomes 9.8 m/s$^2$ when the applied voltage is 2.43 V, it is known that the tolerance is −10% and it is sufficient that the applied voltage is 2.43 V. However, when the witch-ON level becomes 10.3 m/s$^2$ in the same state, the tolerance is presumed to be +12%, and then the applied voltage is set to be 2.45 V.

In this way, the switch-ON level is desirably adjusted by adjusting the applied voltage, i.e., voltage $V_R$. The adjustment of voltage $V_R$ can be carried out by means of resistance division of the power supply, an EPROM, a regulator, or the like. In this embodiment, the acceleration sensor includes the four fixed electrodes 135–138 for detecting the acceleration; however, the number of the fixed electrodes may be changed, provided that the movable electrode 12 does not contact any one of the sensitivity controlling fixed electrodes 131–134 when the movable electrode 12 contacts one of the fixed electrodes 135–138. Similarly, the shapes of the movable electrode 12, the sensitivity controlling fixed electrodes 131–134, the fixed electrodes 135–138 may be changed, provided that the movable electrode 12 does not contact any one of the sensitivity controlling fixed electrodes 131–134 when the movable electrode 12 contacts one of the fixed electrodes 135–138.

Also, in this embodiment, the present invention is applied to the acceleration sensor which detects the acceleration applied in every direction parallel to a two dimensional plane; however, it may be applied to an acceleration sensor which detects the acceleration applied in one direction. The constitution of such an acceleration sensor is shown in FIGS. 58A and 58B.

Figure 58A:
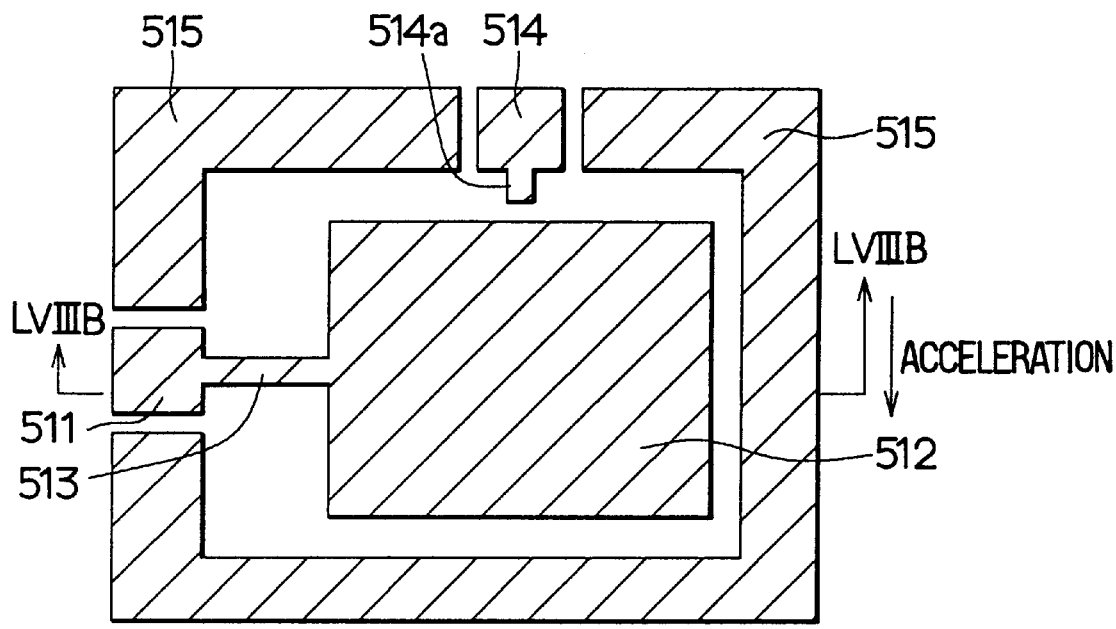
FIG. 58A is a plan view showing a modified acceleration sensor in the eighth embodiment.
Figure 58B:
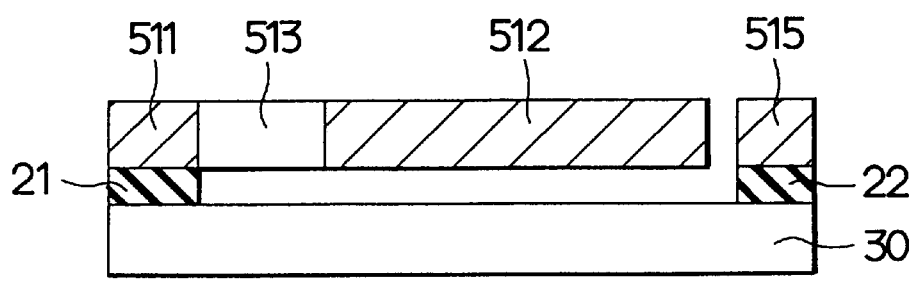
FIG. 58B is a cross-sectional view taken along a LVIIIB—LVIIIB in FIG. 58A.

In FIG. 58A, an anchor part, a movable electrode, and a beam are indicated by 511, 512, and 513, respectively. A fixed electrode for detecting acceleration is indicated by 514, while sensitivity controlling fixed electrodes are indicated by 515. In FIG. 58B, the same parts as those in FIG. 24 are indicated by the same reference numerals. When acceleration is produced in a direction parallel to an arrow in FIG. 58A, the movable electrode 512 is displaced to contact a protrusion 514a of the fixed electrode 514. As a result, the acceleration is detected. At that time, the movable electrode 512 is kept in contact with the fixed electrode 514 by electrostatic attracting force produced between the sensitivity controlling fixed electrodes 515 and the movable electrode 512, even after the acceleration disappears.

Figure 59A:
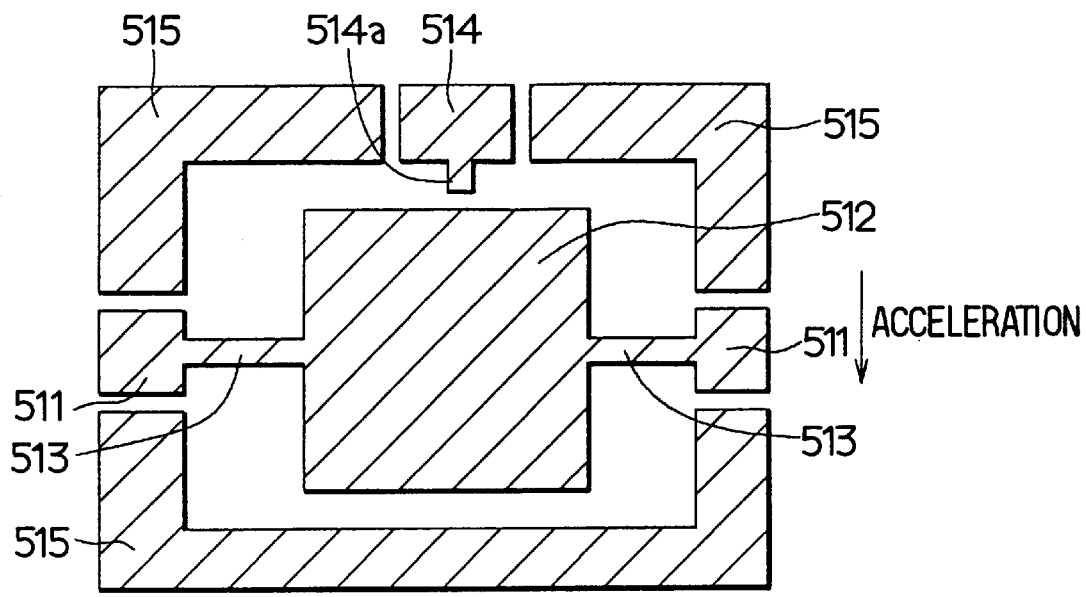
FIGS. 59A and 59B are other modified acceleration sensors in the eighth embodiment.
Figure 59B:
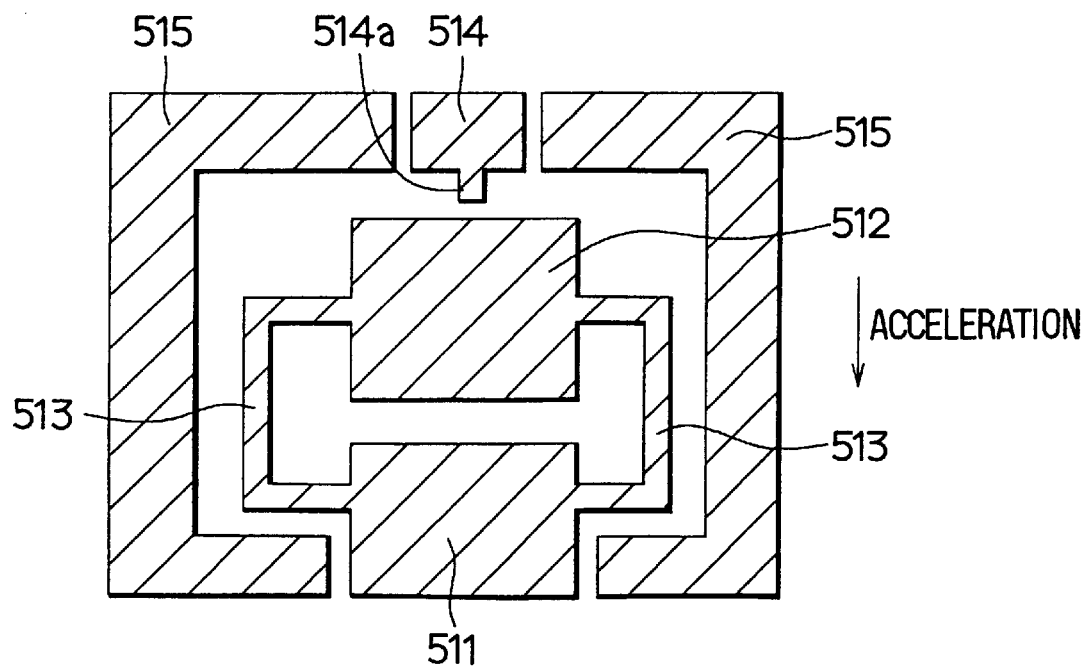

Other types of the acceleration sensor for detecting the acceleration in one direction are shown in FIGS. 59A and 59B, in which the same parts as in FIG. 58A are indicated by the same reference numerals. In FIG. 59A, the movable electrode 512 is supported by two anchor parts 511 through beams 513 on both sides thereof. In FIG. 59b, the movable electrode 512 is supported by the anchor part 511 through two U-shaped beams 513. Further, in the eighth embodiment, although a silicon substrate is used as the substrate 30, other substrates such as a glass substrate may be used as the substrate 30.

(Ninth Embodiment)

Figure 60:
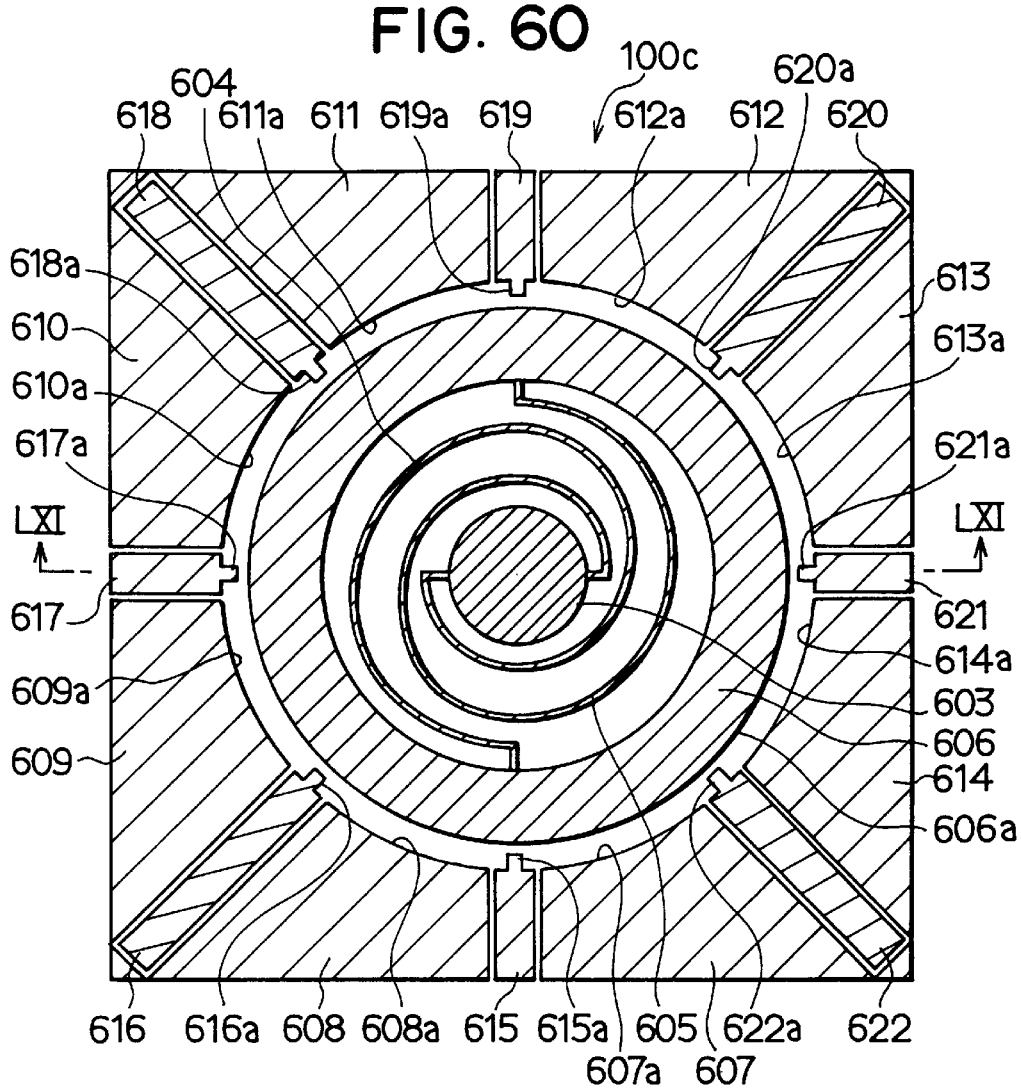
FIG. 60 is a plan view showing an acceleration sensor in a ninth embodiment.
Figure 61:
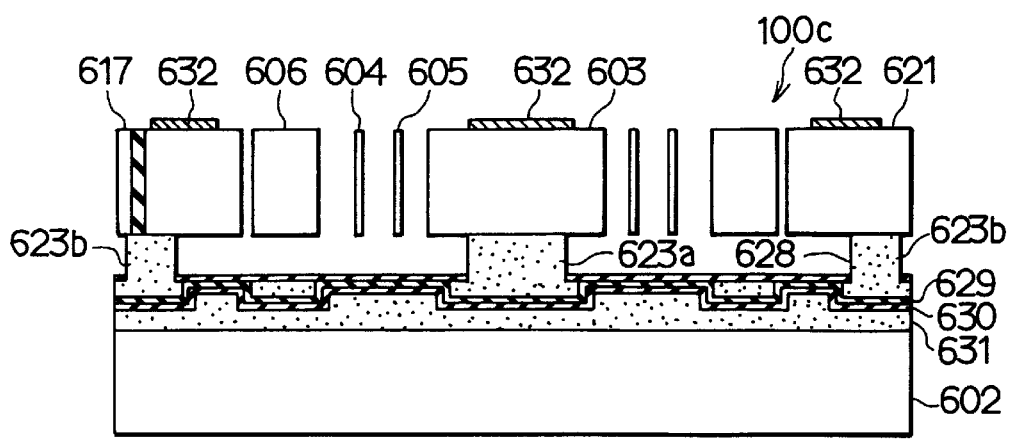
FIG. 61 is a cross-sectional view taken along a LXI—LXI line in FIG. 60.

In the first embodiment, the sensitivity for detecting acceleration is controlled by the sensitivity controlling electrodes. In addition to that, in a ninth preferred embodiment, an operation check for detecting the acceleration is performed. First, a constitution of an acceleration sensor 100c in the ninth embodiment will be explained referring to FIGS. 60 and 61.

The acceleration sensor 100c is a switch type sensor and is composed of a support substrate 602 made of single crystal silicon, an anchor part 603, two beams 604, 605 having the same shape as each other, a weighting movable electrode 606, eight sensitivity controlling fixed electrodes 607–614, and eight detecting fixed electrodes 615–622.

The columnar anchor part 603 is fixed to the central portion of the support substrate 602 through a support anchor 623a. The beams 604, 605 have a spiral shape, respectively, and plane shape parts overlapping with one another. Respective ends of the beams 604, 605 are integrally connected to an outer circumference wall of the anchor part 603 at points symmetrical relative to one another. Accordingly, the beams 604, 605 are suspended by the anchor part 603 to extend in a direction approximately parallel to the support substrate surface. In each vertical cross-section of the beams 604, 605, a ratio of a longitudinal dimension relative to a lateral dimension is so large that the bemas 604, 605 can be elastically deformed in the direction approximately parallel to the support substrate surface.

The movable electrode 606 has a ring-shape (short cylindrical shape) with an inner circumference wall to which the other respective ends of the beams 604, 605 are integrally connected. Accordingly, the movable electrode 606 is held to be parallel to the support substrate surface with a specific gap and to be flexibly displaced in a direction parallel to a two dimensional plane, i.e., parallel to the support substrate surface upon receiving acceleration. The movable electrode 606 further has a detection face 606a on the outer circumference wall thereof, i.e., on the columnar side wall which is approximately perpendicular to the support substrate surface.

The sensitivity controlling fixed electrodes 607–614 are fixed to the support substrate 602 through anchors which are not shown. The sensitivity controlling fixed electrodes 607–614 as a whole are shaped to have columnar hollow portion corresponding to the movable electrode 606 and rectangular hollow portions corresponding to the detecting fixed electrodes 615–622, and are arranged to surround the movable electrode 606 at equal intervals. The sensitivity controlling fixed electrodes 607–614 have electrode faces 607a–614a, respectively, which face the detection face 606a of the movable electrode 606 with the same facing area as one another.

The detecting fixed electrodes 615–622 are fixed to the support substrate 602 through support anchors 623b and the like, and are disposed in the rectangular hollow portions, respectively, formed between the adjacent two of the sensitivity controlling fixed electrodes 607–614. Accordingly, the detecting fixed electrodes 615–622 are radially disposed around the movable electrode 606 at equal intervals. In this case, the detecting fixed electrodes 615–622 and the sensitivity controlling fixed electrodes 607–614 are electrically isolated from one another by gaps or insulating films interposed therebetween. Further, the detecting fixed electrodes 615–622 are integrally formed with protrusions 615a–622a protruding toward the detection face 606a for contact, respectively, at portions facing the detection face 606a.

In a state where no acceleration is applied to the movable electrode 606, the distance between each of the protrusions 615a–622a and the detection face 606a and the distance between each of the electrode faces 607a–614a and the detection face 606a are kept at constant states. Further, at least surface portions of the anchor part 603, the beams 604, 605, the movable electrode 606, and the fixed electrodes 607–622 are made to have low resistivity by, for example, being doped with impurities such as phosphorus or by forming conductive films thereon. The conductive films can be formed by evaporation, plating, or the like.

Figure 62:
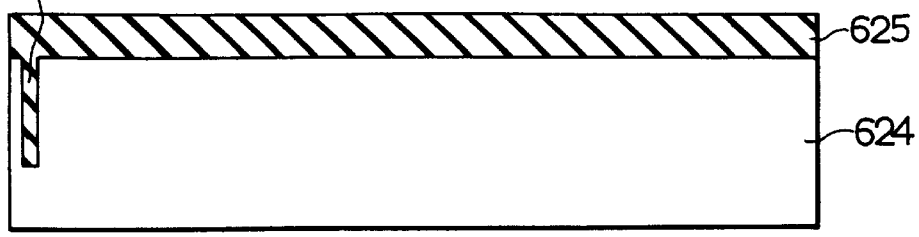
FIGS. 62–68 are cross-sectional views showing a process for manufacturing the acceleration sensor in the ninth embodiment.

Next, a process of manufacturing the acceleration sensor 100c will be explained referring to FIGS. 61–68. First, as shown in FIG. 62, a groove 624 for alignment is formed in a single crystal silicon substrate 624 by trench-etching. Then, a silicon oxide film 625 as a sacrifice layer is formed entirely on the silicon substrate 624 including in the groove 624a by a CVD method or the like.

Figure 63:
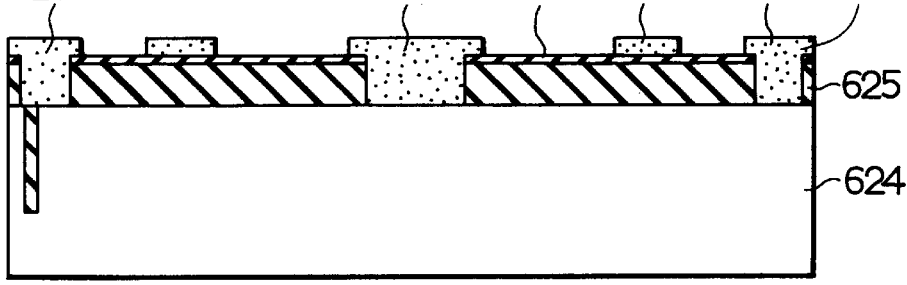

Next, to provide the sate shown in FIG. 63, first, a silicon nitride film 626, which serves as an etching stopper when the sacrifice layer is etched, is deposited on the silicon oxide film 625. Then, dry etching is carried out to the silicon oxide and silicon nitride films 625, 626 through photo-lithography, thereby forming opening portions for forming therein the support anchors 623a, 623b for the anchor part 603 and the fixed electrodes 615–622, and the support anchors for the sensitivity controlling fixed electrodes 607–614. After that, a polysilicon thin film 627 is deposited on the silicon nitride film 626 to fill the opening portions. The polysilicon thin film 627 is formed to have conductivity by being doped with impurities such as phosphorus, during or after the deposition thereof. Further, the polysilicon film 627 is patterned by a photo-lithography technique. As a result, a base pattern of the support anchors 623a, 623b and the support anchors for the sensitivity controlling fixed electrodes 607–614, an annular lower electrode 628, which is finally brought to face the movable electrode 606, and a wiring pattern connecting the base pattern of the support anchors 623a and the lower electrode 628 are provided. Accordingly, the movable electrode 606 and the lower electrode 628 can be electrically connected to one another to have electrical potentials equal to one another.

Figure 64:
Figure 65:
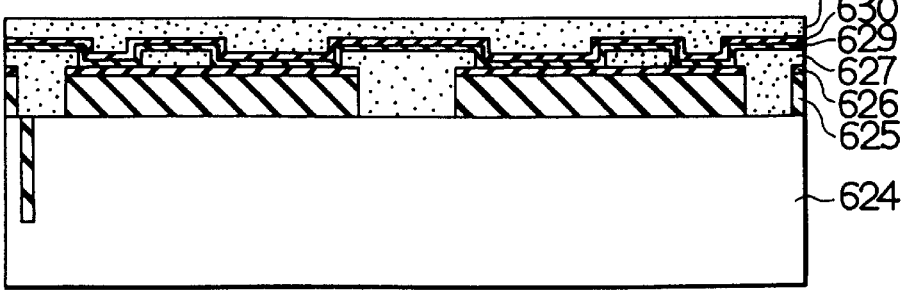

After that, as shown in FIG. 64, a silicon nitride film 629 is deposited to cover the silicon nitride film 626 and the polysilicon thin film 627. Further, as shown in FIG. 65, a silicon oxide film 630 is formed on the silicon nitride film 629 to serve as an insulation isolating film. A polysilicon thin film 631 for bonding is further deposited on the silicon oxide film 630. Then, the surface of the polysilicon thin film 361 is flattened by chemical-mechanical polishing or the like.

Figure 66:
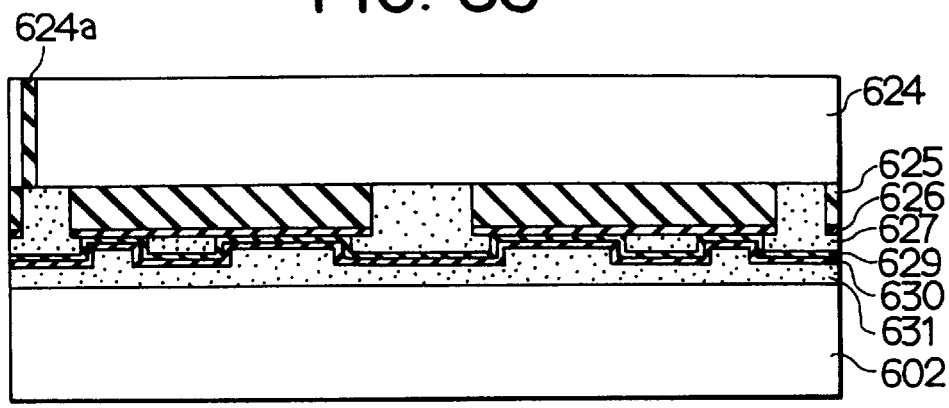

Next, to provide the state shown in FIG. 66, first, the support substrate 602 composed of a single crystal silicon substrate is prepared. Then, a hydrophilicizing treatment is carried out to the surface of the support substrate 602 and to the surface of the polysilicon thin film 631 on the silicon substrate 624, and the two substrates 624, 602 are bonded to one another at the hydrophilicized surfaces thereof. Next, the single crystal silicon substrate 624 is thinned by chemical-mechanical polishing or the like from the side opposite to the support substrate 602. At that time, the silicon oxide film 625 within the groove 624a functions as a stopper for sensing the end of the polishing. Incidentally, it is not necessary to use a high quality single crystal silicon substrate as the support substrate 602.

Figure 67:
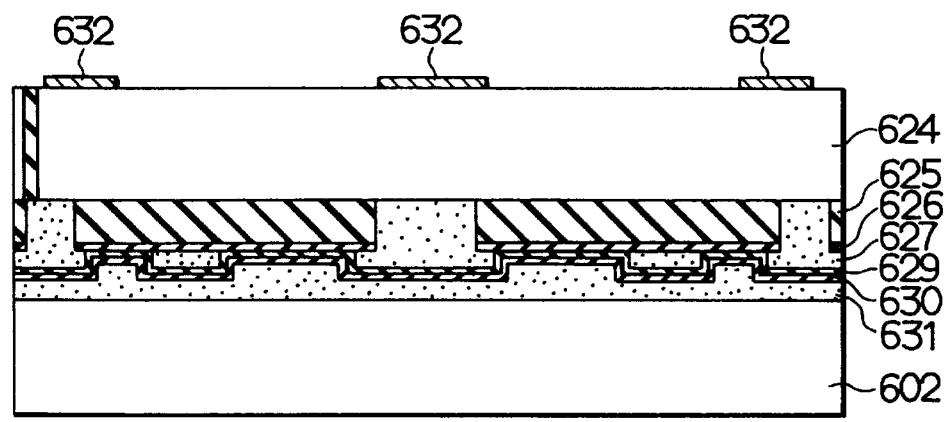
Figure 68:
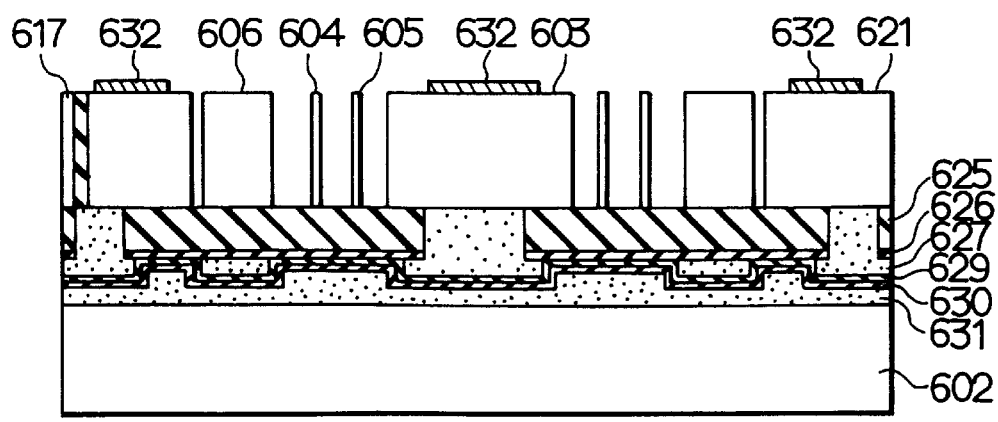

After that, as shown in FIG. 67, an aluminum thin film is deposited on the silicon substrate 624 and is patterned, thereby forming aluminum electrodes 632 for wire bonding. Specifically, the aluminum electrodes 632 are formed to be finally positioned on the anchor part 603, the sensitivity controlling fixed electrodes 607–614, and the detecting fixed electrodes 615–622, respectively. Then, as shown in FIG. 68, etching is carried out to the silicon substrate 624 through photo-lithography, so that the anchor part 603, the beams 604, 605, the movable electrode 606, the sensitivity controlling fixed electrodes 607–614, and the detecting fixed electrodes 615–622 are provided.

After that, the silicon oxide film 625, i.e., the sacrifice layer is removed by an etching solution including hydrogen fluoride. Then, a dry treatment is carried out. At that time, a sublimation agent such as paradichlorobenzene is used to prevent the movable electrode 606 and the beams 604, 605 from being attached to the support substrate surface. As a result, the beams 604, 605 and the movable electrode 606 are released to be movable, thereby completing the basic structure of the acceleration sensor 100c shown in FIG. 61.

In this case, the support anchors 623a, 623b and the support anchors, which are not shown, for the sensitivity controlling fixed electrodes 607–614 are formed from the polysilicon thin film 627 which is resistant to the etching solution including hydrogen fluoride. Therefore, when the sacrifice layer is etched, the etching is stopped at the support anchors, so that no variation in an etching state is produced. When the sacrifice layer is etched, it is not necessary to precisely control the concentration and the temperature of the etching solution, the etching time period, and the like, resulting in simplified manufacturing process.

Thus, after the acceleration sensor 100c is completed, the aluminum electrodes 632 disposed on the anchor part 603, the sensitivity controlling fixed electrodes 607–614, and the detecting fixed electrodes 615–622 are connected to external connecting terminals by wire bonding. Accordingly, potential differences can be set between the movable electrode 606 and the sensitivity controlling fixed electrodes 607–614, and between the movable electrode 606 and the detecting fixed electrodes 615–622.

Next, electrical connection and operation of the acceleration sensor 100c will be explained referring to FIG. 69. The anchor part 603 is connected to a common terminal 633, while the sensitivity controlling fixed electrodes 607–614 are connected to a sensitivity controlling terminal 634. The detecting fixed electrodes 615–622 are connected to a detecting terminal 635. Further, in the sensitivity controlling fixed electrodes 607–614, for example, two sensitivity controlling fixed electrodes 607, 608 adjacent to one another are connected to a check terminal 636. Accordingly, a ground level electrical potential is applied to the anchor part 603 through the common terminal 633, while output voltage $V_O$ of a power supply 637, which is included in the acceleration sensor 100c, is applied to the detecting fixed electrode 615–622 through a detecting circuit 638 and the detecting terminal 635. As a result, a potential difference corresponding to voltage $V_O$ is set between the movable electrode 606 and the detecting fixed electrodes 615–622 through the anchor part 603 and the beams 604, 605.

Figure 69:
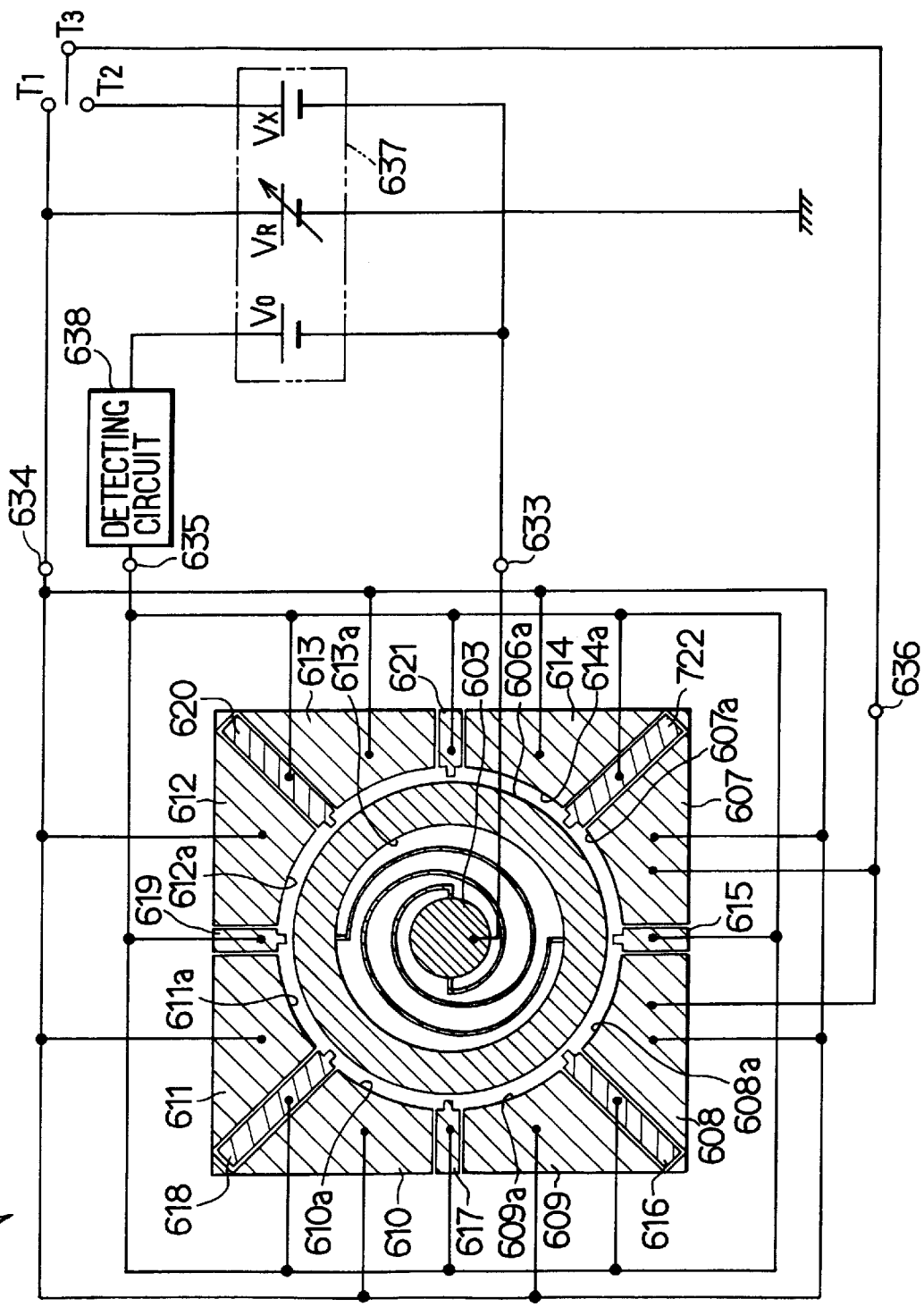
FIG. 69 is a schematic view showing electrical connection of the acceleration sensor in the ninth embodiment.

In the thus electrically connected acceleration sensor 100c, in a detecting operation mode, terminal T1 and T3 shown in FIG. 69 are electrically connected to one another. Accordingly, variable output voltage $V_R$ of the power supply 637 is applied to the sensitivity controlling fixed electrodes 607–614 through the sensitivity controlling fixed terminal 634 so that all the sensitivity controlling fixed electrodes 607–614 are set at an equal electrical potential. That is, a potential difference corresponding to variable output voltage $V_R$ is desirably set between the movable electrode 606 and the sensitivity controlling fixed electrodes 607–614 through the anchor part 603 and the beams 604, 605.

When acceleration including a component parallel to the support substrate surface is applied to the acceleration sensor 100c at the operation mode described above, the movable electrode 606 is displaced in a direction parallel to the support substrate surface. When the detection face 606a of the displaced movable electrode 606 contacts one of the protrusions 615a–622a of the detecting fixed electrodes 615–622 so that current flows therebetween, the detecting circuit 638 detects the current. Accordingly, the acceleration having a magnitude more than a specific level can be securely detected. In this case, a magnitude of electrostatic attracting force produced between the detection face 606a of the movable electrode 606 and the electrode faces 607a–614a of the sensitivity controlling fixed electrodes 607–614 can be adjusted by controlling the magnitude of output voltage $V_R$. Accordingly, the sensitivity of the acceleration sensor 100c can be adjusted with high accuracy.

On the other hand, at a check mode of the operation, terminals T2 and T3 shown in FIG. 69 are electrically connected to one another so that check voltage $V_x$ of the power supply 637 is applied to the sensitivity controlling fixed electrodes 607, 608 through the check terminal 636. Variable output voltage $V_R$ is set at zero. Accordingly, a potential difference corresponding to check voltage $V_x$ is produced between the movable electrode 606 and the sensitivity controlling fixed electrodes 607, 608, so that electrostatic attracting force corresponding to check voltage $V_x$ is produced between the electrode faces 607a, 608a and the detection face 606a. This causes false acceleration which is applied to the movable electrode 606 to displace it toward the sensitivity controlling fixed electrodes 607, 608, i.e., toward the detecting fixed electrode 615.

Therefore, when the detecting operation is performed by the detecting circuit 638 in the state where check voltage $V_x$ is fixed so that the above-described false acceleration has a specific level, it is easily known, at the check mode, whether the detecting operation is normally performed or not when acceleration exceeding the specific level is applied. Further, because the operation check is performed only by switching the electrical connection of terminal T3 from terminal T1 to terminal T2, it is easily performed even after the manufacture of the acceleration sensor is finished and even after the acceleration sensor is assembled into a product. Furthermore, because the power supply 637 is included in the acceleration sensor 100c, this makes sensitivity control and operation check easier. The operation check (for example, self-diagnosis) can be easily performed after the acceleration sensor is shipped as a product as well.

In this embodiment described above, variable output voltage $V_R$ is set zero at the check mode; however, variable output voltage $V_R$, smaller than check voltage $V_x$, can be applied to the sensitivity controlling fixed electrodes 607–614. Accordingly, at the check mode, a potential difference corresponding to output voltage $V_R$ is produced between the movable electrode 606 and the sensitivity controlling fixed electrodes 609–614, while a potential difference determined by variable output voltage $V_R$ and check voltage $V_x$ is produced between the movable electrode 606 and the sensitivity controlling fixed electrodes 607, 608. The potential difference produced between the sensitivity controlling fixed electrodes 607, 608 and the movable electrode 606 is controlled by changing output voltage $V_R$. That is, the magnitude of the false acceleration produced between the sensitivity controlling fixed electrodes 607, 608 and the movable electrode 606 is controlled by changing output voltage $V_R$.

When a switching device for selectively switching the electrical connection of terminal T1 is included in the acceleration sensor 100c, the detecting operation mode and the operation check mode can be more easily switched therebetween. In the ninth embodiment, although the check terminal 636 is electrically connected to two of the sensitivity controlling fixed electrodes 607–614; however, the number of the sensitivity controlling fixed electrodes to which the check terminal 636 is connected is changeable, and may be one.

In the ninth embodiment, the detection face 606a of the movable electrode 606 is composed of a columnar side face of the movable electrode 606, and the protrusions 615a–622a of the fixed electrodes 615–622 are dispersively disposed with a rang-like shape to face the detection face 606a. Especially, in the normal state where no acceleration is applied to the movable electrode 606, the distance between the movable electrode 606 and each of the fixed electrodes 607–622 can be kept approximately constant. Therefore, regardless of the direction in which the acceleration is externally applied, the acceleration can be isotropically detected with constant sensitivity.

Further, the lower electrode 528 is disposed on the support substrate 602 to face the movable electrode 606, and is electrically connected to the movable electrode 606 through the beams 604, 605, the anchor part 603, the support anchors 623a, and the wiring pattern so as to have the same electrical potential as that of the movable electrode 606. Accordingly, no electrostatic attracting force is produced between the movable electrode 606 and the support substrate 602, thereby preventing the movable electrode 606 from being attached to the support substrate 602. As a result, the reliability in operation of the acceleration sensor 100c is improved.

Also, in the ninth embodiment, potential differences between the movable electrode 606 and the sensitivity controlling fixed electrodes 607–614 and between the movable electrode 606 and the detecting fixed electrodes 615–622 are set through electrical connections different from one another. Therefore, although wire bonding is utilized to provide the electrical connections, the polysilicon thin film 627 doped with impurities may be utilized to provide the electrical connections. Specifically, a wiring pattern for respectively connecting the support anchors 623a, 623b, and the support anchors of the sensitivity controlling fixed electrodes 607–614, to external connection terminals may be formed when the polysilicon film 627 is patterned as shown in FIG. 63. In this case, it is not necessary to utilize the wire bonding which necessitates electrode pads having a diameter of approximately 200 μm. As a result, the electrical connections can dispense with the electrode pads for the wire bonding, so that the upper faces of the anchor part 603 is minimized to be less than 100 μm in diameter, resulting in size reduction of the acceleration sensor 100c.

Further, because the movable electrode 606 is formed to be a rang-shape, the inside and outside regions can be effectively utilized and an entire area of the sensor can be reduced. Especially, because the anchor part 603 and the beam portions 604, 605 are disposed at the inside region of the movable electrode 606, it is not necessary to provide extra regions for the members.

In the ninth embodiment, although the fixed electrode is divided into eight sensitivity controlling fixed electrodes 607–614 and eight detecting controlling fixed electrodes 615–622, the dividing number may be changed At that time, it should be noted that the acceleration detecting accuracy depends on the dividing number. The numbers of the detecting fixed electrodes and the protrusions of the detecting fixed electrodes should be determined so that the movable electrode does not contact portions other than the detecting fixed electrodes.

The anchor part may be disposed at the outer region of the movable electrode. In this case, the anchor part supports the movable electrode through beams, and the sensitivity controlling fixed electrodes and the detecting fixed electrodes are disposed at the inner region of the movable electrode. Accordingly, the area for the fixed electrodes is decreased, resulting in decrease in the entire area. The number of the beams is not limited to two, and may be one or three, for example. It is apparent that the present invention can be applied not only to the acceleration sensor but also to other physical quantity sensors such as a vibration sensor.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An acceleration sensor comprising:
   a substrate;
   an anchor part fixedly disposed on the substrate;
   a movable electrode disposed over the substrate and having a cylindrical movable electrode side face;
   a beam connecting the anchor part and the movable electrode and elastically deformed to displace the movable electrode in a direction approximately parallel to a surface of the substrate by acceleration applied in the direction; and
   a fixed electrode fixedly disposed on the substrate and having a cylindrical fixed electrode side face that makes a specific interval with the movable electrode side face when no acceleration is applied to the movable electrode, the fixed electrode including a detecting fixed electrode for detecting the acceleration and a sensitivity controlling fixed electrode electrically insulated from the detecting fixed electrode for controlling sensitivity of the acceleration, wherein the acceleration is detected based on a change in interval between the movable electrode side face and the fixed electrode side face; and wherein first and second potential differences between the movable electrode and the detecting fixed electrode and between the movable electrode and the sensitivity controlling fixed electrode are independently controlled.

2. The acceleration sensor of claim 1, further comprising a detecting circuit for detecting the acceleration based on the change in the interval between the movable electrode side face and the fixed electrode side face.

3. The acceleration sensor of claim 1, wherein the first potential difference between the movable electrode and the detecting fixed electrode is different from the second potential difference between the movable electrode and the sensitivity controlling fixed electrode.

4. The acceleration sensor of claim 1, wherein the movable electrode only contacts the detecting fixed electrode.

5. The acceleration sensor of claim 1, further comprising a lower electrode disposed on the substrate to face the movable electrode with an interval and having an electrical potential the same as that of the movable electrode.

6. The acceleration sensor of claim 1, wherein the detecting fixed electrode has a protrusion protruding from the fixed electrode side face to contact the movable electrode displaced by the acceleration and to prevent the movable electrode from contacting the sensitivity controlling fixed electrode.

7. The acceleration sensor of claim 6, wherein an electrostatic attracting force produced between the sensitivity controlling fixed electrode and the movable electrode is smaller than a spring restoring force of the beam when the movable electrode contacts the protrusion of the detecting fixed electrode.

8. The acceleration sensor of claim 6, wherein an interval between the protrusion and the movable electrode side face when no acceleration is applied to the movable electrode is fixed so that an electrostatic attracting force produced between the sensitivity controlling fixed electrode and the movable electrode is smaller than a spring restoring force of the beam when the movable electrode contacts the protrusion of the detecting fixed electrode.

9. The acceleration sensor of claim 8, wherein the interval between the protrusion and the movable electrode side face is fixed in a range where a value subtracted the electrostatic attracting force from the spring restoring force of the beam monotonically increases as the interval decreases by the displacement of the movable electrode.

10. The acceleration sensor of claim 8, wherein the interval between the protrusion and the movable electrode side face is fixed in a range where a value subtracted the electrostatic attracting force from the spring restoring force of the beam is positive.

11. The acceleration sensor of claim 10, wherein the interval between the protrusion and the movable electrode side face is fixed in a range where a value subtracted the electrostatic attracting force from the spring restoring force of the beam monotonically decreases as the interval decreases by the displacement of the movable electrode.

12. The acceleration sensor of claim 1, further comprising a deformation preventing film disposed on the beam on an opposite side of the substrate to prevent the beam from deforming in a gravitational direction.

13. The acceleration sensor of claim 12, wherein the deformation preventing film is disposed on the movable electrode on the opposite side of the substrate.

14. The acceleration sensor of claim 13, wherein the deformation preventing film generates tensile stress.

15. The acceleration sensor of claim 13, wherein the deformation preventing film is made of shape memory alloy.

16. The acceleration sensor of claim 1, wherein a thickness of the movable electrode is thinner than that of the anchor part.

17. The acceleration sensor of claim 16, wherein surfaces of the movable electrode, the beam, and the anchor part on an opposite side of the substrate are on a plane in a state where no gravitational force is applied to the movable electrode and the beam.

18. The acceleration sensor of claim 1, wherein a length of the movable electrode side face in a direction perpendicular to the surface of the substrate is smaller than that of the fixed electrode side face.

19. The acceleration sensor of claim 1, wherein one of the movable electrode side face and the fixed electrode side face has a protrusion for controlling sensitivity of the acceleration sensor.

20. The acceleration sensor of claim 19, wherein the protrusion is composed of a plurality of protrusions so that the movable electrode side face and the fixed electrode side face contact each other only through the protrusion.

21. The acceleration sensor of claim 1, further comprising a current preventing member disposed between the substrate and a movable part composed of the movable electrode and the beam, for preventing a current from flowing between the substrate and the movable part.

22. The acceleration sensor of claim 21, wherein the current preventing member is an insulation film disposed on at least one of surfaces of the substrate and the movable part facing one another.

23. The acceleration sensor of claim 1, wherein the anchor part, the movable electrode, and the beam are made of a metallic material.

24. The acceleration sensor of claim 1, wherein the substrate has a cavity open under the movable electrode and the beam.

25. The acceleration sensor of claim 1, wherein:
the movable electrode contacts the detecting fixed electrode when a magnitude of the acceleration applied to the movable electrode is larger than a specific magnitude; and
the movable electrode is kept in contact with the detecting fixed electrode after the magnitude of the acceleration is decreased.

26. The acceleration sensor of claim 25, wherein the movable electrode is kept in contact with the detecting fixed electrode when the acceleration disappears.

27. The acceleration sensor of claim 25, wherein an electrostatic attracting force is produced between the sensitivity controlling fixed electrode and the movable electrode to keep the movable electrode in contact with the detecting fixed electrode.

28. The acceleration sensor of claim 27, wherein the second potential difference between the sensitivity controlling fixed electrode and the movable electrode produces the electrostatic attracting force.

29. The acceleration sensor of claim 25, wherein:
the detecting fixed electrode has a protrusion; and
the movable electrode contacts the protrusion when the magnitude of the acceleration is larger than the specific magnitude.

30. The acceleration sensor of claim 1, wherein:
the fixed electrode includes a plurality of detecting fixed electrodes, and a plurality of sensitivity controlling fixed electrodes surrounding the movable electrode and insulated from the plurality of detecting fixed electrodes;

the second potential difference is applied between all of the plurality of sensitivity controlling fixed electrodes and the movable electrode to control the detecting sensitivity of the acceleration; and a third potential difference different from the second potential difference is applied between at least one of the plurality of sensitivity controlling fixed electrodes and the movable electrode to check a detecting operation of the acceleration sensor.

31. The acceleration sensor of claim 30, further comprising a power supply for applying the second and third potential differences.

32. The acceleration sensor of claim 30, wherein the second potential difference is set at zero when the detecting operation is checked.

33. The acceleration sensor of claim 30, wherein:

the third potential difference produces a false acceleration which is applied to the movable electrode to displace the movable electrode; and the false acceleration is detected based on the change in interval between the movable electrode side face and the fixed electrode side face so that the detecting operation of the acceleration sensor is checked.

34. The acceleration sensor of claim 30, wherein:

the plurality of detecting fixed electrodes are disposed to surround the movable electrode at a specific interval on an outer circumference side of the movable electrode;

the plurality of sensitivity controlling fixed electrodes are disposed between adjacent two of the plurality of detecting fixed electrodes, respectively; and the third potential difference is applied between the movable electrode and adjacent two of the plurality of sensitivity controlling fixed electrodes with one of the plurality of detecting fixed electrodes interposed therebetween, and produces a false acceleration which is applied to the movable electrode to displace the movable electrode toward the one of the plurality of detecting fixed electrodes.

35. An acceleration sensor comprising:

a substrate having a substrate surface;

an anchor part fixedly disposed on the substrate surface;

a movable electrode suspending above the substrate;

a beam connecting the anchor part and the movable electrode and is elastically deformed by an acceleration produced in a parallel direction parallel to the substrate surface to displace the movable electrode in the parallel direction;

a fixed electrode fixedly disposed on the substrate surface, for contacting the movable electrode, when the movable electrode is displaced by the acceleration, to detect the acceleration; and contacting state keeping means for keeping the movable electrode in contact with the fixed electrode after the acceleration disappears.

36. The acceleration sensor of claim 35, wherein:

the contacting state keeping means includes a sensitivity controlling electrode fixedly disposed on the substrate surface; and an electrostatic attracting force is produced between the movable electrode and the sensitivity controlling electrode to keep the movable electrode in contact with the fixed electrode.

37. An acceleration sensor comprising:

a substrate;

an anchor part fixedly disposed on the substrate a movable electrode disposed over the substrate and having a cylindrical movable electrode side face;

a beam connecting the anchor part and the movable electrode and elastically deformed to displace the movable electrode in a first direction approximately parallel to a surface of the substrate by acceleration applied in the direction;

a deformation preventing film provided on the beam on an opposite side of the substrate to apply a force to the beam in a second direction opposite to a gravitational direction approximately perpendicular to the first direction; and a fixed electrode fixedly disposed on the substrate and having a cylindrical fixed electrode side face that makes a specific interval with the movable electrode side face when no acceleration is applied to the movable electrode, wherein the acceleration is detected based on a change in interval between the movable electrode side face and the fixed electrode side face; and wherein a length of the beam in the first direction is smaller than a thickness of the beam in the gravitational direction.

38. The acceleration sensor of claim 37, wherein the deformation preventing film generates stress that is applied to the beam in the direction opposite to the gravitational direction.

39. The acceleration sensor of claim 38, wherein the stress is tensile stress.

40. The acceleration sensor of claim 37, wherein the deformation preventing film generates stress for keeping the movable electrode approximately parallel to the surface of the substrate.

41. The acceleration sensor of claim 37, wherein the deformation preventing film is made of shape memory alloy.

42. The acceleration sensor of claim 37, wherein the deformation preventing film is disposed on the movable electrode on the opposite side of the substrate.

43. The acceleration sensor of claim 37, wherein a thickness of the movable electrode is thinner than that of the anchor part.

44. The acceleration sensor of claim 43, wherein surfaces of the movable electrode, the beam, and the anchor part on an opposite side of the substrate are on a plane in a state where no gravitational force is applied to the movable electrode and the beam.

45. The acceleration sensor of claim 37, wherein a length of the movable electrode side face in a direction perpendicular to the surface of the substrate is smaller than that of the fixed electrode side face.

46. An acceleration sensor comprising:

a substrate;

an anchor part fixedly disposed on the substrate;

a movable electrode disposed over the substrate and having a cylindrical movable electrode side face;

a beam connecting the anchor part and the movable electrode and elastically deformed to displace the movable electrode in a direction approximately parallel to a surface of the substrate by acceleration applied in the direction; and a fixed electrode fixedly disposed on the substrate and having a cylindrical fixed electrode side face that makes a specific interval with the movable electrode side face when no acceleration is applied to the movable electrode, wherein the acceleration is detected based on a change in interval between the movable electrode side face and the fixed electrode side face;

wherein a thickness of the movable electrode is thinner than that of the anchor part; and wherein surfaces of the anchor part, the beam, and the movable electrode on an opposite side of the substrate are on a plane in a state where no gravitational force is applied to the movable electrode and the beam.

47. The acceleration sensor of claim 1, wherein;

the detecting fixed electrode has a detecting fixed electrode surface facing the movable electrode, the detecting fixed surface having a first area; and the sensitivity controlling fixed electrode has a sensitivity controlling fixed electrode surface facing the movable electrode, the sensitivity controlling fixed electrode having a second area larger than the first area.

48. The acceleration sensor of claim 12, wherein a thickness of the beam in the gravitational direction is larger than a length of the beam in a direction perpendicular to the gravitational direction.

* * * * *